(12) United States Patent
Mori et al.

(10) Patent No.: US 9,244,349 B2
(45) Date of Patent: *Jan. 26, 2016

(54) POSITIVE RESIST COMPOSITION AND METHOD OF FORMING RESIST PATTERN

(75) Inventors: Takayoshi Mori, Kawasaki (JP); Toshiaki Hato, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 400 days.

This patent is subject to a terminal disclaimer.

(21) Appl. No.: 12/789,152

(22) Filed: May 27, 2010

(65) Prior Publication Data
US 2010/0310985 A1    Dec. 9, 2010

(30) Foreign Application Priority Data
Jun. 1, 2009   (JP) ................ P2009-132311

(51) Int. Cl.
G03F 7/004    (2006.01)
G03F 7/039    (2006.01)
G03F 7/20     (2006.01)

(52) U.S. Cl.
CPC ............ *G03F 7/0397* (2013.01); *G03F 7/0046* (2013.01); *G03F 7/2041* (2013.01)

(58) Field of Classification Search
USPC ............ 430/270.1; 526/245, 252, 253, 318.1, 526/318.2, 318.43, 318.44, 319, 321
See application file for complete search history.

(56) References Cited

U.S. PATENT DOCUMENTS

| | | |
|---|---|---|
| 5,945,517 A | 8/1999 | Nitta et al. |
| 6,153,733 A | 11/2000 | Yukawa et al. |
| 7,074,543 B2 | 7/2006 | Iwai et al. |
| 7,078,562 B2 | 7/2006 | Furukawa et al. |
| 7,989,138 B2 * | 8/2011 | Furuya et al. .............. 430/270.1 |
| 8,192,915 B2 | 6/2012 | Dazai et al. |
| 8,221,956 B2 | 7/2012 | Shiono et al. |
| 2005/0014090 A1 | 1/2005 | Hirayama et al. |
| 2005/0130056 A1 | 6/2005 | Ogata et al. |
| 2005/0208419 A1 | 9/2005 | Inabe et al. |
| 2005/0266351 A1 | 12/2005 | Takemoto et al. |
| 2006/0110677 A1 | 5/2006 | Houlihan et al. |
| 2006/0246373 A1 | 11/2006 | Wang |
| 2006/0269871 A1 | 11/2006 | Harada et al. |
| 2007/0148595 A1 * | 6/2007 | Kanda ......................... 430/270.1 |
| 2007/0172769 A1 | 7/2007 | Kanna et al. |
| 2007/0231738 A1 | 10/2007 | Kaneko et al. |
| 2007/0244235 A1 | 10/2007 | Lemelin |
| 2007/0254235 A1 | 11/2007 | Allen et al. |
| 2008/0008961 A1 | 1/2008 | Nishi et al. |
| 2008/0090171 A1 | 4/2008 | Irie et al. |
| 2008/0118860 A1 | 5/2008 | Harada et al. |
| 2008/0153030 A1 | 6/2008 | Kobayashi et al. |
| 2008/0193879 A1 | 8/2008 | Allen et al. |
| 2008/0305429 A1 * | 12/2008 | Saegusa et al. ............. 430/270.1 |
| 2008/0311507 A1 * | 12/2008 | Isono et al. ................. 430/270.1 |
| 2009/0047602 A1 * | 2/2009 | Furuya et al. .............. 430/285.1 |
| 2009/0061353 A1 | 3/2009 | Isono et al. |
| 2009/0117489 A1 | 5/2009 | Wang et al. |
| 2009/0197204 A1 * | 8/2009 | Shiono et al. .............. 430/286.1 |
| 2009/0226842 A1 | 9/2009 | Shimizu et al. |
| 2010/0062369 A1 | 3/2010 | Dazai et al. |
| 2010/0068661 A1 | 3/2010 | Kanna et al. |
| 2010/0069590 A1 | 3/2010 | Utsumi et al. |
| 2010/0075249 A1 | 3/2010 | Utsumi et al. |
| 2010/0168358 A1 | 7/2010 | Shimamaki et al. |
| 2010/0196820 A1 | 8/2010 | Kawaue et al. |
| 2010/0209848 A1 | 8/2010 | Dazai et al. |
| 2010/0233623 A1 * | 9/2010 | Kurosawa et al. ......... 430/285.1 |
| 2010/0233626 A1 * | 9/2010 | Shimizu et al. ............ 430/285.1 |
| 2011/0104611 A1 | 5/2011 | Sakakibara et al. |
| 2011/0104612 A1 | 5/2011 | Anno et al. |
| 2011/0117497 A1 | 5/2011 | Sato et al. |
| 2011/0212401 A1 | 9/2011 | Nishimura et al. |
| 2012/0064459 A1 | 3/2012 | Maeda et al. |

FOREIGN PATENT DOCUMENTS

| | | |
|---|---|---|
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2003-241385 | 8/2003 |
| JP | 2006-016379 | 1/2006 |
| JP | A-2006-309245 | 11/2006 |
| JP | A-2006-328259 | 12/2006 |
| JP | A-2007-093910 | 4/2007 |
| JP | A-2007-119696 | 5/2007 |
| JP | A-2007-219471 | 8/2007 |
| JP | A-2008-033287 | 2/2008 |
| JP | A-2008-058538 | 3/2008 |
| JP | A-2008-083158 | 4/2008 |
| JP | A-2008-083159 | 4/2008 |
| JP | A-2008-096816 | 4/2008 |
| JP | A-2008-115203 | 5/2008 |
| JP | A-2008-116496 | 5/2008 |
| JP | A-2008-134607 | 6/2008 |
| JP | A-2008-521039 | 6/2008 |
| JP | A-2008-158339 | 7/2008 |
| JP | A-2009-019199 | 1/2009 |
| JP | A-2009-041039 | 2/2009 |
| JP | A-2009-074085 | 4/2009 |
| JP | A-2009-199058 | 9/2009 |
| JP | A-2010-018777 | 1/2010 |
| JP | A-2010-134417 | 6/2010 |
| JP | A-2010-204187 | 9/2010 |
| KR | 10-2006-0044338 A | 5/2006 |
| KR | 10-2007-0099465 A | 10/2007 |
| TW | 2006-06580 A | 2/2006 |
| WO | WO 2004-074242 | 9/2004 |
| WO | WO 2006/054173 A1 | 5/2006 |
| WO | WO 2008/053697 | 5/2008 |
| WO | WO 2009/142183 A1 | 11/2009 |
| WO | WO 2010/001913 A1 | 1/2010 |
| WO | WO 2010/007993 A1 | 1/2010 |
| WO | WO 2010/029982 A1 | 3/2010 |
| WO | WO 2010/123101 A1 | 10/2010 |
| WO | WO 2010/137472 A1 | 12/2010 |

OTHER PUBLICATIONS

Irie et al., "Surface Property Control for 193nm Immersion Resist;" Journal of Photopolymer Science and Technology, vol. 19, No. 4, pp. 565-568 (2006).
Office Action issued in U.S. Appl. No. 12/721,291 on Jan. 6, 2012.
Office Action mailed on Dec. 19, 2013 in Taiwanese Patent Application No. 098120470.
Office Action mailed on Dec. 19, 2013 in Taiwanese Patent Application No. 101120110.
Office Action issued in U.S. Appl. No. 13/336,131 on Oct. 16, 2012.
Office Action issued in U.S. Appl. No. 12/457,705 on Apr. 5, 2011.
Office Action issued in U.S. Appl. No. 12/457,705 on Sep. 27, 2011.
Office Action issued in Japanese Patent Application No. 2008-163861 on Jun. 26, 2012.
Kodama et al., "Synthesis of Novel Fluoropolymer for 157 nm Photoresists by Cyclo-polymerization", Proceedings of SPIE, vol. 4690, pp. 76-83 (2002).
D. Gil et al., "First Microprocessors with Immersion Lithograhy," Optical Microlithography XVIII, Proceedings of SPIE vol. 5754, pp. 119-128 (2005).
Office Action issued on Mar. 12, 2013 in Japanese Patent Application No. 2009-055745.
Notice of Allowance issued on Jul. 23, 2013 in Japanese Patent Application No. 2009-057167.
Office Action issued on Sep. 10, 2013 in Japanese Patent Application No. 2009-132311.
Office Action issued in U.S. Appl. No. 12/717,785 on Mar. 15, 2012.
Office Action mailed on Apr. 17, 2014 in Taiwanese Patent Application No. 099106927.
Office Action in Korean Patent Application No. 10-2009-0054972, mailed Sep. 2, 2014.
Notice of Allowance in Korean Patent Application No. 10-2009-0054972 dated Jan. 1, 2015.
Decision for Grant in Korean Patent Application No. 10-2010-0019741, mailed Jun. 4, 2015.

* cited by examiner

*Primary Examiner* — Cynthia H Kelly
*Assistant Examiner* — Alyssa L Cepluch
(74) *Attorney, Agent, or Firm* — Knobbe Martens Olson & Bear LLP

(57) ABSTRACT

A positive resist composition including a base component, an acid-generator component and a fluorine-containing polymer component (F) in a specific amount, the fluorine-containing polymer component (F) including a fluorine-containing polymer (F1) consisting of a structural unit (F-1) represented by general formula (F-1) ($R^C$ represents a hydrogen atom or a methyl group, $R^1$ and $R^2$ represent a hydrogen atom, an alkyl group or a fluorinated alkyl group, $R^3$ represents a fluorine atom or a fluorinated alkyl group, and $R^4$ represents an alkyl group or a fluorinated alkyl group) or a fluorine-containing copolymer (F2) containing the structural unit (F-1) and at least one structural unit selected from the group consisting of a structural unit (F-2) derived from an acrylate ester containing an acid dissociable, dissolution inhibiting group and a structural unit (F-3) represented by general formula (F-3) ($R^C$ represents a hydrogen atom or a methyl group, Z represents a single bond or a divalent linking group, and r represents an integer of 0 to 2).

[Chemical Formula 1]

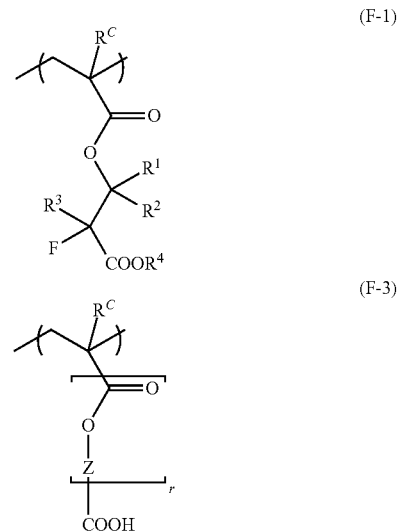

8 Claims, 1 Drawing Sheet

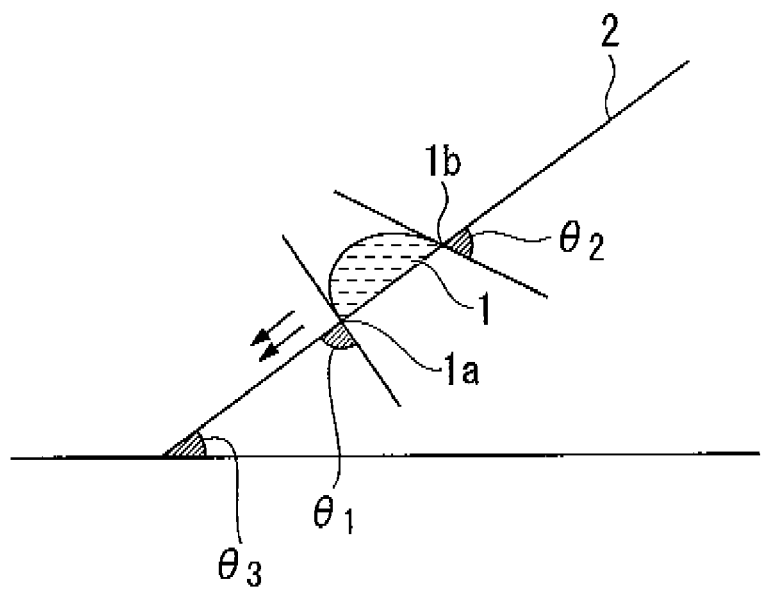

POSITIVE RESIST COMPOSITION AND METHOD OF FORMING RESIST PATTERN

TECHNICAL FIELD

The present invention relates to a positive resist composition and a method of forming a resist pattern.

Priority is claimed on Japanese Patent Application No. 2009-132311, filed Jun. 1, 2009, the content of which is incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have led to rapid progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter (energy higher) than these excimer lasers, such as electron beam, extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources.

As a resist material that satisfies these conditions, a chemically amplified composition is used, which includes a base material component that exhibits a changed solubility in an alkali developing solution under the action of acid and an acid-generator component that generates acid upon exposure.

For example, a chemically amplified positive resist contains, as a base component (base resin), a resin which exhibits increased solubility in an alkali developing solution under action of acid, and an acid generator is typically used. If the resist film formed using the resist composition is selectively exposed during formation of a resist pattern, then within the exposed portions, acid is generated from the acid-generator component, and the action of this acid causes an increase in the solubility of the resin component in an alkali developing solution, making the exposed portions soluble in the alkali developing solution.

Currently, resins that contain structural units derived from (meth)acrylate esters within the main chain (acrylic resins) are now widely used as base resins for resists that use ArF excimer laser lithography, as they exhibit excellent transparency in the vicinity of 193 nm (for example, see Patent Document 1).

As a technique for further improving the resolution, a lithography method called liquid immersion lithography (hereafter, frequently referred to as "immersion exposure") is known in which exposure (immersion exposure) is conducted in a state where the region between the lens and the resist layer formed on a wafer is filled with a solvent (a immersion medium) that has a larger refractive index than the refractive index of air (see for example, Non-Patent Document 1).

According to this type of immersion exposure, it is considered that higher resolutions equivalent to those obtained using a shorter wavelength light source or a larger NA lens can be obtained using the same exposure light source wavelength, with no lowering of the depth of focus. Furthermore, immersion exposure can be conducted using a conventional exposure apparatus. As a result, it is expected that immersion exposure will enable the formation of resist patterns of higher resolution and superior depth of focus at lower costs. Accordingly, in the production of semiconductor devices, which requires enormous capital investment, immersion exposure is attracting considerable attention as a method that offers significant potential to the semiconductor industry, both in terms of cost and in terms of lithography properties such as resolution.

Immersion lithography is effective in forming patterns having various shapes. Further, immersion exposure is expected to be capable of being used in combination with currently studied super-resolution techniques, such as the phase shift method and modified illumination method. Currently, as the immersion exposure technique, a technique using an ArF excimer laser as an exposure source is being actively studied. Further, water is mainly used as the immersion medium.

In recent years, fluorine-containing compounds have been attracting attention for their properties such as water repellency and transparency, and active research and development of fluorine-containing compounds have been conducted in various fields. For example, in the fields of resist materials, currently, an acid-labile group such as a methoxymethyl group, tert-butyl group or tert-butoxycarbonyl group is being introduced into a fluorine-containing polymeric compound, and the fluorine-containing polymeric compound is used as a base resin for a chemically amplified positive resist. However, when such a fluorine-containing polymeric compound is used as a base resin for a positive resist, disadvantages are caused in that a large amount of an out gas is generated, and resistance to a dry-etching gas (etching resistance) is unsatisfactory.

Recently, as a fluorine-containing polymeric compound exhibiting excellent etching resistance, a fluorine-containing polymeric compound having an acid-labile group containing a cyclic hydrocarbon group has been reported (see, for example, Non-Patent Document 2).

DOCUMENTS OF RELATED ART

Patent Document

[Patent Document 1] Japanese Unexamined Patent Application, First Publication No. 2003-241385
[Patent Document 2] Japanese Unexamined Patent Application, First Publication No. 2006-016379

Non-Patent Documents

[Non-Patent Document 1] Proceedings of SPIE (U.S.), vol. 5754, pp. 119-128 (2005)
[Non-Patent Document 2] Proceedings of SPIE (U.S.), vol. 4690, pp. 76-83 (2002)

SUMMARY OF THE INVENTION

In the aforementioned immersion exposure, a resist material is required which exhibits not only general lithography properties (e.g., sensitivity, resolution, etching resistance and the like), but also properties suited for immersion lithography. For example, in immersion exposure, when the resist film comes in contact with the immersion medium, elution of a substance contained in the resist film into the immersion medium occurs. This elution of a substance causes phenomena such as degeneration of the resist film and change in the refractive index of the immersion medium, thereby adversely affecting the lithography properties. The amount of the eluted substance is affected by the properties of the resist film surface (e.g., hydrophilicity, hydrophobicity, and the like). For example, by enhancing the hydrophobicity of the resist film surface, the elution of a substance can be reduced. Further, when the immersion medium is water, and immersion exposure is performed using a scanning-type immersion exposure apparatus as disclosed in Non-Patent Document 1, a water tracking ability in which the immersion medium is capable of tracking the movement of the lens is required. When the water tracking ability is low, the exposure speed becomes low, and as a result, there is a possibility that the productivity is adversely affected. It is presumed that the water tracking ability can be improved by enhancing the hydrophobicity of the resist film (rendering the resist film hydrophobic).

Accordingly, it is presumed that the above-described characteristic problems of immersion lithography, which require a reduction in substance elution and an improvement in the water tracking ability, can be addressed by enhancing the hydrophobicity of the resist film surface.

However, if the resist film is simply rendered hydrophobic, then adverse effects are seen on the lithography properties. For example, as the hydrophobicity of the resist film is increased, defects tend to be generated more readily on the surface of the formed resist pattern following alkali developing. Especially, in the case of a positive resist composition, defects are likely to be generated at unexposed portions.

The term "defects" refers to general abnormalities within a resist film that are detected when observed from directly above the developed resist film using, for example, a surface defect detection apparatus (product name: "KLA") manufactured by KLA-TENCOR Corporation. Examples of these abnormalities include post-developing scum, foam, dust, bridges (structures that bridge different portions of the resist pattern), color irregularities, and foreign deposits.

It is presumed that the aforementioned problem can be solved by a material which is hydrophobic during immersion exposure, and becomes hydrophilic during developing. However, such a material is essentially unknown in the art.

The present invention takes the above circumstances into consideration, with an object of providing a positive resist composition and a method of forming a resist pattern in which generation of defects is suppressed.

For solving the above-mentioned problems, the present invention employs the following aspects.

Specifically, a first aspect of the present invention is a positive resist composition including a base component (A) which exhibits increased solubility in an alkali developing solution under the action of acid, an acid-generator component (B) which generates acid upon exposure and a fluorine-containing polymer component (F), the fluorine-containing polymer component (F) including a fluorine-containing polymer (F1) consisting of a structural unit (F-1) represented by general formula (F-1) shown below or a fluorine-containing copolymer (F2) containing the structural unit (F-1) and at least one structural unit selected from the group consisting of a structural unit (F-2) derived from an acrylate ester containing an acid dissociable, dissolution inhibiting group and a structural unit (F-3) represented by general formula (F-3) shown below, the amount of the fluorine-containing polymer component (F) relative to 100 parts by weight of the base component (A) being in the range of 0.1 to 20 parts by weight.

[Chemical Formula 1.]

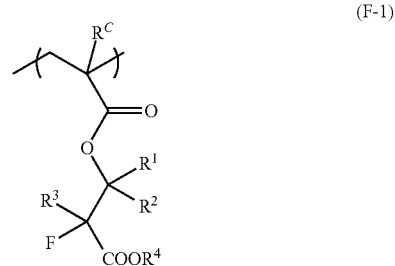

(F-1)

In the formula, $R^C$ represents a hydrogen atom or a methyl group; each of $R^1$ and $R^2$ independently represents a hydrogen atom, an alkyl group of 1 to 4 carbon atoms or a fluorinated alkyl group of 1 to 4 carbon atoms; $R^3$ represents a fluorine atom or a fluorinated alkyl group of 1 to 4 carbon atoms; and $R^4$ represents a linear or branched alkyl group of 1 to 4 carbon atoms or a linear fluorinated alkyl group of 1 to 4 carbon atoms.

[Chemical Formula 2.]

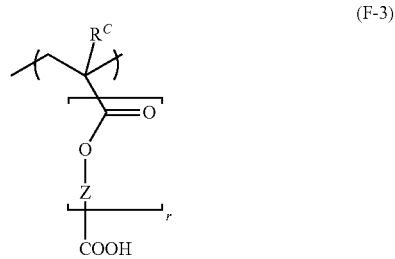

(F-3)

In the formula, $R^C$ represents a hydrogen atom or a methyl group; Z represents a single bond or a divalent linking group which may have a substituent; and r represents an integer of 0 to 2.

A second aspect of the present invention is a method of forming a resist pattern, including applying a positive resist composition according to the first aspect to a substrate to form a resist film, subjecting the resist film to exposure, and subjecting the resist film to alkali developing to form a resist pattern.

In the present description and claims, an "alkyl group" includes a linear, branched or cyclic, monovalent saturated hydrocarbon, unless otherwise specified.

The term "alkylene group" includes a linear, branched or cyclic divalent saturated hydrocarbon, unless otherwise specified.

A "lower alkyl group" is an alkyl group of 1 to 5 carbon atoms.

A "halogenated alkyl group" is a group in which part or all of the hydrogen atoms of an alkyl group are substituted with a halogen atom. Examples of the halogen atom include a fluorine atom, a chlorine atom, a bromine atom and an iodine atom.

The term "aliphatic" is a relative concept used in relation to the term "aromatic", and defines a group or compound that has no aromaticity.

The term "structural unit" refers to a monomer unit that contributes to the formation of a polymeric compound (polymer, copolymer).

The term "exposure" is used as a general concept that includes irradiation with any form of radiation.

The term "(meth)acrylic acid" is a generic term that includes either or both of acrylic acid having a hydrogen atom bonded to the α-position and methacrylic acid having a methyl group bonded to the α-position.

The term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

By virtue of the positive resist composition and method of forming a resist pattern according to the present invention, generation of defects can be suppressed.

BRIEF DESCRIPTION OF THE DRAWINGS

FIG. 1 is an explanatory diagram of an advancing angle ($\theta_1$) a receding angle ($\theta_2$) and a sliding angle ($\theta_3$).

MODE FOR CARRYING OUT THE INVENTION

<<Positive Resist Composition>>

The positive resist composition according to the first aspect of the present invention includes a base component (A) which exhibits increased solubility in an alkali developing solution under action of acid (hereafter, referred to as "component (A)"), an acid-generator component (B) which generates acid upon exposure (hereafter, referred to as "component (B)") and a fluorine-containing polymer component (F).

In the positive resist composition, when radial rays are irradiated (when exposure is conducted), acid is generated from the component (B), and the solubility of the component (A) in an alkali developing solution is increased by the action of the generated acid. Therefore, in the formation of a resist pattern, by conducting selective exposure of a resist film formed by using the positive resist composition of the present invention, the solubility of the exposed portions in an alkali developing solution is increased, whereas the solubility of the unexposed portions in an alkali developing solution is unchanged, and hence, a resist pattern can be formed by alkali developing.

It is preferable that the positive resist composition of the present invention further include a nitrogen-containing organic compound (D) (hereafter referred to as the component (D)).

<Component (A)>

In the present invention, the term "base component" refers to an organic compound capable of forming a film.

As the base component, an organic compound having a molecular weight of 500 or more can be preferably used. When the organic compound has a molecular weight of 500 or more, the film-forming ability is improved, and a resist pattern of nano level can be easily formed.

The "organic compound having a molecular weight of 500 or more" which can be used as a base component is broadly classified into non-polymers and polymers.

In general, as a non-polymer, any of those which have a molecular weight in the range of 500 to less than 4,000 is used. Hereafter, a non-polymer having a molecular weight in the range of 500 to less than 4,000 is referred to as a low-molecular-weight compound.

As a polymer, any of those which have a molecular weight of 1,000 or more is generally used. Hereafter, a polymer having a molecular weight of 1,000 or more is referred to as a polymeric compound. With respect to a polymeric compound, the "molecular weight" is the weight-average-molecular-weight in terms of the polystyrene equivalent value determined by gel permeation chromatography (GPC). Hereafter, a polymeric compound is frequently referred to simply as a "resin".

In the present invention, the component (A) may be a resin component that exhibits increased solubility in an alkali developing solution under the action of acid, a low-molecular-weight material that exhibits increased solubility in an alkali developing solution under the action of acid, or a mixture thereof.

Among these, the component (A) preferably contains a polymeric compound (A1) which has a structural unit (a1) derived from an acrylate ester containing an acrylate ester (provided that the fluorine-containing polymer component (F) is excluded from the polymeric compound (A1)).

[Component (A1)]

The component (A1) is a polymeric compound which has a structural unit (a1) derived from an acrylate ester containing an acrylate ester.

In the present invention, it is preferable that the component (A1) include a structural unit (a2) derived from an acrylate ester containing a lactone-containing cyclic group, as well as the structural unit (a1).

Further, in the present invention, it is preferable that the component (A1) include a structural unit (a3) derived from an acrylate ester containing a polar group-containing aliphatic hydrocarbon group, as well as the structural unit (a1), or the structural unit (a1) and the structural unit (a2).

Further, in the present invention, the component (A1) may also include a structural unit other than the aforementioned structural units (a1) to (a3).

In the present descriptions and the claims, the expression "structural unit derived from an acrylate ester" refers to a structural unit that is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. Examples of the substituent include an alkyl group of 1 to 5 carbon atoms and a halogenated alkyl group of 1 to 5 carbon atoms.

With respect to the "structural unit derived from an acrylate ester", the "α-position (the carbon atom on the α-position)" refers to the carbon atom having the carbonyl group bonded thereto, unless specified otherwise.

With respect to the acrylate ester, specific examples of the alkyl group of 1 to 5 carbon atoms for the substituent at the α-position include linear or branched alkyl groups such as a methyl group, an ethyl group, a propyl group, an isopropyl group, an n-butyl group, an isobutyl group, a tert-butyl group, a pentyl group, an isopentyl group, and a neopentyl group.

Specific examples of the halogenated alkyl group of 1 to 5 carbon atoms include groups in which part or all of the hydrogen atoms of the aforementioned "alkyl group of 1 to 5 carbon atoms for the substituent at the α-position" are substituted with halogen atoms. Examples of the halogen atom include a fluorine atom, a chlorine atom, a bromine atom and an iodine atom, and a fluorine atom is particularly desirable.

In the present invention, it is preferable that a hydrogen atom, an alkyl group of 1 to 5 carbon atoms or a halogenated alkyl group of 1 to 5 carbon atoms be bonded to the α-position of the acrylate ester, a hydrogen atom, an alkyl group of 1 to 5 carbon atoms or a fluorinated alkyl group of 1 to 5 carbon atoms is more preferable, and in terms of industrial availability, a hydrogen atom or a methyl group is the most desirable.

(Structural Unit (a1))

The structural unit (a1) is a structural unit derived from an acrylate ester containing an acid dissociable, dissolution inhibiting group. However, structural units which fall under the category of the structural unit (a0) described later are excluded from the structural unit (a1).

As the acid dissociable, dissolution inhibiting group in the structural unit (a1), any of the groups that have been proposed as acid dissociable, dissolution inhibiting groups for the base resins of chemically amplified resists can be used, provided the group has an alkali dissolution-inhibiting effect that renders the entire component (A1) insoluble in an alkali developing solution prior to dissociation, and then following dissociation by action of acid, increases the solubility of the entire component (A1) in the alkali developing solution. Generally, groups that form either a cyclic or chain-like tertiary alkyl ester with the carboxyl group of the (meth)acrylic acid, and acetal-type acid dissociable, dissolution inhibiting groups such as alkoxyalkyl groups are widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(=O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

In the present description and claims, the term "aliphatic branched" refers to a branched structure having no aromaticity.

The "aliphatic branched, acid dissociable, dissolution inhibiting group" is not limited to be constituted of only carbon atoms and hydrogen atoms (not limited to hydrocarbon groups), but is preferably a hydrocarbon group.

Further, the "hydrocarbon group" may be either saturated or unsaturated, but is preferably saturated.

Examples of aliphatic branched, acid dissociable, dissolution inhibiting groups include tertiary alkyl groups of 4 to 8 carbon atoms, and specific examples include a tert-butyl group, tert-pentyl group and tert-heptyl group.

The term "aliphatic cyclic group" refers to a monocyclic group or polycyclic group that has no aromaticity.

The "aliphatic cyclic group" within the structural unit (a1) may or may not have a substituent. Examples of substituents include lower alkyl groups of 1 to 5 carbon atoms, lower alkoxy groups of 1 to 5 carbon atoms, fluorine atom, fluorinated lower alkyl groups of 1 to 5 carbon atoms, and oxygen atom (=O).

The basic ring of the "aliphatic cyclic group" exclusive of substituents is not limited to be constituted from only carbon and hydrogen (not limited to hydrocarbon groups), but is preferably a hydrocarbon group.

Further, the "hydrocarbon group" may be either saturated or unsaturated, but is preferably saturated. Furthermore, the "aliphatic cyclic group" is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

As the aliphatic cyclic group-containing acid dissociable, dissolution inhibiting group, for example, a group which has a tertiary carbon atom on the ring structure of the cycloalkyl group can be used. Specific examples include 2-methyl-2-adamantyl group and a 2-ethyl-2-adamantyl group. Further, groups having an aliphatic cyclic group such as an adamantyl group, cyclohexyl group, cyclopentyl group, norbornyl group, tricyclodecyl group or tetracyclododecyl group, and a branched alkylene group having a tertiary carbon atom bonded thereto, as the groups bonded to the oxygen atom of the carbonyl group (—C(O)—O—) within the structural units represented by general formulas (a1"-1) to (a1"-6) shown below, can be used.

[Chemical Formula 3.]

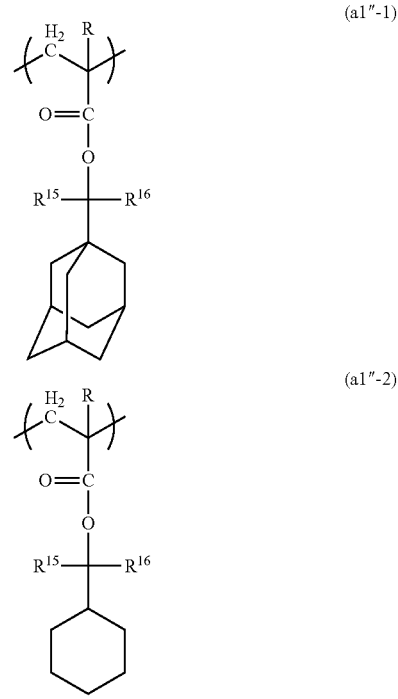

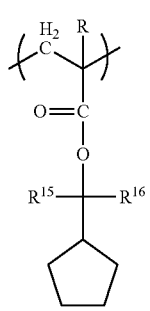
(a1"-3)

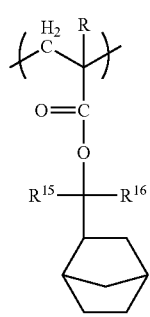
(a1"-4)

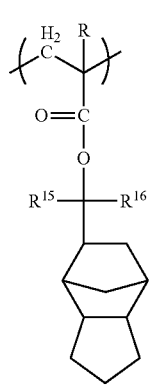
(a1"-5)

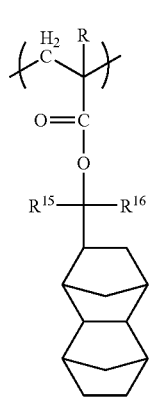
(a1"-6)

In the formulas, R represents a hydrogen atom, a lower alkyl group or a halogenated lower alkyl group; and $R^{15}$ and $R^{16}$ each independently represents an alkyl group (which may be linear or branched, and preferably has 1 to 5 carbon atoms).

In general formulas (a1"-1) to (a1"-6) above, the lower alkyl group or halogenated lower alkyl group for R are the same as the lower alkyl group or halogenated lower alkyl group which can be bonded to the α-position of the aforementioned acrylate ester.

An "acetal-type acid dissociable, dissolution inhibiting group" generally substitutes a hydrogen atom at the terminal of an alkali-soluble group such as a carboxy group or hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 4.]

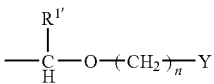
(p1)

In the formula, $R^{1\prime}$ and $R^{2\prime}$ each independently represents a hydrogen atom or a lower alkyl group; n represents an integer of 0 to 3; and Y represents a lower alkyl group or an aliphatic cyclic group.

In general formula (p1) above, n is preferably an integer of 0 to 2, more preferably 0 or 1, and most preferably 0.

As the lower alkyl group for $R^{1\prime}$ and $R^{2\prime}$, the same lower alkyl groups as those described above for R can be used, although a methyl group or ethyl group is preferable, and a methyl group is particularly desirable.

In the present invention, it is preferable that at least one of $R^{1\prime}$ and $R^{2\prime}$ be a hydrogen atom. That is, it is preferable that the acid dissociable, dissolution inhibiting group (p1) be a group represented by general formula (p1-1) shown below.

[Chemical Formula 5.]

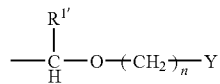
(p1-1)

In the formula, $R^{1\prime}$, n and Y are the same as defined above.

As the lower alkyl group for Y, the same as the lower alkyl groups for R above can be used.

As the aliphatic cyclic group for Y, any of the aliphatic monocyclic/polycyclic groups which have been proposed for conventional ArF resists and the like can be appropriately selected for use. For example, the same groups described above in connection with the "aliphatic cyclic group" can be used.

Further, as the acetal-type, acid dissociable, dissolution inhibiting group, groups represented by general formula (p2) shown below can also be used.

[Chemical Formula 6.]

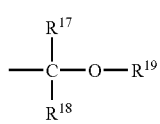
(p2)

In the formula, $R^{17}$ and $R^{18}$ each independently represents a linear or branched alkyl group or a hydrogen atom; and $R^{19}$ represents a linear, branched or cyclic alkyl group; or $R^{17}$ and $R^{19}$ each independently represents a linear or branched alkylene group, and the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable. It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Examples of such groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include tetrahydropyranyl group and tetrahydrofuranyl group.

As the structural unit (a1), it is preferable to use at least one member selected from the group consisting of structural units represented by formula (a1-0-1) shown below and structural units represented by formula (a1-0-2) shown below.

[Chemical Formula 7.]

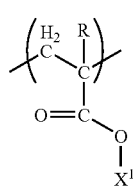

(a1-0-1)

In the formula, R represents a hydrogen atom, a lower alkyl group or a halogenated lower alkyl group; and $X^1$ represents an acid dissociable, dissolution inhibiting group.

[Chemical Formula 8.]

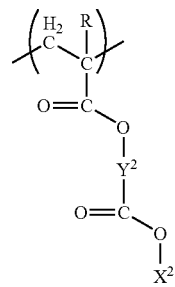

(a1-0-2)

In the formula, R represents a hydrogen atom, a lower alkyl group or a halogenated lower alkyl group; $X^2$ represents an acid dissociable, dissolution inhibiting group; and $Y^2$ represents a divalent linking group.

In general formula (a1-0-1) shown above, lower alkyl group and halogenated lower alkyl group for R are the same as the lower alkyl group and halogenated lower alkyl group which can be bonded to the α-position of the aforementioned acrylate ester.

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In general formula (a1-0-2), R is the same as defined above.
$X^2$ is the same as defined for $X^1$ in general formula (a1-0-1).

As the divalent linking group for $Y^2$, an alkylene group, a divalent aliphatic cyclic group or a divalent linking group containing a hetero atom can be mentioned.

As the aliphatic cyclic group, the same as those used above in connection with the explanation of "aliphatic cyclic group" can be used, except that two hydrogen atoms have been removed therefrom.

When $Y^2$ represents an alkylene group, it preferably has 1 to 10 carbon atoms, more preferably 1 to 6, still more preferably 1 to 4, and most preferably 1 to 3.

When $Y^2$ represents a divalent aliphatic cyclic group, it is particularly desirable that the divalent aliphatic cyclic group be a group in which two or more hydrogen atoms have been removed from cyclopentane, cyclohexane, norbornane, isobornane, adamantane, tricyclodecane or tetracyclododecane.

When $Y^2$ represents a divalent linking group containing a hetero atom, examples thereof include —O—, —C(=O)—O—, —C(=O)—, —O—C(=O)—O—, —C(=O)—NH—, —NH— (H may be substituted with a substituent such as an alkyl group or an acyl group), —S—, —S(=O)$_2$—, —S(=O)$_2$—O—, and "-A-O-B- (wherein O is an oxygen atom, and each of A and B independently represents a divalent hydrocarbon group which may have a substituent)".

When $Y^2$ represents a divalent linking group —NH— and the H in the formula is replaced with a substituent such as an alkyl group or an acyl group, the substituent preferably has 1 to 10 carbon atoms, more preferably 1 to 8 carbon atoms, and most preferably 1 to 5 carbon atoms.

When $Y^2$ is "A-O-B", each of A and B independently represents a divalent hydrocarbon group which may have a substituent.

A hydrocarbon "has a substituent" means that part or all of the hydrogen atoms within the hydrocarbon group are substituted with groups or atoms other than hydrogen atom.

The hydrocarbon group for A may be either an aliphatic hydrocarbon group, or an aromatic hydrocarbon group. An "aliphatic hydrocarbon group" refers to a hydrocarbon group that has no aromaticity.

The aliphatic hydrocarbon group for A may be either saturated or unsaturated. In general, the aliphatic hydrocarbon group is preferably saturated.

As specific examples of the aliphatic hydrocarbon group for A, a linear or branched aliphatic hydrocarbon group, and an aliphatic hydrocarbon group having a ring in the structure thereof can be given.

The linear or branched aliphatic hydrocarbon group preferably has 1 to 10 carbon atoms, more preferably 1 to 8, still more preferably 2 to 5, and most preferably 2.

As a linear aliphatic hydrocarbon group, a linear alkylene group is preferable, and specific examples include a methylene group, an ethylene group $[-(CH_2)_2-]$, a trimethylene group $[-(CH_2)_3-]$, a tetramethylene group $[-(CH_2)_4-]$ and a pentamethylene group $[-(CH_2)_5-]$.

As the branched aliphatic hydrocarbon group, a branched alkylene group is preferable, and specific examples include alkylalkylene groups, e.g., alkylmethylene groups such as $-CH(CH_3)-$, $-CH(CH_2CH_3)-$, $-C(CH_3)_2-$, $-C(CH_3)(CH_2CH_3)-$, $-C(CH_3)(CH_2CH_2CH_3)-$ and $-C(CH_2CH_3)_2-$; alkylethylene groups such as $-CH(CH_3)CH_2-$, $-CH(CH_3)CH(CH_3)-$, $-C(CH_3)_2CH_2-$, $-CH(CH_2CH_3)CH_2-$; alkyltrimethylene groups such as $-CH(CH_3)CH_2CH_2-$ and $-CH_2CH(CH_3)CH_2-$; and alkyltetramethylene groups such as $-CH(CH_3)CH_2CH_2CH_2-$ and $-CH_2CH(CH_3)CH_2CH_2-$. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of the substituent include a fluorine atom, a fluorinated lower alkyl group of 1 to 5 carbon atoms, and an oxygen atom (=O).

As examples of the hydrocarbon group containing a ring, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane. As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of the substituent include a lower alkyl group of 1 to 5 carbon atoms, a fluorine atom, a fluorinated lower alkyl group of 1 to 5 carbon atoms, and an oxygen atom (=O).

As A, a linear aliphatic hydrocarbon group is preferable, more preferably a linear alkylene group, still more preferably a linear alkylene group of 2 to 5 carbon atoms, and most preferably an ethylene group.

Examples of the hydrocarbon group for A include a divalent aromatic hydrocarbon group in which one hydrogen atom has been removed from a benzene ring of a monovalent aromatic hydrocarbon group such as a phenyl group, a biphenyl group, a fluorenyl group, a naphthyl group, an anthryl group or a phenanthryl group; an aromatic hydrocarbon group in which part of the carbon atoms constituting the ring of the aforementioned divalent aromatic hydrocarbon group has been substituted with a hetero atom such as an oxygen atom, a sulfur atom or a nitrogen atom; and an aromatic hydrocarbon group in which one hydrogen atom has been removed from a benzene ring of an arylalkyl group such as a benzyl group, a phenethyl group, a 1-naphthylmethyl group, a 2-naphthylmethyl group, a 1-naphthylethyl group or a 2-naphthylethyl group.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

As the hydrocarbon group for B, the same divalent hydrocarbon groups as those described above for A can be used.

As B, a linear or branched aliphatic hydrocarbon group is preferable, and a methylene group or an alkylmethylene group is particularly desirable.

The alkyl group within the alkyl methylene group is preferably a linear alkyl group of 1 to 5 carbon atoms, more preferably a linear alkyl group of 1 to 3 carbon atoms, and most preferably a methyl group.

Specific examples of the structural unit (a1) include structural units represented by general formulas (a1-1) to (a1-4) shown below.

[Chemical Formula 9.]

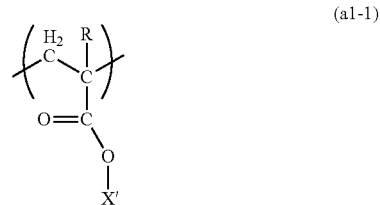
(a1-1)

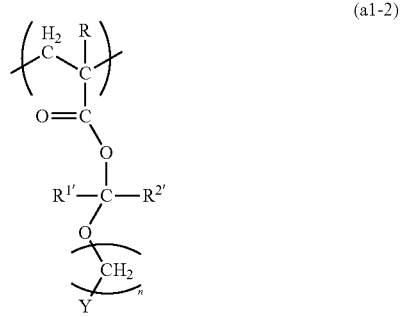
(a1-2)

-continued (a1-3)

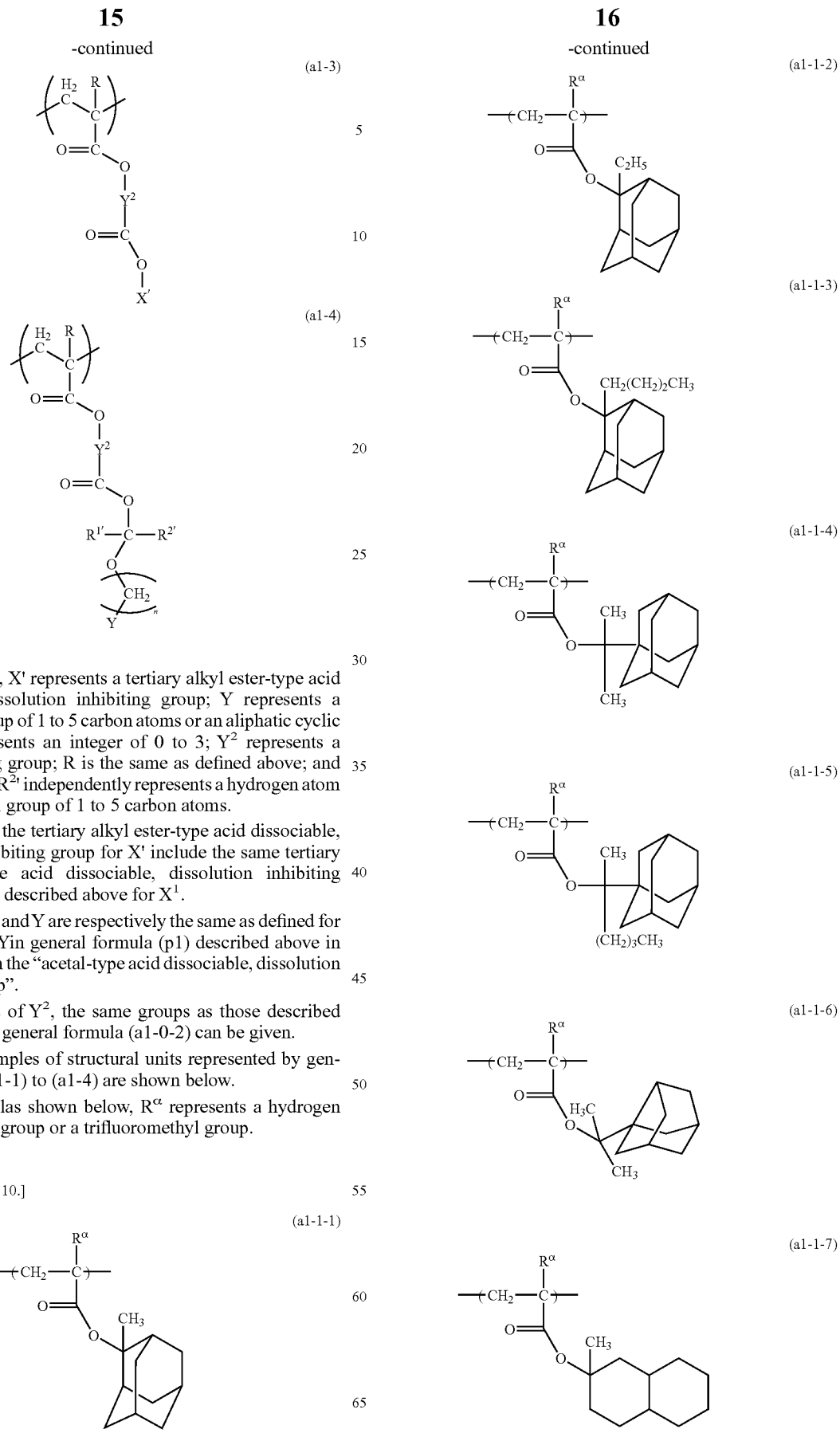

(a1-4)

In the formulas, X' represents a tertiary alkyl ester-type acid dissociable, dissolution inhibiting group; Y represents a lower alkyl group of 1 to 5 carbon atoms or an aliphatic cyclic group; n represents an integer of 0 to 3; $Y^2$ represents a divalent linking group; R is the same as defined above; and each of $R^{1\prime}$ and $R^{2\prime}$ independently represents a hydrogen atom or a lower alkyl group of 1 to 5 carbon atoms.

Examples of the tertiary alkyl ester-type acid dissociable, dissolution inhibiting group for X' include the same tertiary alkyl ester-type acid dissociable, dissolution inhibiting groups as those described above for $X^1$.

As $R^{1\prime}$, $R^{2\prime}$, n and Y are respectively the same as defined for $R^{1\prime}$, $R^{2\prime}$, n and Y in general formula (p1) described above in connection with the "acetal-type acid dissociable, dissolution inhibiting group".

As examples of $Y^2$, the same groups as those described above for $Y^2$ in general formula (a1-0-2) can be given.

Specific examples of structural units represented by general formula (a1-1) to (a1-4) are shown below.

In the formulas shown below, $R^\alpha$ represents a hydrogen atom, a methyl group or a trifluoromethyl group.

[Chemical Formula 10.]

(a1-1-8) 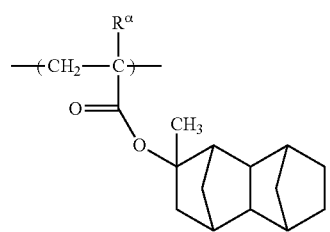
(a1-1-9) 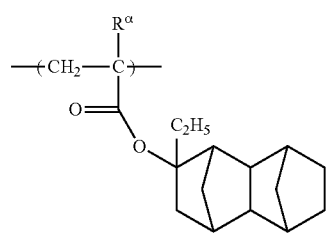
[Chemical Formula 11.]
(a1-1-10) 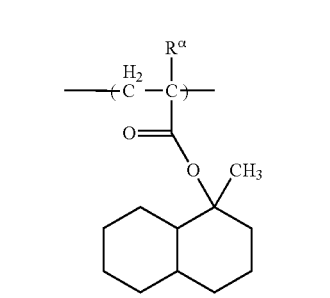
(a1-1-11) 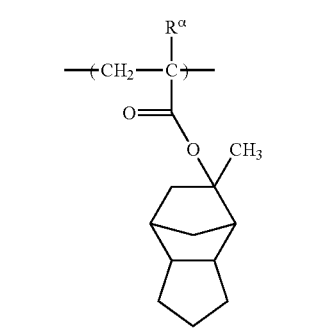
(a1-1-12) 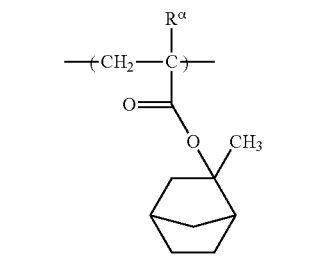
(a1-1-13) 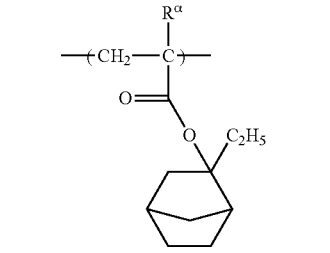
(a1-1-14) 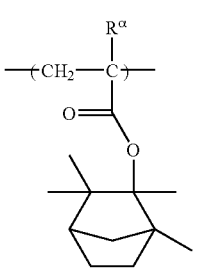
(a1-1-15) 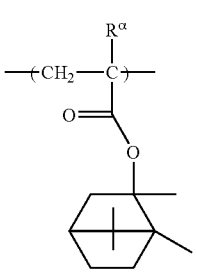
(a1-1-16) 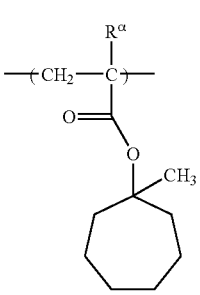
(a1-1-17) 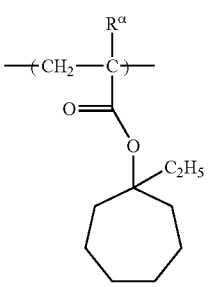
(a1-1-18) 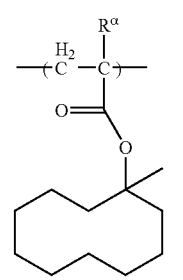

(a1-1-19) 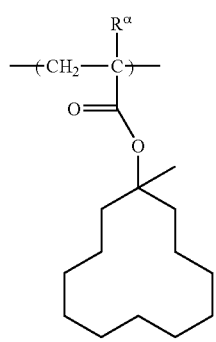
(a1-1-20) 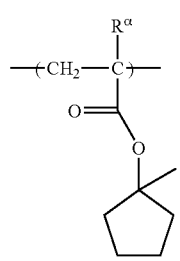
(a1-1-21) 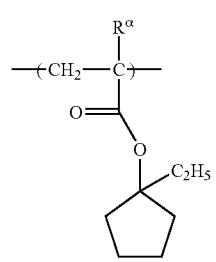
[Chemical Formula 12.]
(a1-1-22) 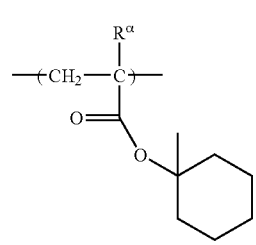
(a1-1-23) 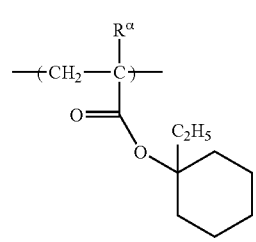
(a1-1-24) 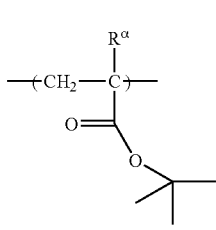
(a1-1-25) 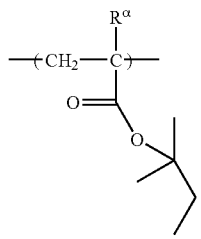
(a1-1-26) 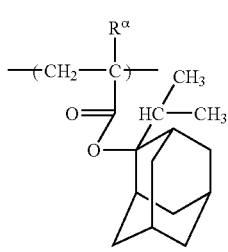
(a1-1-27) 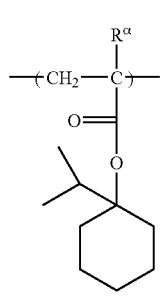
(a1-1-28) 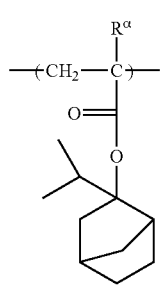
(a1-1-29) 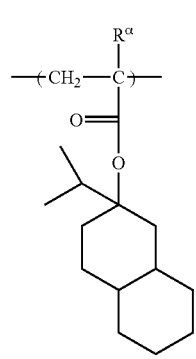

(a1-1-30)
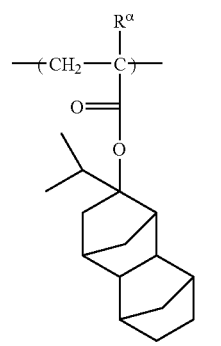
(a1-1-31)
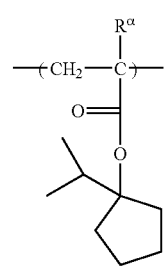
(a1-1-32)
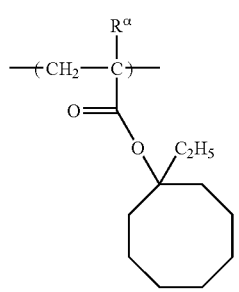
(a1-1-33)
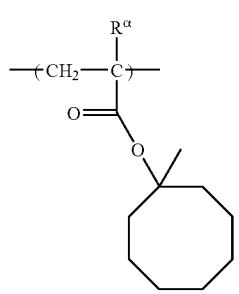
[Chemical Formula 13.]
(a1-2-1)
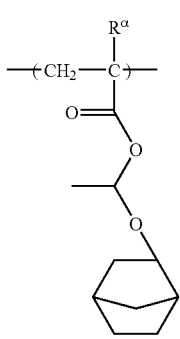
(a1-2-2)
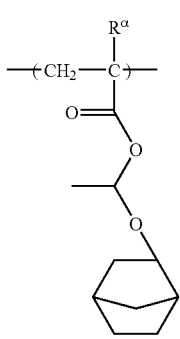
(a1-2-3)
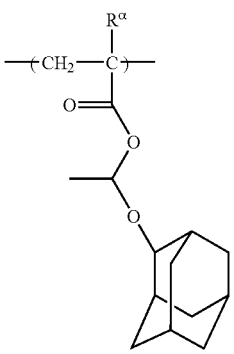
(a1-2-4)
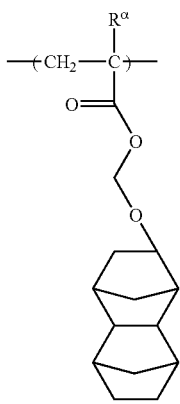
(a1-2-5)
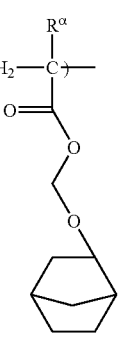

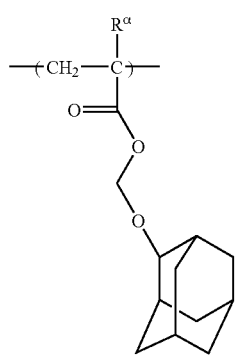
(a1-2-6)
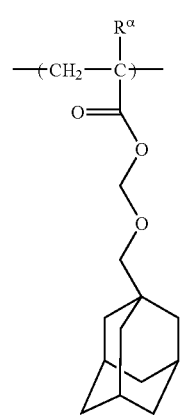
(a1-2-7)
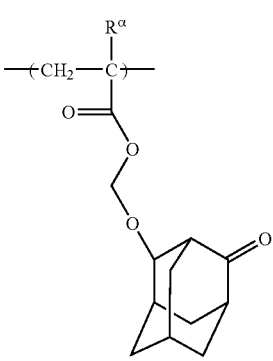
(a1-2-8)
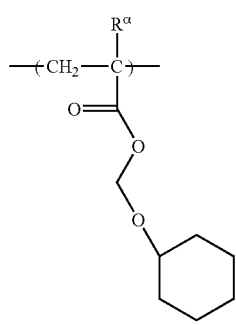
(a1-2-9)
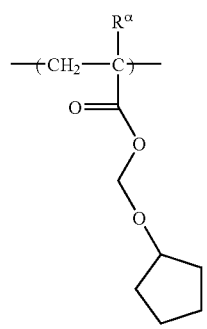
(a1-2-10)
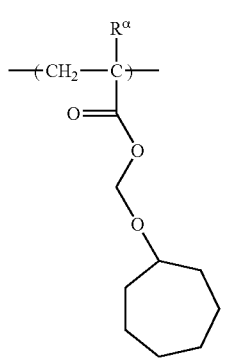
(a1-2-11)
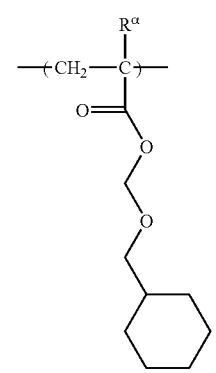
(a1-2-12)
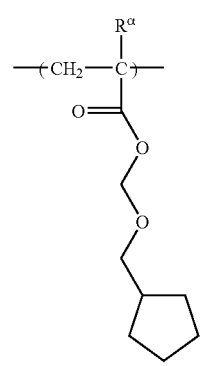
(a1-2-13)

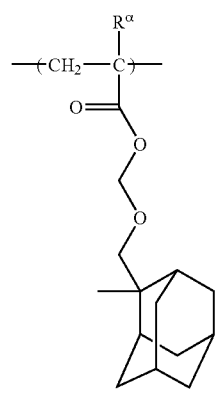
(a1-2-14)
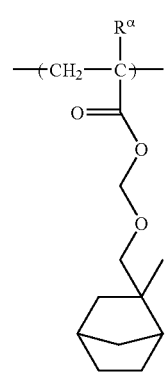
(a1-2-15)
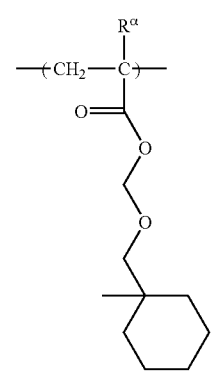
(a1-2-16)
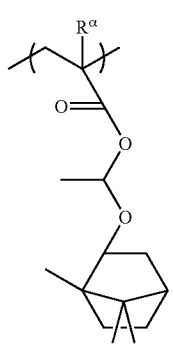
(a1-2-17)
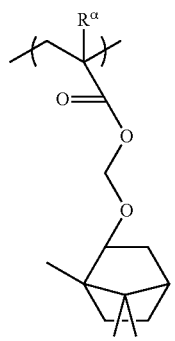
(a1-2-18)
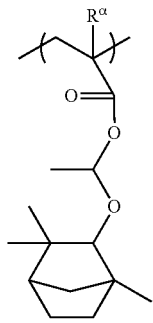
(a1-2-19)
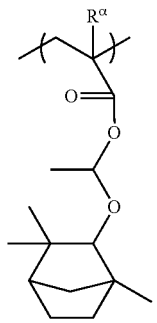
(a1-2-20)
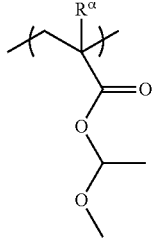
(a1-2-21)
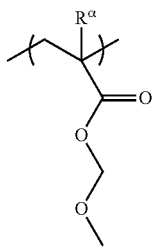
(a1-2-22)

(a1-2-23)
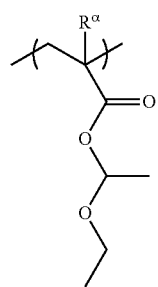
(a1-2-24)
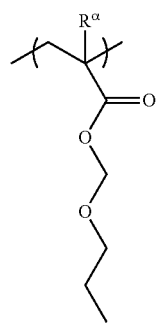
[Chemical Formula 14.]
(a1-3-1)
(a1-3-2)
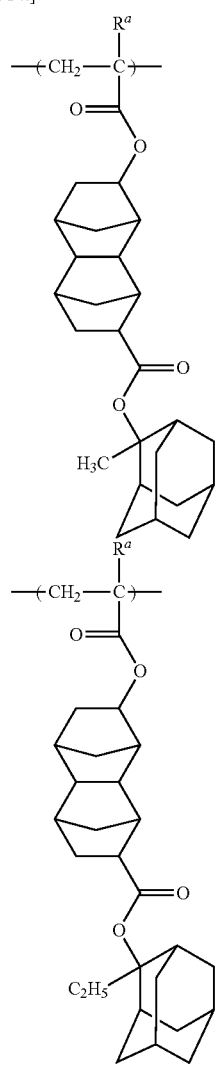
(a1-3-3)
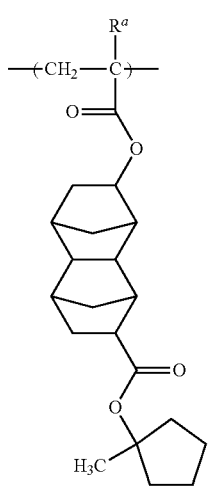
(a1-3-4)
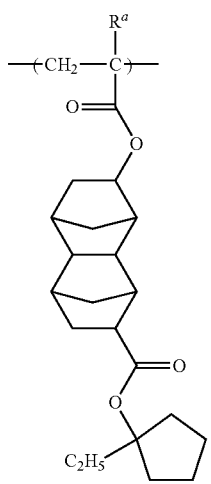
(a1-3-5)
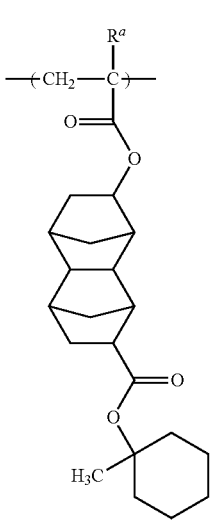

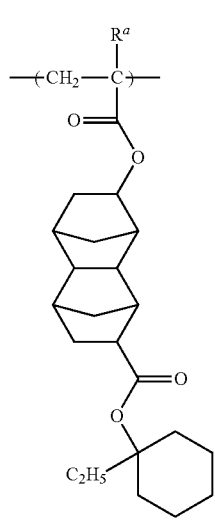
(a1-3-6)
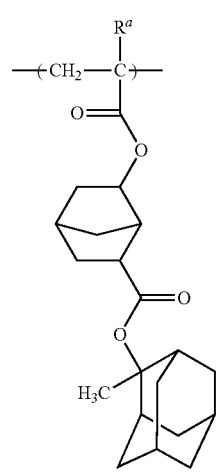
(a1-3-7)
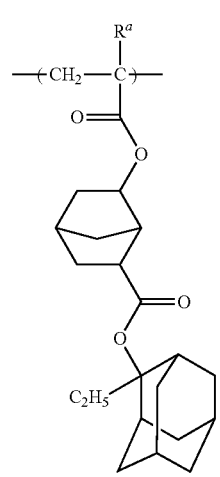
(a1-3-8)
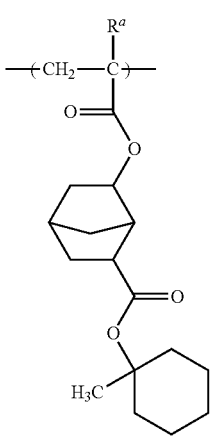
(a1-3-9)
(a1-3-10)
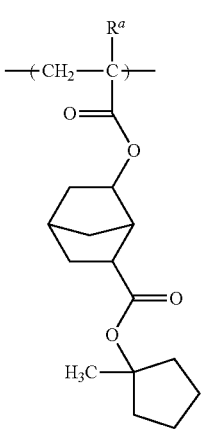
(a1-3-11)

(a1-3-12) 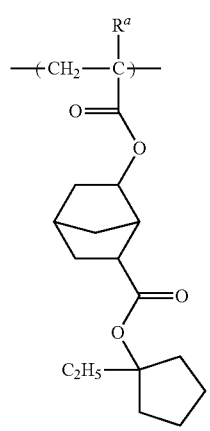
(a1-3-13) 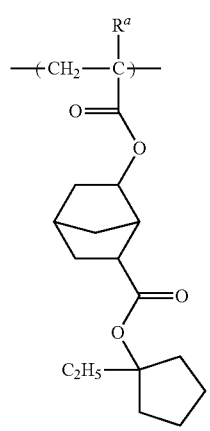
(a1-3-14) 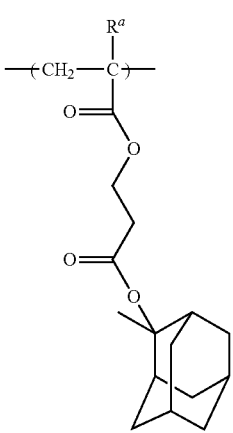
(a1-3-15) 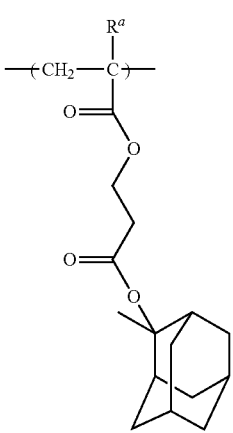
(a1-3-16) 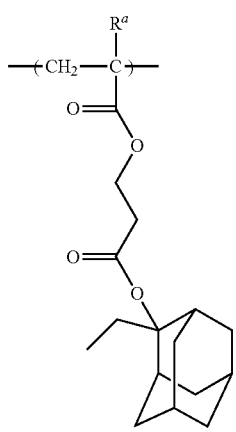
(a1-3-17) 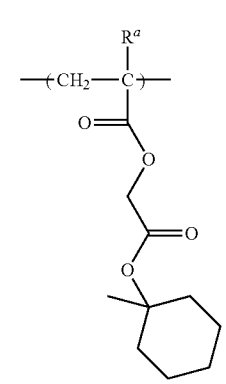
(a1-3-18) 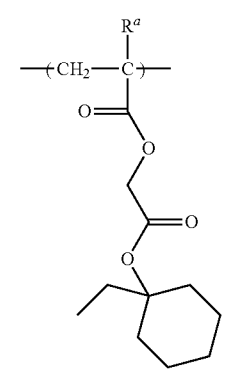
[Chemical Formula 15.]
(a1-3-19) 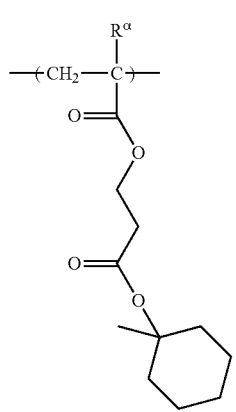

(a1-3-20) 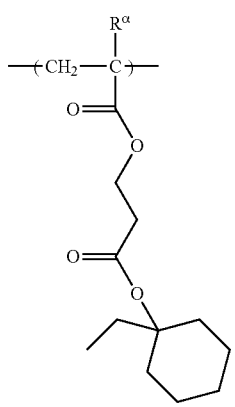
(a1-3-21)
(a1-3-22)
(a1-3-23) 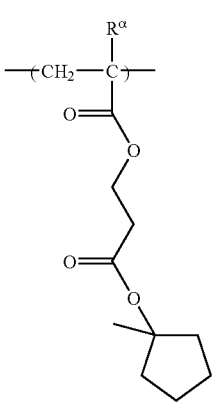
(a1-3-24) 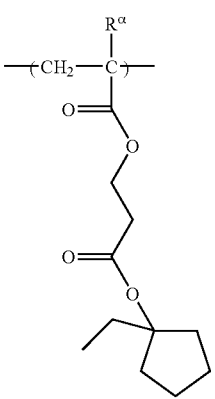
[Chemical Formula 16.]
(a1-3-25) 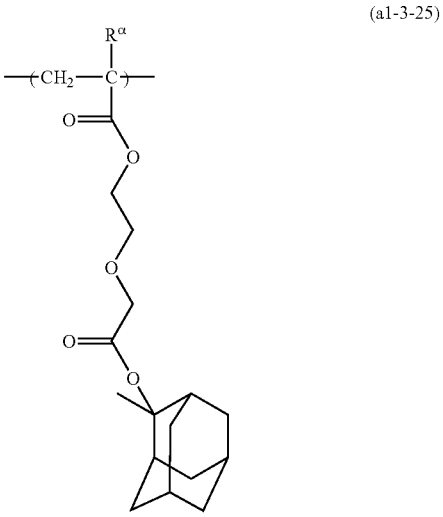
(a1-3-26) 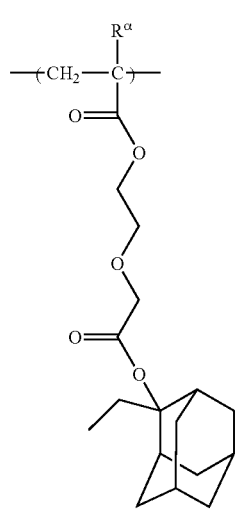

(a1-3-27)
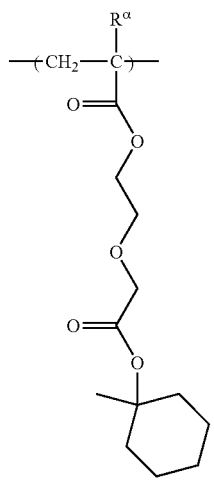
(a1-3-28)
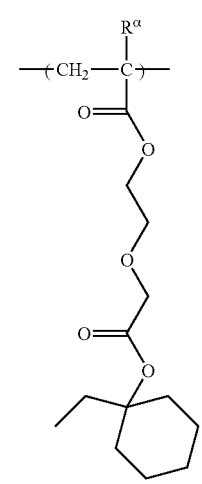
(a1-3-29)
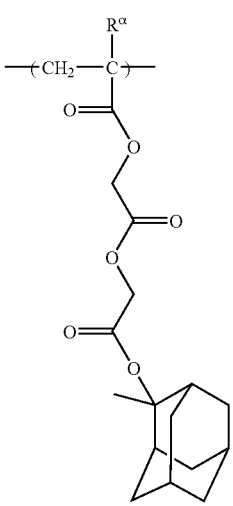
(a1-3-30)
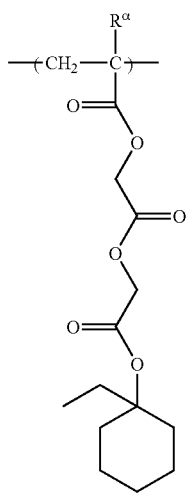
(a1-3-31)
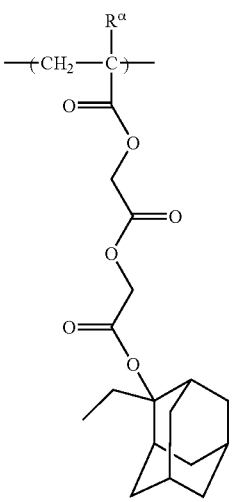
(a1-3-32)
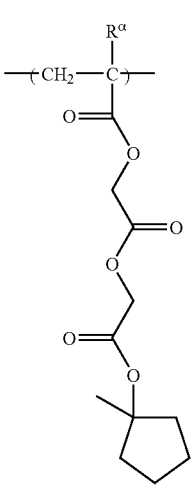

[Chemical Formula 17.]
(a1-4-1)
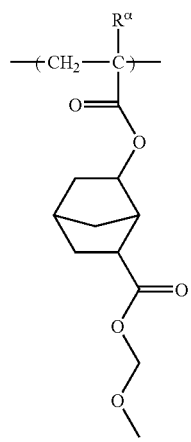
(a1-4-2)
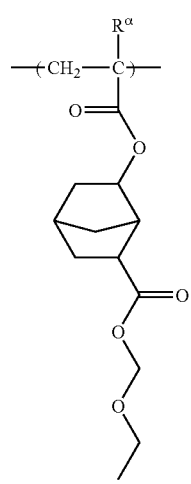
(a1-4-3)
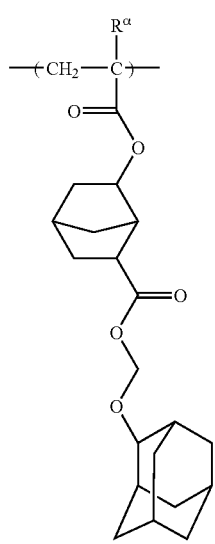
(a1-4-4)
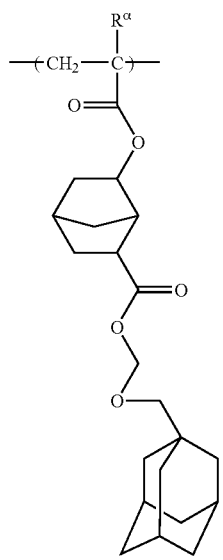
(a1-4-5)
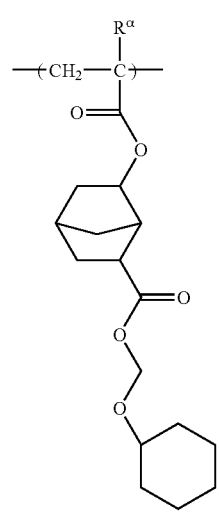
(a1-4-6)
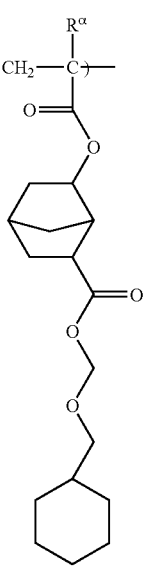

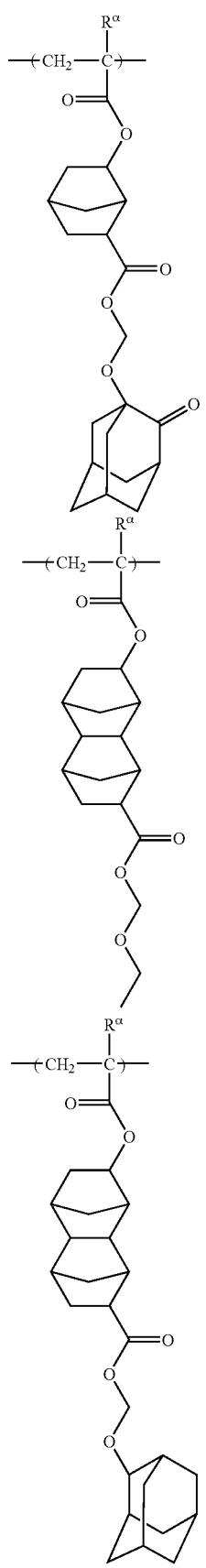
(a1-4-7)
(a1-4-8)
(a1-4-9)
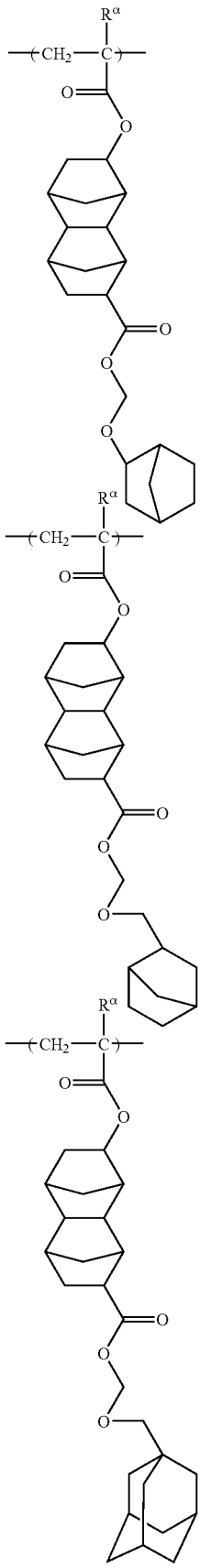
(a1-4-10)
(a1-4-11)
(a1-4-12)

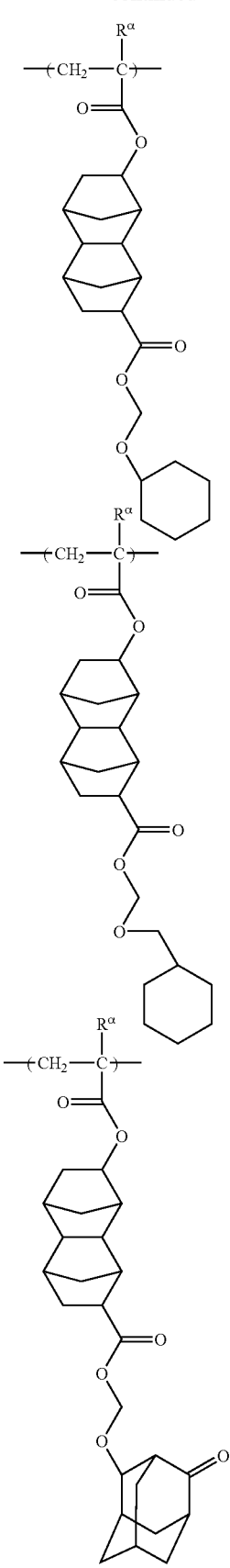

As the structural unit (a1), one type of structural unit may be used alone, or two or more types of structural units may be used in combination.

Among these, structural units represented by general formula (a1-1) or (a1-3) are preferable. More specifically, at least one structural unit selected from the group consisting of structural units represented by formulas (a1-1-1) to (a-1-1-4), (a1-1-16), (a1-1-17), (a1-1-20) to (a1-1-23), (a1-1-26), (a1-1-32), (a1-1-33) and (a1-3-25) to (a1-3-28) is more preferable.

Further, as the structural unit (a1), structural units represented by general formula (a1-1-01) shown below which includes the structural units represented by formulas (a1-1-1) to (a1-1-3) and (a1-1-26), structural units represented by general formula (a1-1-02) shown below which includes the structural units represented by formulas (a1-1-16), (a1-1-17), (a1-1-20) to (a1-1-23), (a1-1-32) and (a1-1-33), structural units represented by general formula (a1-3-01) shown below which include the structural units represented by formulas (a1-3-25) and (a1-3-26), and structural units represented by general formula (a1-3-02) shown below which include the structural units represented by formulas (a1-3-27) and (a1-3-28) are also preferable.

[Chemical Formula 18.]

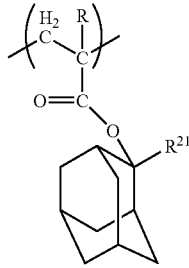

(a1-1-01)

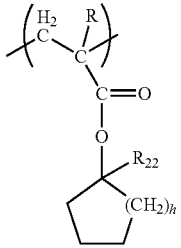

(a1-1-02)

In the formula, R represents a hydrogen atom, a lower alkyl group or a halogenated lower alkyl group; $R^{21}$ represents a lower alkyl group; $R^{22}$ represents a lower alkyl group; and h represents an integer of 1 to 6.

In general formula (a1-1-01), R is the same as defined above.

The lower alkyl group for $R^{21}$ is the same as defined for the lower alkyl group for R above, a linear or branched alkyl group is preferable, and a methyl group, an ethyl group or an isopropyl group is particularly desirable.

In general formula (a1-1-02), R is the same as defined above.

The lower alkyl group for $R^{22}$ is the same as defined for the lower alkyl group for R above, a linear or branched alkyl group is preferable, and a methyl group or an ethyl group is particularly desirable.

h is preferably 1 or 2.

[Chemical Formula 19.]

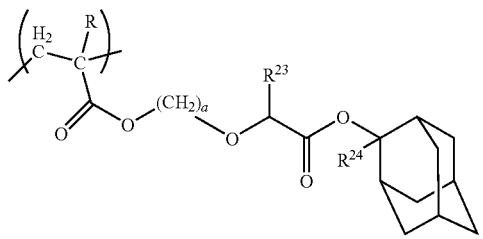

(a1-3-01)

In the formula, R represents a hydrogen atom, a lower alkyl group or a halogenated lower alkyl group; $R^{24}$ represents a lower alkyl group; $R^{23}$ represents a hydrogen atom or a methyl group; and a represents an integer of 1 to 10.

[Chemical Formula 20.]

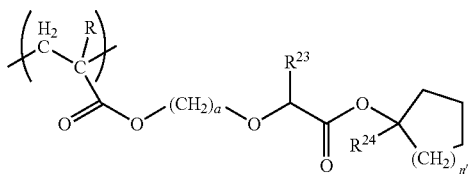

(a1-3-02)

In the formula, R represents a hydrogen atom, a lower alkyl group or a halogenated lower alkyl group; $R^{24}$ represents a lower alkyl group; $R^{23}$ represents a hydrogen atom or a methyl group; a represents an integer of 1 to 10; and n' represents an integer of 1 to 6.

In general formulas (a1-3-01) and (a1-3-02), R is the same as defined above.

$R^{23}$ is preferably a hydrogen atom.

The lower alkyl group for $R^{24}$ is the same as defined for the lower alkyl group for R, and is preferably a methyl group or an ethyl group.

a is preferably an integer of 1 to 8, more preferably an integer of 2 to 5, and most preferably 2.

In the component (A1), the amount of the structural unit (a1) based on the combined total of all structural units constituting the component (A1) is preferably 10 to 80 mol %, more preferably 20 to 70 mol %, and still more preferably 25 to 50 mol %. When the amount of the structural unit (a1) is at least as large as the lower limit of the above-mentioned range, a pattern can be easily formed using a resist composition prepared from the component (A1). On the other hand, when the amount of the structural unit (a1) is no more than the upper limit of the above-mentioned range, a good balance can be achieved with the other structural units.

(Structural Unit (a2))

The structural unit (a2) is a structural unit derived from an acrylate ester containing a lactone-containing cyclic group.

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A1) is used for forming a resist film, the lactone-containing cyclic group of the structural unit (a2) is effective in improving the adhesion between the resist film and the substrate, and increasing the compatibility with the developing solution containing water.

As the structural unit (a2), there is no particular limitation, and an arbitrary structural unit may be used.

Specific examples of lactone-containing monocyclic groups include a group in which one hydrogen atom has been removed from a 4- to 6-membered lactone ring, such as a group in which one hydrogen atom has been removed from β-propionolatone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 21.]

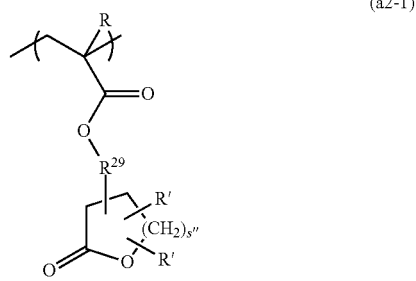

(a2-1)

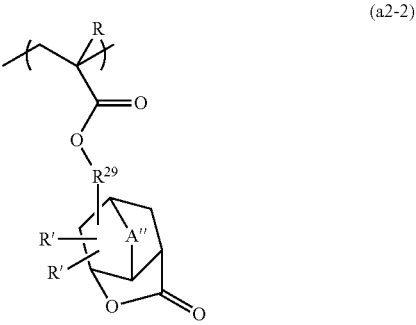

(a2-2)

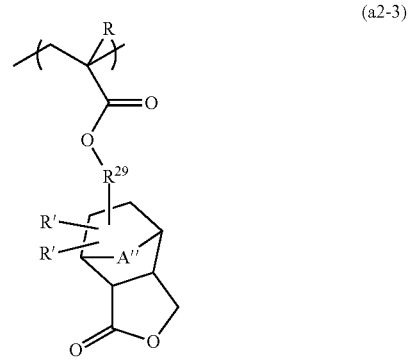

(a2-3)

(a2-4)
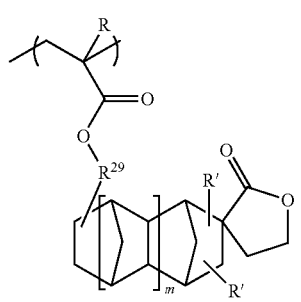

(a2-5)
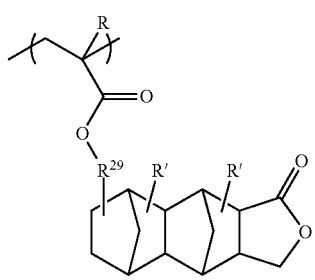

In the formulas, R represents a hydrogen atom, a lower alkyl group or a halogenated lower alkyl group; each R' independently represents a hydrogen atom, an alkyl group of 1 to 5 carbon atoms, an alkoxy group of 1 to 5 carbon atoms or —COOR", wherein R" represents a hydrogen atom or an alkyl group; $R^{29}$ represents a single bond or a divalent linking group; s" represents an integer of 0 to 2; A" represents an oxygen atom, a sulfur atom or an alkylene group of 1 to 5 carbon atoms which may contain an oxygen atom or a sulfur atom; and m represents 0 or 1.

In general formulas (a2-1) to (a2-5), R is the same as defined for R in the structural unit (a1).

Examples of the alkyl group of 1 to 5 carbon atoms for R' include a methyl group, an ethyl group, a propyl group, an n-butyl group and a tert-butyl group.

Examples of the alkoxy group of 1 to 5 carbon atoms for R' include a methoxy group, an ethoxy group, an n-propoxy group, an iso-propoxy group, an n-butoxy group and a tert-butoxy group In terms of industrial availability, R' is preferably a hydrogen atom.

R" preferably represents a hydrogen atom or a linear, branched or cyclic alkyl group of 1 to 15 carbon atoms.

When R" is a linear or branched alkyl group, it preferably has 1 to 10 carbon atoms, more preferably 1 to 5 carbon atoms.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Examples of such groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

As A", an alkylene group of 1 to 5 carbon atoms or —O— is preferable, more preferably an alkylene group of 1 to 5 carbon atoms, and most preferably a methylene group.

$R^{29}$ represents a single bond or a divalent linking group. Examples of divalent linking groups include the same divalent linking groups as those described above for $Y^2$ in general formula (a1-0-2). Among these, an alkylene group, an ester bond (—C(=O)—O—) or a combination thereof is preferable. The alkylene group as a divalent linking group for $R^{29}$ is preferably a linear or branched alkylene group. Specific examples include the same linear alkylene groups and branched alkylene groups as those described above for the aliphatic cyclic group A in $Y^2$.

s" is preferably 1 or 2.

Specific examples of structural units represented by general formulas (a2-1) to (a2-5) are shown below.

In the formulas shown below, $R^\alpha$ represents a hydrogen atom, a methyl group or a trifluoromethyl group.

[Chemical Formula 22.]

(a2-1-1)
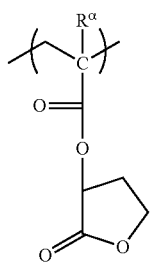

(a2-1-2)
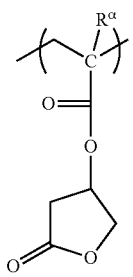

(a2-1-3)
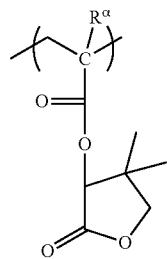

(a2-1-4)
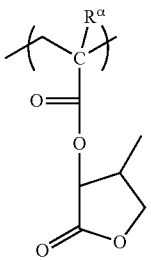

(a2-1-5)
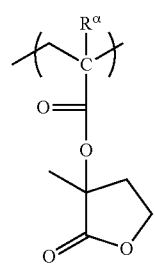
(a2-1-6)
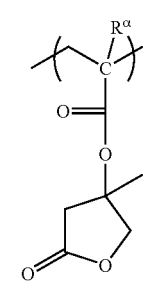
(a2-1-7)
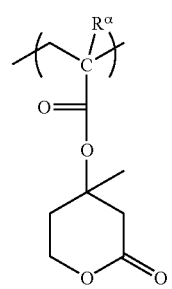
(a2-1-8)
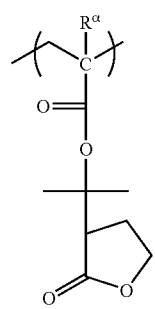
(a2-1-9)
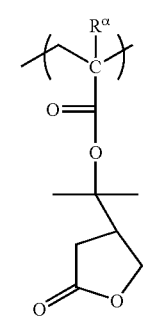
(a2-1-10)
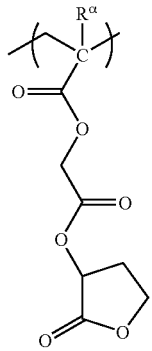
(a2-1-11)
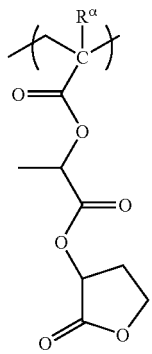
(a2-1-12)
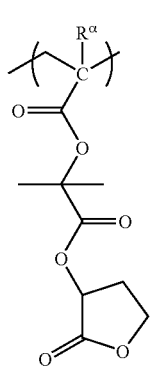
(a2-1-13)
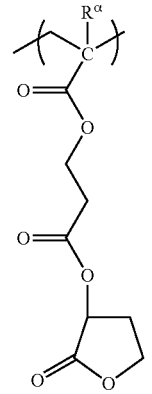

[Chemical Formula 23.]
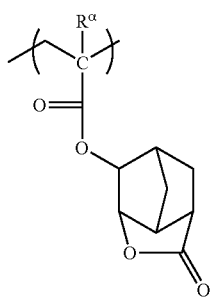
(a2-2-1)
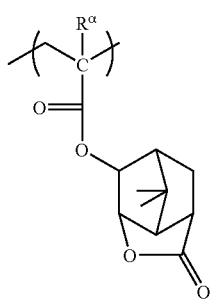
(a2-2-2)
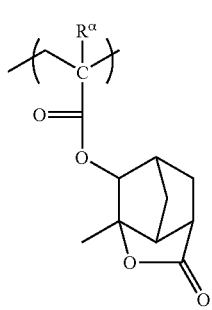
(a2-2-3)
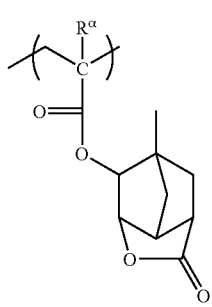
(a2-2-4)
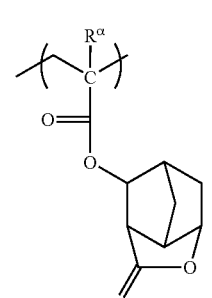
(a2-2-5)
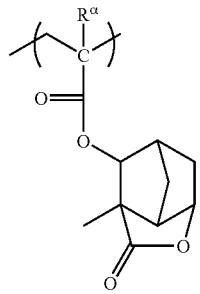
(a2-2-6)
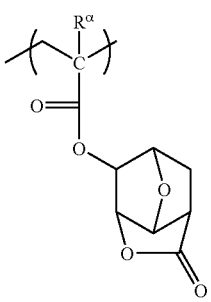
(a2-2-7)
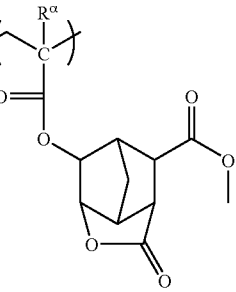
(a2-2-8)
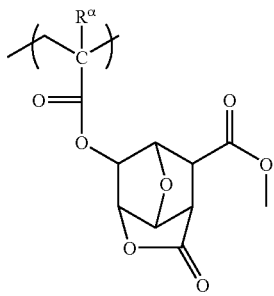
(a2-2-9)
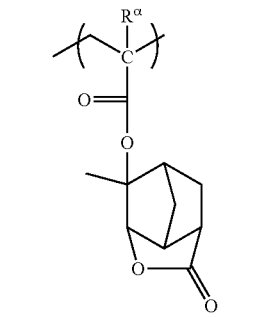
(a2-2-10)

(a2-2-11)
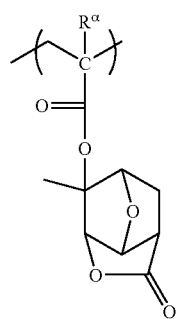
(a2-2-12)
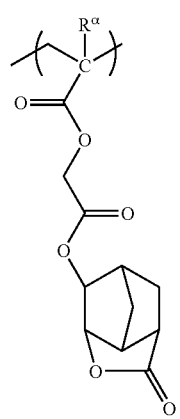
(a2-2-13)
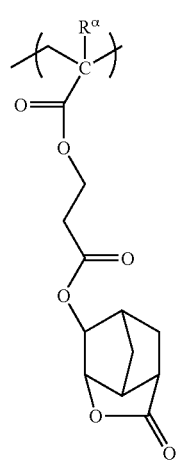
(a2-2-14)
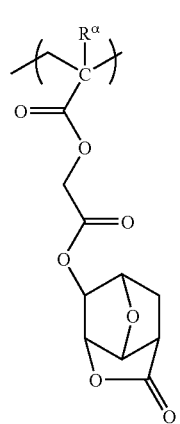
(a2-2-15)
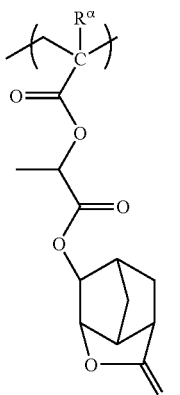
(a2-2-16)
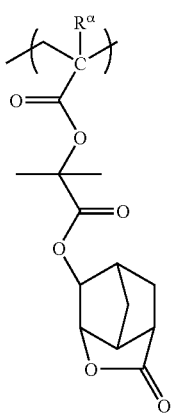
(a2-2-17)
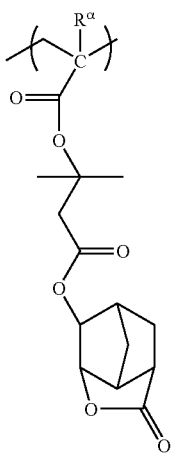
[Chemical Formula 24.]
(a2-3-1)

53
-continued
(a2-3-2)
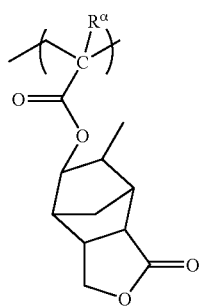
(a2-3-3)
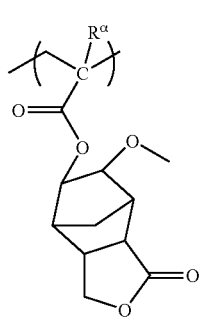
(a2-3-4)
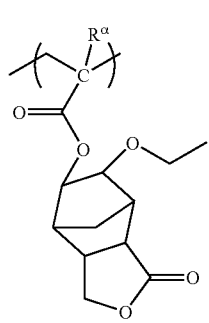
(a2-3-5)
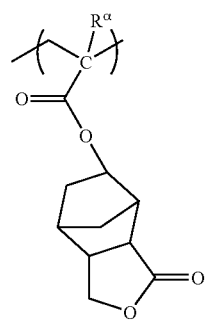
[Chemical Formula 25.]
(a2-4-1)
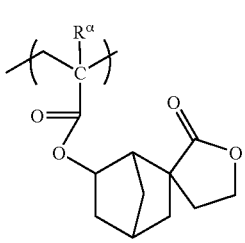
54
-continued
(a2-4-2)
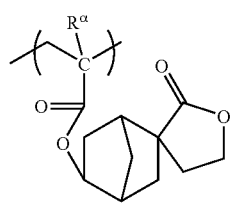
(a2-4-3)
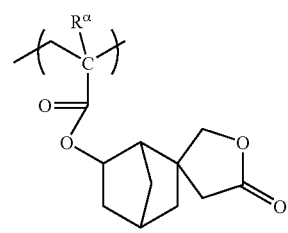
(a2-4-4)
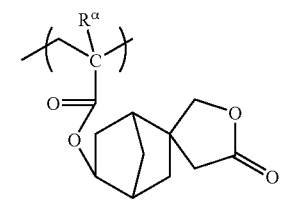
(a2-4-5)
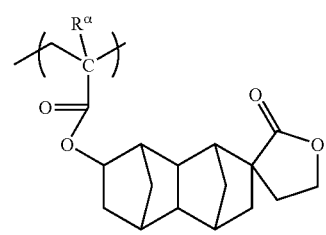
(a2-4-6)
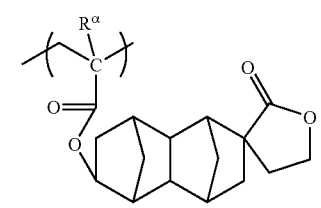
(a2-4-7)
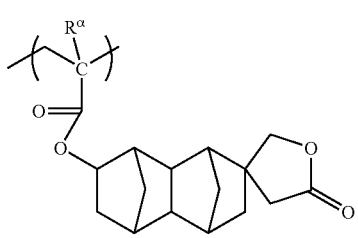
(a2-4-8)
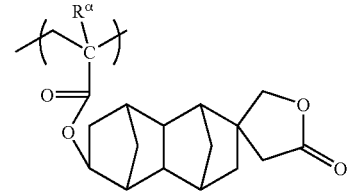

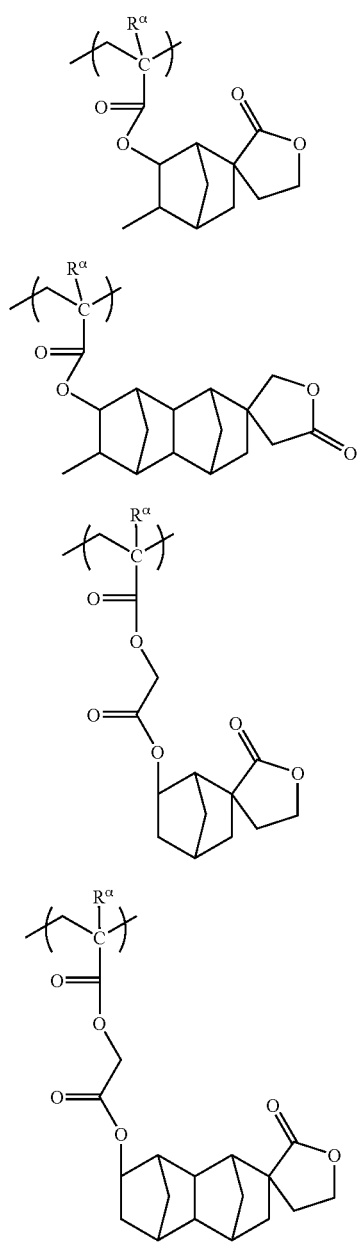
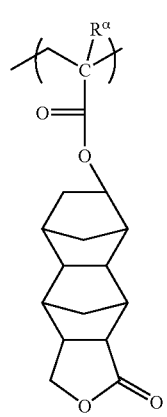
[Chemical Formula 26.]
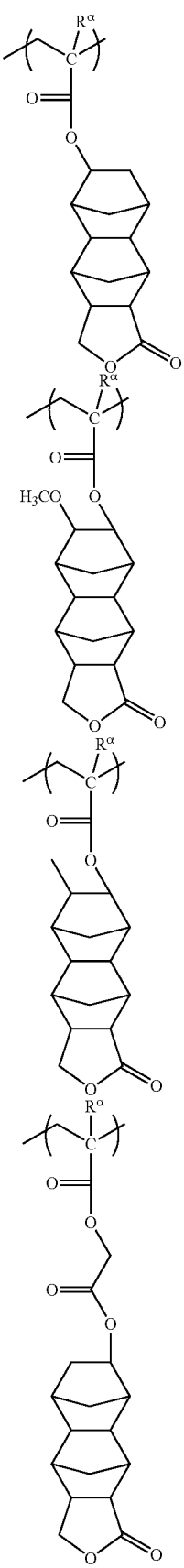

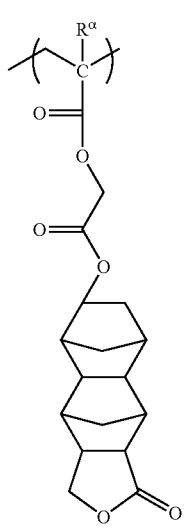

(a2-5-6)

In the component (A1), as the structural unit (a2), one type of structural unit may be used, or two or more types may be used in combination.

As the structural unit (a2), at least one structural unit selected from the group consisting of formulas (a2-1) to (a2-5) is preferable, and at least one structural unit selected from the group consisting of formulas (a2-1) to (a2-3) is more preferable. Of these, it is preferable to use at least one structural unit selected from the group consisting of structural units represented by formulas (a2-1-1), (a2-1-2), (a2-2-1), (a2-2-7), (a2-3-1) and (a2-3-5).

In the component (A1), the amount of the structural unit (a2) based on the combined total of all structural units constituting the component (A1) is preferably 5 to 60 mol %, more preferably 10 to 50 mol %, and still more preferably 20 to 50 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units.

(Structural Unit (a3))

The structural unit (a3) is a structural unit derived from an acrylate ester containing a polar group-containing aliphatic hydrocarbon group.

When the component (A1) includes the structural unit (a3), the hydrophilicity of the component (A) is improved, and hence, the compatibility of the component (A) with the developing solution is improved. As a result, the alkali solubility of the exposed portions improves, which contributes to favorable improvements in the resolution.

Examples of the polar group include a hydroxyl group, cyano group, carboxyl group, or hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 27.]

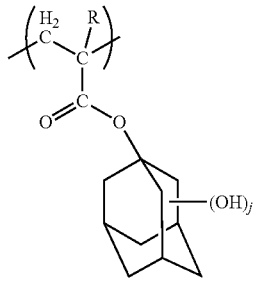

(a3-1)

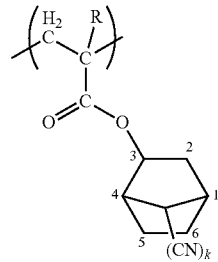

(a3-2)

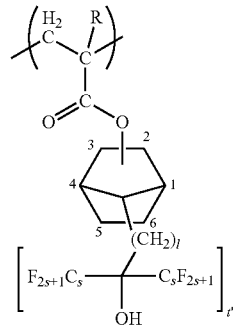

(a3-3)

In the formulas, R is the same as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

As the structural unit (a3), one type of structural unit may be used, or two or more types may be used in combination.

The amount of the structural unit (a3) within the component (A1) based on the combined total of all structural units constituting the component (A1) is preferably 5 to 50 mol %, more preferably 5 to 40 mol %, and still more preferably 5 to 25 mol %. When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

(Other Structural Units)

The component (A1) may also have a structural unit other than the above-mentioned structural units (a1) to (a3), as long as the effects of the present invention are not impaired.

As such a structural unit, any other structural unit which cannot be classified as one of the above structural units (a1) to (a3) can be used without any particular limitation, and any of the multitude of conventional structural units used within resist resins for ArF excimer lasers or KrF excimer lasers (and particularly for ArF excimer lasers) can be used.

Examples of other structural units include a structural unit (a4) derived from an acrylate ester containing a non-acid-dissociable aliphatic polycyclic group, and a structural unit (a0) represented by general formula (a0-1) which will be described later.

Structural Unit (a4)

The structural unit (a4) is a structural unit derived from an acrylate ester containing a non-acid dissociable, aliphatic polycyclic group.

Examples of this polycyclic group include the same groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-5) shown below.

[Chemical Formula 28.]

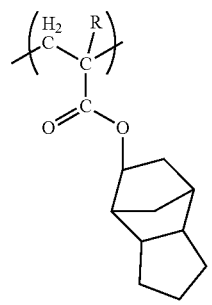

(a4-1)

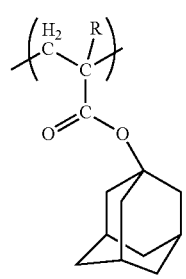

(a4-2)

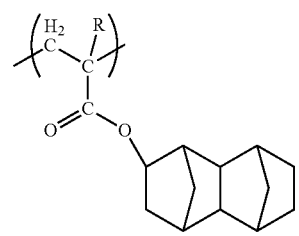

(a4-3)

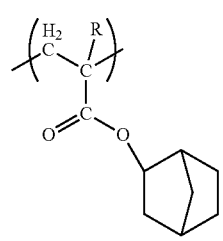

(a4-4)

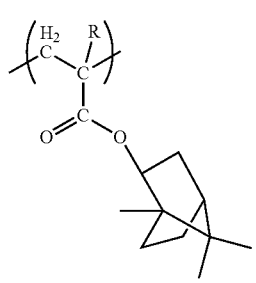

(a4-5)

In the formulas, R is the same as defined above.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

Structural Unit (a0)

The structural unit (a0) is represented by general formula (a0-1) shown below.

[Chemical Formula 29.]

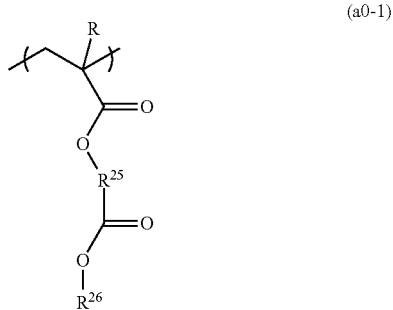

(a0-1)

In formula (a0-1), R represents a hydrogen atom, an alkyl group of 1 to 5 carbon atoms or a halogenated alkyl group of 1 to 5 carbon atoms; $R^{25}$ represents a divalent linking group; and $R^{26}$ represents a cyclic group containing an —$SO_2$— group within the ring skeleton thereof.

In general formula (a0-1), R is the same as defined above for R in the structural unit (a1).

In general formula (a0-1), $R^{25}$ represents a divalent linking group.

Preferable examples of $R^{25}$ include a divalent hydrocarbon group which may have a substituent, and a divalent linking group containing a hetero atom.

The hydrocarbon group for $R^{25}$ may be an aliphatic hydrocarbon group or an aromatic hydrocarbon group, and is the same as defined for the "hydrocarbon group for A" described above in relation to $Y^2$ in general formula (a1-0-2).

The a divalent linking group containing a hetero atom for $R^{25}$ is the same as defined for the "divalent linking group containing a hetero atom" for $Y^2$ is general formula (a1-0-2).

In the present invention, as the divalent linking group for $R^{25}$, an alkylene group, a divalent aliphatic cyclic group or a divalent linking group containing a hetero atom is preferable. Among these, an alkylene group is particularly desirable.

When $R^{25}$ represents an alkylene group, it preferably has 1 to 10 carbon atoms, more preferably 1 to 6, still more preferably 1 to 4, and most preferably 1 to 3. Specific examples of alkylene groups include the aforementioned linear alkylene groups and branched alkylene groups.

When $R^{25}$ represents a divalent aliphatic cyclic group, as the aliphatic cyclic group, the same aliphatic cyclic groups as those described above for the "aliphatic hydrocarbon group containing a ring in the structure thereof" can be used.

As the aliphatic cyclic group, a group in which two or more hydrogen atoms have been removed from cyclopentane, cyclohexane, norbornane, isobornane, adamantane, tricyclodecane or tetracyclododecane is particularly desirable.

When $R^{25}$ represents a divalent linking group containing a hetero atom, preferable examples of the divalent linking group containing a hetero atom include —O—, —C(=O)—O—, —C(=O)—, —C(=O)—NH—, —$NR^{04}$— ($R^{04}$ represents a substituent such as an alkyl group or an acyl group), —S—, —S(=O)$_2$—, —S(=O)$_2$—O—, a group represented by the formula -A-O-B-, and a group represented by the formula —[A-C(=O)—O]$_q$-B-. Herein, each of A and B independently represents a divalent hydrocarbon group which may have a substituent, and q represents an integer of 0 to 3.

In the group represented by the formula -A-O-B- or —[A-C(=O)—O]$_q$-B-, each of A and B independently represents a divalent hydrocarbon group which may have a substituent.

Examples of divalent hydrocarbon groups for A and B which may have a substituent include the same groups as those described above for the "divalent hydrocarbon group which may have a substituent" usable as $R^{25}$.

As A, a linear aliphatic hydrocarbon group is preferable, more preferably a linear alkylene group, still more preferably a linear alkylene group of 1 to 5 carbon atoms, and a methylene group or an ethylene group is particularly desirable.

As B, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[A-C(=O)—O]$_q$-B-, q represents an integer of 0 to 3, preferably an integer of 0 to 2, more preferably 0 or 1, and most preferably 1.

$R^{25}$ may or may not have an acid dissociable portion in the structure thereof. An "acid dissociable portion" refers to a portion within the $R^{25}$ group which is dissociated from the group by action of acid generated upon exposure. When the $R^{25}$ group has an acid dissociable portion, it preferably has an acid dissociable portion having a tertiary carbon atom.

In general formula (a0-1), $R^{26}$ represents a cyclic group containing —$SO_2$— within the ring skeleton thereof. More specifically, $R^3$ is a cyclic group in which the sulfur atom (S) within the —$SO_2$— group forms part of the ring skeleton thereof.

The cyclic group for $R^{26}$ refers to a cyclic group including a ring that contains —$SO_2$— within the ring skeleton thereof, and this ring is counted as the first ring. A cyclic group in which the only ring structure is the ring that contains —$SO_2$— in the ring skeleton thereof is referred to as a monocyclic group, and a group containing other ring structures is described as a polycyclic group regardless of the structure of the other rings. The cyclic group for $R^{26}$ may be either a monocyclic group or a polycyclic group.

As $R^{26}$, a cyclic group containing —O—$SO_2$— within the ring skeleton thereof, i.e., a sultone ring in which —O—S— within the —O—$SO_2$— group forms part of the ring skeleton thereof is particularly desirable.

The cyclic group for $R^{26}$ preferably has 3 to 30 carbon atoms, more preferably 4 to 20, still more preferably 4 to 15, and most preferably 4 to 12.

Herein, the number of carbon atoms refers to the number of carbon atoms constituting the ring skeleton, excluding the number of carbon atoms within a substituent.

The cyclic group for $R^{26}$ may be either an aliphatic cyclic group or an aromatic cyclic group, and is preferably an aliphatic cyclic group.

Examples of the aliphatic cyclic group for $R^{26}$ include the cyclic aliphatic hydrocarbon groups given as examples of the hydrocarbon groups for $R^{25}$ (i.e., the "hydrocarbon group for A") in which part of the carbon atoms constituting the ring skeleton thereof has been substituted with —$SO_2$— or —O—$SO_2$—.

More specifically, examples of monocyclic groups include a monocycloalkane in which one hydrogen atom have been removed therefrom and a —$CH_2$— group constituting the ring skeleton thereof has been substituted with —$SO_2$—; and a monocycloalkane in which one hydrogen atom have been removed therefrom and a —$CH_2$—$CH_2$— group constituting the ring skeleton thereof has been substituted with —O—SO$_2$—. Examples of polycyclic groups include a polycycloalkane (a bicycloalkane, a tricycloalkane, a tetracycloalkane or the like) in which one hydrogen atom have been removed therefrom and a —CH$_2$— group constituting the ring skeleton thereof has been substituted with —SO$_2$—; and a polycycloalkane in which one hydrogen atom have been removed therefrom and a —CH$_2$—CH$_2$— group constituting the ring skeleton thereof has been substituted with —O—SO$_2$—.

The cyclic group for R$^{26}$ may have a substituent. Examples of the substituent include an alkyl group, an alkoxy group, a halogen atom, a halogenated alkyl group, a hydroxy group, an oxygen atom (=O), —COOR", —OC(=O)R", a hydroxyalkyl group and a cyano group. R" represents a hydrogen atom or an alkyl group.

The alkyl group for the substituent is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

As the alkoxy group for the substituent, an alkoxy group of 1 to 6 carbon atoms is preferable. Further, the alkoxy group is preferably a linear alkoxy group or a branched alkyl group. Specific examples of the alkoxy group include the aforementioned alkyl groups for the substituent having an oxygen atom (—O—) bonded thereto.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

As examples of the halogenated lower alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

In the —COOR" group and the —OC(=O)R" group, R" preferably represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include the aforementioned alkyl groups for the substituent in which at least one hydrogen atom has been substituted with a hydroxy group.

More specific examples of R$^{26}$ include groups represented by general formulas (3-1) to (3-4) shown below.

[Chemical Formula 30.]

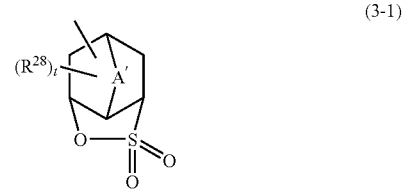

(3-1)

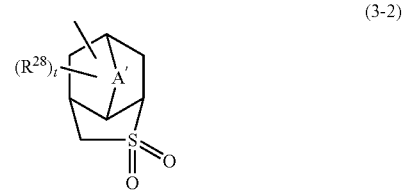

(3-2)

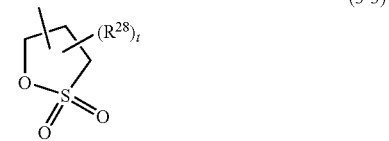

(3-3)

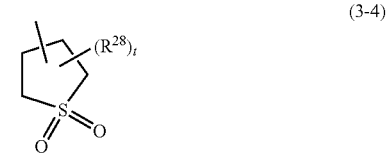

(3-4)

In the formulas, A' represents an oxygen atom, a sulfur atom, or an alkylene group of 1 to 5 carbon atoms which may contain an oxygen atom or a sulfur atom; t represents an integer of 0 to 2; and R$^{28}$ represents an alkyl group, an alkoxy group, a halogenated alkyl group, a hydroxyl group, —COOR", —OC(=O)R", a hydroxyalkyl group or a cyano group, wherein R" represents a hydrogen atom or an alkyl group.

In general formulas (3-1) to (3-4) above, A' represents an oxygen atom (—O—), a sulfur atom (—S—), or an alkylene group of 1 to 5 carbon atoms which may contain an oxygen atom or a sulfur atom.

As the alkylene group of 1 to 5 carbon atoms represented by A', a linear or branched alkylene group is preferable, and examples thereof include a methylene group, an ethylene group, an n-propylene group and an isopropylene group.

Examples of alkylene groups that contain an oxygen atom or a sulfur atom include the aforementioned alkylene groups in which —O— or —S— is bonded to the terminal of the alkylene group or interposed within the alkyl group. Specific examples of such alkylene groups include —O—CH$_2$—, —CH$_2$—O—CH$_2$—, —S—CH$_2$—, —CH$_2$—S—CH$_2$—.

As A', an alkylene group of 1 to 5 carbon atoms or —O— is preferable, more preferably an alkylene group of 1 to 5 carbon atoms, and most preferably a methylene group.

t represents an integer of 0 to 2, and is most preferably 0.

When t is 2, the plurality of R$^{28}$ may be the same or different from each other.

As the alkyl group, alkoxy group, halogenated alkyl group, halogenated alkyl group, hydroxyl group, —COOR", —OC (=O)R", hydroxyalkyl group and cyano group for $R^{28}$, the same alkyl groups, alkoxy groups, halogenated alkyl groups, halogenated alkyl groups, hydroxyl groups, —COOR", —OC(=O)R", hydroxyalkyl groups and cyano groups as those described above as the substituent for the cyclic group represented by $R^{26}$ can be used.

Specific examples of the cyclic groups represented by general formulas (3-1) to (3-4) are shown below. In the formulas shown below, "Ac" represents an acetyl group.

[Chemical Formula 31.]

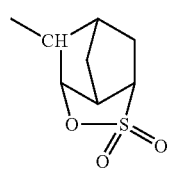 (3-1-1)

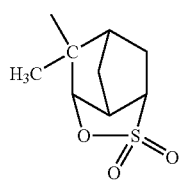 (3-1-2)

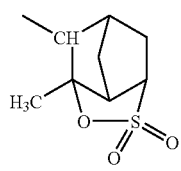 (3-1-3)

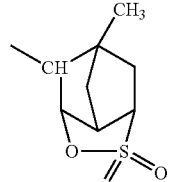 (3-1-4)

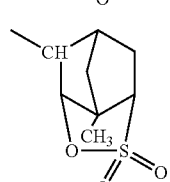 (3-1-5)

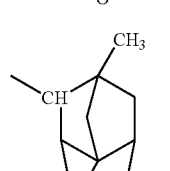 (3-1-6)

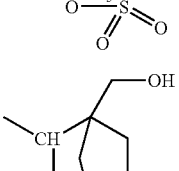 (3-1-7)

[Chemical Formula 32.]

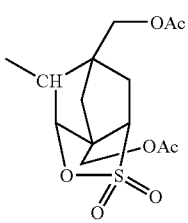 (3-1-8)

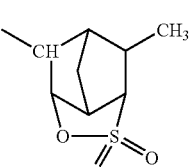 (3-1-9)

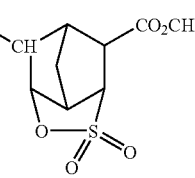 (3-1-10)

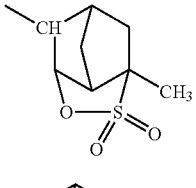 (3-1-11)

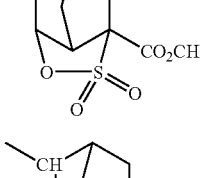 (3-1-12)

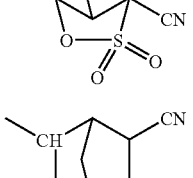 (3-1-13)

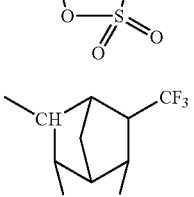 (3-1-14)

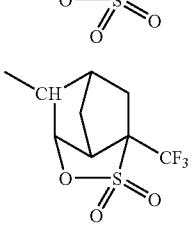 (3-1-15)

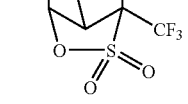 (3-1-16)

-continued
(3-1-17)
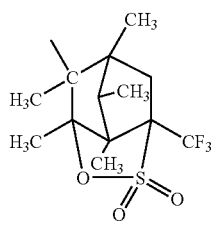
[Chemical Formula 33.]
(3-1-18)
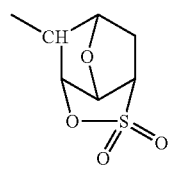
(3-1-19)
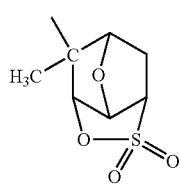
(3-1-20)
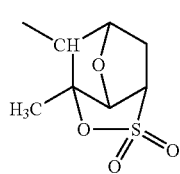
(3-1-21)
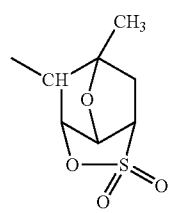
(3-1-22)
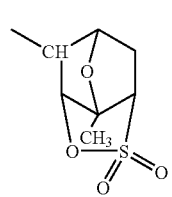
(3-1-23)
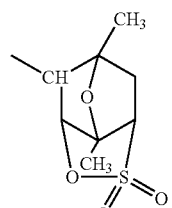
(3-1-24)
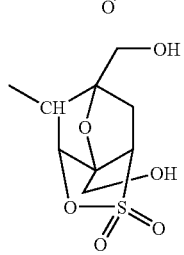
-continued
(3-1-25)
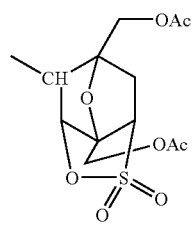
(3-1-26)
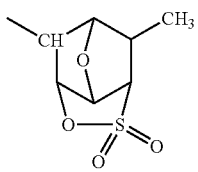
(3-1-27)
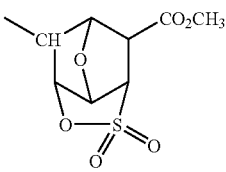
(3-1-28)
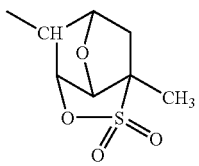
(3-1-29)
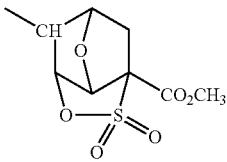
(3-1-30)
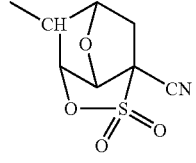
(3-1-31)
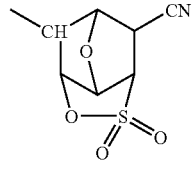
(3-1-32)
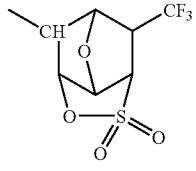
(3-1-33)
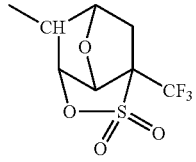

-continued

[Chemical Formula 34.]

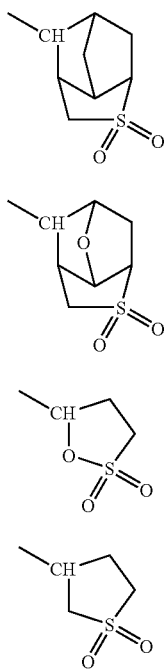

(3-2-1)

(3-2-2)

(3-3-1)

(3-4-1)

Among the examples shown above, as $R^{26}$, a cyclic group represented by general formula (3-1), (3-3) or (3-4) above is preferable, and a cyclic group represented by general formula (3-1) above is particularly desirable.

More specifically, as $R^{26}$, it is preferable to use at least one cyclic group selected from the group consisting of cyclic groups represented by chemical formulas (3-1-1), (3-1-18), (3-3-1) and (3-4-1) above, and a cyclic group represented by chemical formula (3-1-1) above is particularly desirable.

In the present invention, as the structural unit (a0), a structural unit represented by general formula (a0-1-11) shown below is particularly desirable.

[Chemical Formula 35.]

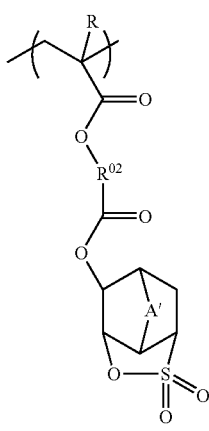

(a0-1-11)

In the formula, R is the same as defined above; $R^{02}$ represents a linear or branched alkylene group or -A-C(=O)—O-B- (wherein A and B are the same as defined above); and A' is the same as defined above.

The linear or branched alkylene group for $R^{02}$ preferably has 1 to 10 carbon atoms, more preferably 1 to 8, still more preferably 1 to 5, still more preferably 1 to 3, and most preferably 1 or 2.

In the -A-C(=O)—O-B- group, each of A and B preferably represents a linear or branched alkylene group, more preferably an alkylene group of 1 to 5 carbon atoms, and most preferably a methylene group or an ethylene group. Specific examples thereof include —(CH$_2$)$_2$—C(=O)—O—(CH$_2$)$_2$—, and —(CH$_2$)$_2$—O—C(=O)—(CH$_2$)$_2$—.

A' is preferably a methylene group, an oxygen atom (—O—) or a sulfur atom (—S—).

As the structural unit (a0), one type of structural unit may be used alone, or two or more types of structural units may be used in combination.

In the component (A1), the amount of the structural unit (a0) based on the combined total of all structural units constituting the component (A1) is preferably 1 to 60 mol %, more preferably 5 to 55 mol %, still more preferably 10 to 50 mol %, and most preferably 15 to 45 mol %. When the amount of the structural unit (a0) is at least as large as the lower limit of the above-mentioned range, lithography properties of a formed resist pattern such as exposure latitude (EL margin) and line width roughness (LWR) are improved. On the other hand, when the amount of the structural unit (a0) is no more than the upper limit of the above-mentioned range, a good balance can be achieved with the other structural units.

In the positive resist composition of the present invention, the component (A1) is preferably a polymeric compound having a structural unit (a1).

Examples of the component (A1) include a copolymer consisting of the structural units (a1), (a2) and (a3), a copolymer consisting of the structural units (a1), (a2), (a3) and (a4), and a copolymer consisting of the structural units (a1), (a2), (a3) and (a0).

In the component (A), as the component (A1), one type may be used alone, or two or more types may be used in combination.

In the present invention, as the component (A1), a polymeric compound that includes a combination of structural units such as that shown below is particularly desirable.

[Chemical Formula 36.]

Polymeric compound (A1-1)

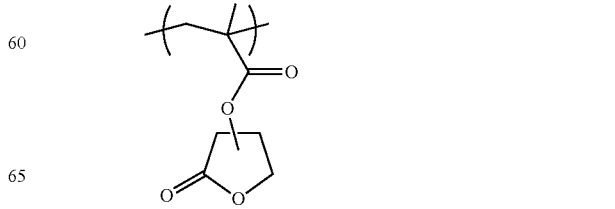

71
-continued

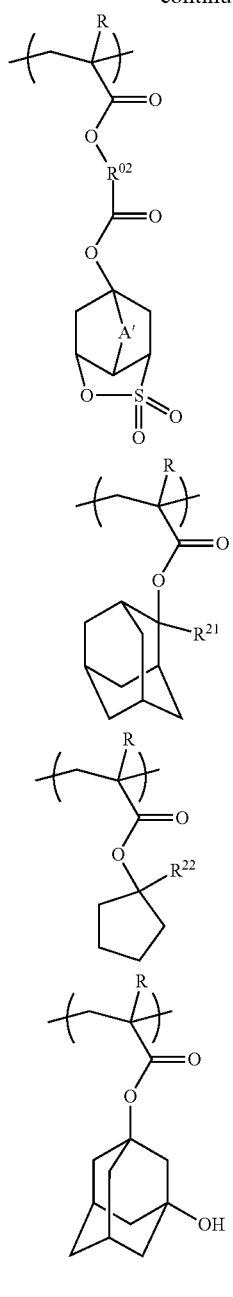

In the formula, R, $R^{02}$, A', $R^{21}$ and $R^{22}$ are the same as defined above; and the plurality of R may be the same or different from each other.

[Chemical Formula 37.]

Polymeric compound (A1-2)

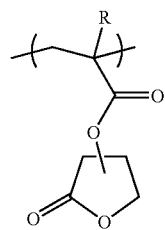

72
-continued

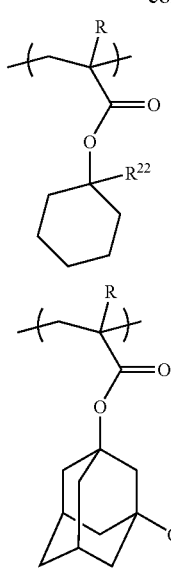

In the formula, R and $R^{22}$ are the same as defined above, and the plurality of R may be the same or different from each other.

[Chemical Formula 38.]

Polymeric compound (A1-3)

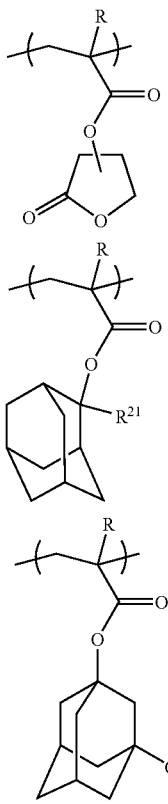

In the formula, R and $R^{21}$ are the same as defined above, and the plurality of R may be the same or different from each other.

In the polymeric compound (A1-1) represented by the aforementioned chemical formula, the alkyl group for $R^{21}$ is preferably a branched alkyl group, and more preferably an isopropyl group.

The alkyl group for $R^{22}$ is preferably a linear alkyl group, and a methyl group or an ethyl group is particularly desirable.

As $R^{22}$, a linear or branched alkylene group is preferable, and an alkylene group of 1 or 2 carbon atoms is particularly desirable.

As A', an alkylene group of 1 to 5 carbon atoms or —O— is preferable, more preferably an alkylene group of 1 to 5 carbon atoms, and a methylene group is particularly desirable.

In the polymeric compound (A1-2) represented by the aforementioned chemical formula, the alkyl group for $R^{22}$ is preferably a linear alkyl group, and a methyl group or an ethyl group is particularly desirable.

In the polymeric compound (A1-3) represented by the aforementioned chemical formula, the alkyl group for $R^{21}$ is preferably a linear alkyl group, and a methyl group or an ethyl group is particularly desirable.

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as HS—CH$_2$—CH$_2$—CH$_2$—C(CF$_3$)$_2$—OH, a —C(CF$_3$)$_2$—OH group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

The weight-average-molecular-weight (Mw) (the polystyrene equivalent value determined by gel permeation chromatography) of the component (A1) is not particularly limited, but is preferably 1,000 to 50,000, more preferably 1,500 to 30,000, and most preferably 2,500 to 20,000. When the weight-average-molecular-weight is no more than the upper limit of the above-mentioned range, the resist composition exhibits a satisfactory solubility in a resist solvent. On the other hand, when the weight-average-molecular-weight is at least as large as the lower limit of the above-mentioned range, dry etching resistance and the cross-sectional shape of the resist pattern becomes satisfactory.

Further, the dispersity (Mw/Mn) of the component (A1) is preferably 1.0 to 5.0, more preferably 1.0 to 3.0, and most preferably 1.2 to 2.5. Here, Mn is the number average molecular weight.

[Component (A2)]

In the positive resist composition of the present invention, as the low-molecular weight compound, it is preferable to use a compound that has a molecular weight of at least 500 and less than 2,000, contains a hydrophilic group, and also contains an acid dissociable, dissolution inhibiting group described above in connection with the structural unit (a1). Specific examples include compounds containing a plurality of phenol skeletons in which a part of the hydrogen atoms within hydroxyl groups have been substituted with the aforementioned acid dissociable, dissolution inhibiting groups.

Examples of the low-molecular weight compound include low-molecular-weight phenolic compounds in which a portion of the hydroxyl group hydrogen atoms have been substituted with an aforementioned acid dissociable, dissolution inhibiting group, and these types of compounds are known, for example, as sensitizers or heat resistance improvers for use in non-chemically amplified g-line or i-line resists.

Examples of these low-molecular-weight phenol compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3'4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers and tetramers of formalin condensation products of phenols such as phenol, m-cresol, p-cresol and xylenol. Needless to say, the low-molecular-weight phenol compound is not limited to these examples.

Also, there are no particular limitations on the acid dissociable, dissolution inhibiting group, and suitable examples include the groups described above.

As the component (A2), one type of resin may be used, or two or more types of resins may be used in combination.

In the positive resist composition of the present invention, the component (A) may contain "a base component which exhibits increased solubility in an alkali developing solution under action of acid" other than the component (A1) or the component (A2).

Such base component is not particularly limited, and any of the multitude of conventional base components used within chemically amplified resist compositions (e.g., a novolak resin, a polyhydroxystyrene-based resin (PHS), or the like) can be appropriately selected for use.

In the positive resist composition of the present invention, as the component (A), one type may be used, or two or more types of compounds may be used in combination.

In the positive resist composition of the present invention, the amount of the component (A) can be appropriately adjusted depending on the thickness of the resist film to be formed, and the like.

<Component (B)>

In the present invention, as the component (B), there is no particular limitation, and any of the known acid generators used in conventional chemically amplified resist compositions can be used.

Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators.

As an onium salt acid generator, a compound represented by general formula (b-1) or (b-2) shown below can be used.

[Chemical Formula 39.]

(b-1)

-continued

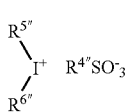
(b-2)

In the formulas above, $R^{1\prime\prime}$ to $R^{3\prime\prime}$, $R^{5\prime\prime}$ and $R^{6\prime\prime}$ each independently represents an aryl group or alkyl group, wherein two of $R^{1\prime\prime}$ to $R^{3\prime\prime}$ may be bonded to each other to form a ring with the sulfur atom; and $R^{4\prime\prime}$ represents an alkyl group, a halogenated alkyl group, an aryl group or an alkenyl group which may have a substituent, with the provision that at least one of $R^{1\prime\prime}$ to $R^{3\prime\prime}$ represents an aryl group, and at least one of $R^{5\prime\prime}$ and $R^{6\prime\prime}$ represents an aryl group.

In formula (b-1), $R^{1\prime\prime}$ to $R^{3\prime\prime}$ each independently represents an aryl group or an alkyl group. In formula (b-1), two of $R^{1\prime\prime}$ to $R^{3\prime\prime}$ may be bonded to each other to form a ring with the sulfur atom.

Further, among $R^{1\prime\prime}$ to $R^{3\prime\prime}$, at least one group represents an aryl group. Among $R^{1\prime\prime}$ to $R^{3\prime\prime}$, two or more groups are preferably aryl groups, and it is particularly desirable that all of $R^{1\prime\prime}$ to $R^{3\prime\prime}$ be aryl groups.

The aryl group for $R^{1\prime\prime}$ to $R^{3\prime\prime}$ is not particularly limited. For example, an aryl group having 6 to 20 carbon atoms may be used in which part or all of the hydrogen atoms of the aryl group may or may not be substituted with alkyl groups, alkoxy groups, halogen atoms or hydroxyl groups.

The aryl group is preferably an aryl group having 6 to 10 carbon atoms because it can be synthesized at a low cost. Specific examples thereof include a phenyl group and a naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

The halogen atom, with which hydrogen atoms of the aryl group may be substituted, is preferably a fluorine atom.

The alkyl group for $R^{1\prime\prime}$ to $R^{3\prime\prime}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decyl group, and a methyl group is most preferable because it is excellent in resolution and can be synthesized at a low cost.

When two of $R^{1\prime\prime}$ to $R^{3\prime\prime}$ in formula (b-1) are bonded to each other to form a ring with the sulfur atom, it is preferable that the two of $R^{1\prime\prime}$ to $R^{3\prime\prime}$ form a 3 to 10-membered ring including the sulfur atom, and it is particularly desirable that the two of $R^{1\prime\prime}$ to $R^{3\prime\prime}$ form a 5 to 7-membered ring including the sulfur atom.

When two of $R^{1\prime\prime}$ to $R^{3\prime\prime}$ in formula (b-1) are bonded to each other to form a ring with the sulfur atom, the remaining one of $R^{1\prime\prime}$ to $R^{3\prime\prime}$ is preferably an aryl group. As examples of the aryl group, the same as the above-mentioned aryl groups for $R^{1\prime\prime}$ to $R^{3\prime\prime}$ can be given.

As preferable examples of the cation moiety for the compound represented by general formula (b-1), those represented by formulas (I-1-1) to (I-1-8) shown below which have a triphenylmethane skeleton may be given.

[Chemical Formula 40.]

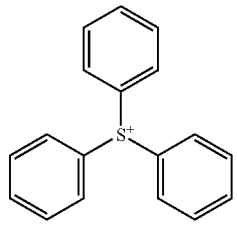
(I-1-1)

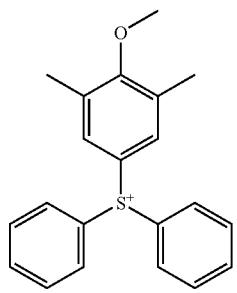
(I-1-2)

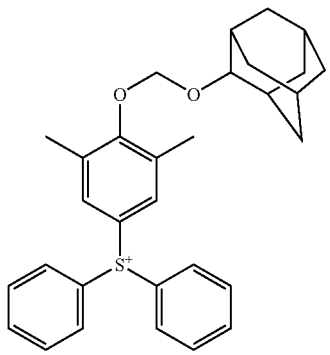
(I-1-3)

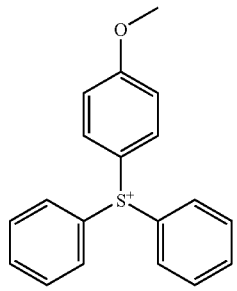
(I-1-4)

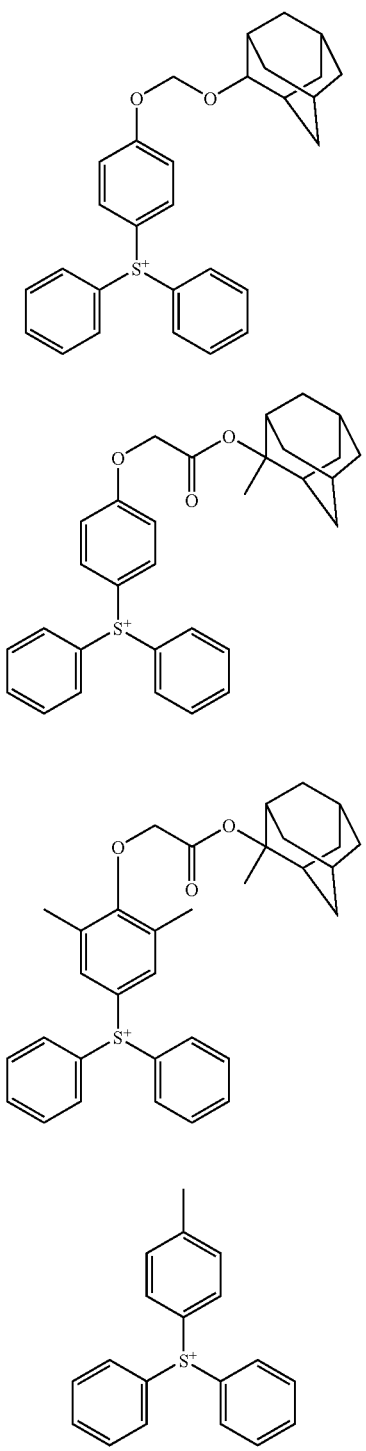

Further, as a cation moiety for an onium salt-based acid generator, any of the cations represented by formulas (I-1-9) and (I-1-10) shown below are also preferable.

In formulas (I-1-9) and (I-1-10) shown below, each of $R^{27}$ and $R^{39}$ independently represents a phenyl group or naphthyl group which may have a substituent, an alkyl group of 1 to 5 carbon atoms, an alkoxy group or a hydroxyl group.

u is an integer of 1 to 3, and most preferably 1 or 2.

[Chemical Formula 41.]

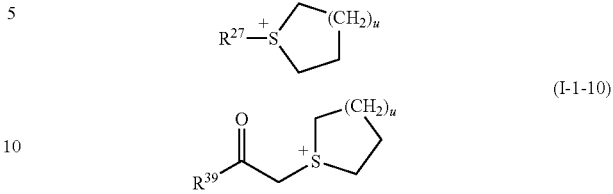

$R^{4'''}$ represents an alkyl group, a halogenated alkyl group, an aryl group or an alkenyl group which may have a substituent.

The alkyl group for $R^{4'''}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

As an example of the halogenated alkyl group for $R^{4'''}$, a group in which part of or all of the hydrogen atoms of the aforementioned linear, branched or cyclic alkyl group have been substituted with halogen atoms can be given. Examples of the aforementioned halogen atom include a fluorine atom, a chlorine atom, a bromine atom and an iodine atom, and a fluorine atom is preferable.

In the halogenated alkyl group, the percentage of the number of halogen atoms based on the total number of halogen atoms and hydrogen atoms (halogenation ratio (%)) is preferably 10 to 100%, more preferably 50 to 100%, and most preferably 100%. Higher halogenation ratios are preferable, as they result in increased acid strength.

The aryl group for $R^{4'''}$ is preferably an aryl group of 6 to 20 carbon atoms.

The alkenyl group for $R^{4'''}$ is preferably an alkenyl group of 2 to 10 carbon atoms.

With respect to $R^{4'''}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4'''}$ may have one substituent, or two or more substituents.

Examples of the substituent include a halogen atom, a hetero atom, an alkyl group, and a group represented by the formula X-$Q^1$- (in the formula, $Q^1$ represents a divalent linking group containing an oxygen atom; and X represents a hydrocarbon group of 3 to 30 carbon atoms which may have a substituent).

Examples of halogen atoms and alkyl groups as substituents for $R^{4'''}$ include the same halogen atoms and alkyl groups as those described above with respect to the halogenated alkyl group for $R^{4'''}$.

Examples of hetero atoms include an oxygen atom, a nitrogen atom, and a sulfur atom.

In the group represented by formula X-$Q^1$-, $Q^1$ represents a divalent linking group containing an oxygen atom.

$Q^1$ may contain an atom other than oxygen. Examples of atoms other than oxygen include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an amido bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group.

Specific examples of the combinations of the aforementioned non-hydrocarbon, hetero atom-containing linking groups and an alkylene group include —$R^{91}$—O—, —$R^{92}$—O—C(=O)—, —C(=O)—O—$R^{93}$—O—C(=O)— (in the formulas, each of $R^{91}$ to $R^{93}$ independently represents an alkylene group).

The alkylene group for $R^{91}$ to $R^{93}$ is preferably a linear or branched alkylene group, and preferably has 1 to 12 carbon atoms, more preferably 1 to 5, and most preferably 1 to 3.

Specific examples of alkylene groups include a methylene group [—$CH_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$—]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$—].

$Q^1$ is preferably a divalent linking group containing an ester linkage or ether linkage, and more preferably a group of —$R^{91}$—O—, —$R^{92}$—O—C(=O)— or —C(=O)—O—$R^{93}$—O—C(=O)—.

In the group represented by the formula X-$Q^1$-, the hydrocarbon group for X may be either an aromatic hydrocarbon group or an aliphatic hydrocarbon group.

The aromatic hydrocarbon group is a hydrocarbon group having an aromatic ring. The aromatic hydrocarbon ring preferably has 3 to 30 carbon atoms, more preferably 5 to 30, still more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2, and most preferably 1.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which part or all of the hydrogen atoms within the aforementioned alkyl group have been substituted with the aforementioned halogen atoms.

The aliphatic hydrocarbon group for X may be either a saturated aliphatic hydrocarbon group, or an unsaturated aliphatic hydrocarbon group. Further, the aliphatic hydrocarbon group may be linear, branched or cyclic.

In the aliphatic hydrocarbon group for X, part of the carbon atoms constituting the aliphatic hydrocarbon group may be substituted with a substituent group containing a hetero atom, or part or all of the hydrogen atoms constituting the aliphatic hydrocarbon group may be substituted with a substituent group containing a hetero atom.

As the "hetero atom" for X, there is no particular limitation as long as it is an atom other than carbon and hydrogen. Examples of hetero atoms include a halogen atom, an oxygen atom, a sulfur atom and a nitrogen atom. Examples of the halogen atom include a fluorine atom, a chlorine atom, an iodine atom and a bromine atom.

The substituent group containing a hetero atom may consist of a hetero atom, or may be a group containing a group or atom other than a hetero atom.

Specific examples of the substituent group for substituting part of the carbon atoms include —O—, —C(=O)—O—, —C(=O)—, —O—C(=O)—O—, —C(=O)—NH—, —NH— (the H may be replaced with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituent groups in the ring structure.

Examples of the substituent group for substituting part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5, still more preferably 2 to 4, and most preferably 3. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30, still more preferably 5 to 20, still more preferably 6 to 15, and most preferably 6 to 12.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L5) and (S1) to (S4) shown below.

[Chemical Formual 42.]

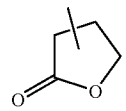
(L1)

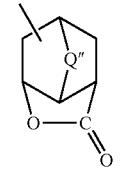
(L2)

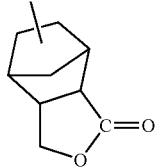
(L3)

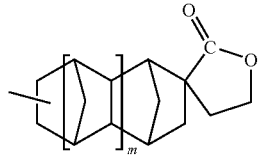
(L4)

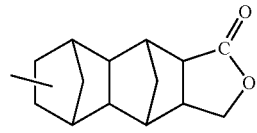
(L5)

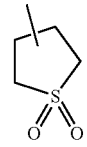
(S1)

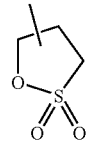
(S2)

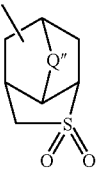
(S3)

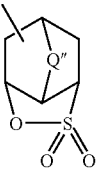
(S4)

In the formula, Q" represents an alkylene group of 1 to 5 carbon atoms, —O—, —S—, —O—R$^{94}$— or —S—R$^{95}$— (wherein each of R$^{94}$ and R$^{95}$ independently represents an alkylene group of 1 to 5 carbon atoms); and m represents 0 or 1.

As the alkylene group for Q", $R^{94}$ and $R^{95}$, the same alkylene groups as those described above for $R^{91}$ to $R^{93}$ can be used.

In these aliphatic cyclic groups, part of the hydrogen atoms bonded to the carbon atoms constituting the ring structure may be substituted with a substituent. Examples of substituents include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

As the alkoxy group and the halogen atom, the same groups as the substituent groups for substituting part or all of the hydrogen atoms can be used.

Among the examples described above, as X, a cyclic group which may have a substituent is preferable. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by formulas (L2) to (L5), (S3) and (S4) are preferable.

Further, in the present invention, it is particularly desirable that X have a polar moiety, because it results in improved lithographic properties and resist pattern shape.

Specific examples of X having a polar moiety include those in which a part of the carbon atoms constituting the aliphatic hydrocarbon group for X are substituted with a substituent group containing a hetero atom such as —O—, —C(=O)—O—, —C(=O)—, —C(=O)—NH—, —NH— (wherein H may be substituted with a substituent such as an alkyl group or an acyl group), —S—, —S(=O)$_2$— and —S(=O)$_2$—O—.

In the present invention, $R^{4\prime\prime\prime}$ preferably has X-Q$^1$- as a substituent. In such a case, $R^{4\prime\prime\prime}$ is preferably a group represented by the formula X-Q$^1$-Y$^1$— (in the formula, Q$^1$ and X are the same as defined above; and Y$^1$ represents an alkylene group of 1 to 4 carbon atoms which may have a substituent, or a fluorinated alkylene group of 1 to 4 carbon atoms which may have a substituent).

In the group represented by the formula X-Q$^1$-Y$^1$—, as the alkylene group for Y$^1$, the same alkylene group as those described above for Q$^1$ in which the number of carbon atoms is 1 to 4 can be used.

As the fluorinated alkylene group for Y$^1$, the aforementioned alkylene group in which part or all of the hydrogen atoms have been substituted with fluorine atoms can be used.

Specific examples of Y$^1$ include —CF$_2$—, —CF$_2$CF$_2$—, —CF$_2$CF$_2$CF$_2$—, —CF(CF$_3$)CF$_2$—, —CF(CF$_2$CF$_3$)—, —C(CF$_3$)$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CF(CF$_2$CF$_3$)—, —C(CF$_3$)(CF$_2$CF$_3$)—; —CHF—, —CH$_2$CF$_2$—, —CH$_2$CH$_2$CF$_2$—, —CH$_2$CF$_2$CF$_2$—, —CH(CF$_3$)CH$_2$—, —CH(CF$_2$CF$_3$)—, —C(CH$_3$)(CF$_3$)—, —CH$_2$CH$_2$CH$_2$CF$_2$—, —CH$_2$CH$_2$CF$_2$CF$_2$—, —CH(CF$_3$)CH$_2$CH$_2$—, —CH$_2$CH(CF$_3$)CH$_2$—, —CH(CF$_3$)CH(CF$_3$)—, —C(CF$_3$)$_2$CH$_2$—; —CH$_2$—, —CH$_2$CH$_2$—, —CH$_2$CH$_2$CH$_2$—, —CH(CH$_3$)CH$_2$—, —CH(CH$_2$CH$_3$)—, —C(CH$_3$)$_2$—, —CH$_2$CH$_2$CH$_2$CH$_2$—, —CH(CH$_3$)CH$_2$CH$_2$—, —CH$_2$CH(CH$_3$)CH$_2$—, —CH(CH$_3$)CH(CH$_3$)—, —C(CH$_3$)$_2$CH$_2$—, —CH(CH$_2$CH$_3$)CH$_2$—, —CH(CH$_2$CH$_2$CH$_3$)—, and —C(CH$_3$)(CH$_2$CH$_3$)—.

Y$^1$ is preferably a fluorinated alkylene group, and particularly preferably a fluorinated alkylene group in which the carbon atom bonded to the adjacent sulfur atom is fluorinated. Examples of such fluorinated alkylene groups include —CF$_2$—, —CF$_2$CF$_2$—, —CF$_2$CF$_2$CF$_2$—, —CF(CF$_3$)CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—; —CH$_2$CF$_2$—, —CH$_2$CH$_2$CF$_2$—, —CH$_2$CF$_2$CF$_2$—; —CH$_2$CH$_2$CH$_2$CF$_2$—, —CH$_2$CH$_2$CF$_2$CF$_2$—, and —CH$_2$CF$_2$CF$_2$CF$_2$—.

Of these, —CF$_2$—, —CF$_2$CF$_2$—, —CF$_2$CF$_2$CF$_2$— or CH$_2$CF$_2$CF$_2$— is preferable, —CF$_2$—, —CF$_2$CF$_2$— or —CF$_2$CF$_2$CF$_2$— is more preferable, and —CF$_2$— is particularly desirable.

The alkylene group or fluorinated alkylene group may have a substituent. The alkylene group or fluorinated alkylene group "has a substituent" means that part or all of the hydrogen atoms or fluorine atoms in the alkylene group or fluorinated alkylene group has been substituted with groups other than hydrogen atoms and fluorine atoms.

Examples of substituents which the alkylene group or fluorinated alkylene group may have include an alkyl group of 1 to 4 carbon atoms, an alkoxy group of 1 to 4 carbon atoms, and a hydroxyl group.

In formula (b-2), $R^{5\prime\prime\prime}$ and $R^{6\prime\prime\prime}$ each independently represents an aryl group or alkyl group. At least one of $R^{5\prime\prime\prime}$ and $R^{6\prime\prime\prime}$ represents an aryl group. It is preferable that both of $R^{5\prime\prime\prime}$ and $R^{6\prime\prime\prime}$ represent an aryl group.

As the aryl group for $R^{5\prime\prime\prime}$ and $R^{6\prime\prime\prime}$, the same as the aryl groups for $R^{1\prime\prime\prime}$ to $R^{3\prime\prime\prime}$ can be used.

As the alkyl group for $R^{5\prime\prime\prime}$ and $R^{6\prime\prime\prime}$, the same as the alkyl groups for $R^{1\prime\prime\prime}$ to $R^{3\prime\prime\prime}$ can be used.

It is particularly desirable that both of $R^{5\prime\prime\prime}$ and $R^{6\prime\prime\prime}$ represent a phenyl group.

As $R^{4\prime\prime\prime}$ in formula (b-2), the same groups as those mentioned above for $R^{4\prime\prime\prime}$ in formula (b-1) can be used.

Specific examples of suitable onium salt acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl) phenylsulfonium trifluoromethanesulfonate, heptafluoropropanesulfonate or nonafluorobutanesulfonate;

1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl) tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts is replaced by an alkyl sulfonate such as methanesulfonate, n-propanesulfonate, n-butanesulfonate, n-octanesulfonate, 1-adamantanesulfonate, or 2-norbornanesulfonate; or a sulfonate such as d-camphor-10-sulfonate, benzenesulfonate, perfluorobenzenesulfonate, or p-toluenesulfonate.

Furthermore, onium salts in which the anion moiety of these onium salts is replaced by an anion moiety represented by any one of formulas (b1) to (b8) shown below can also be used.

[Chemical Formula 43.]

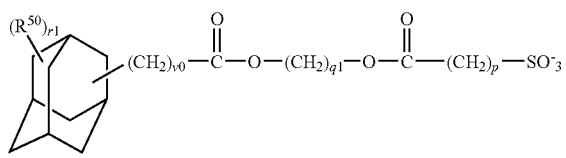
(b1)

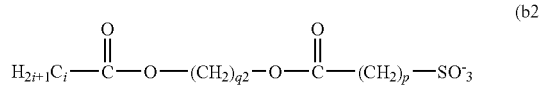
(b2)

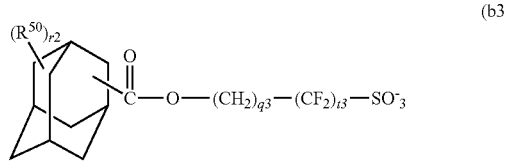
(b3)

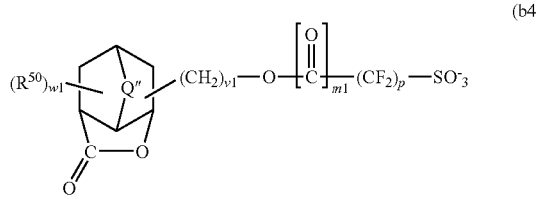
(b4)

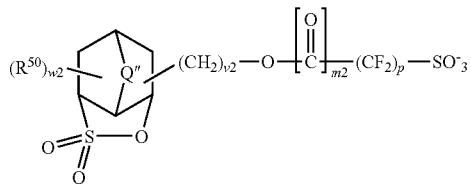
(b5)

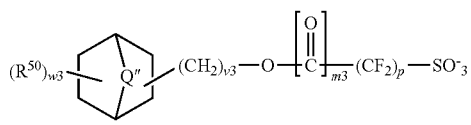
(b6)

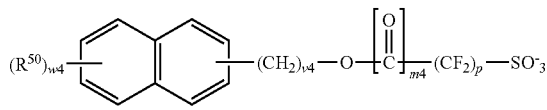
(b7)

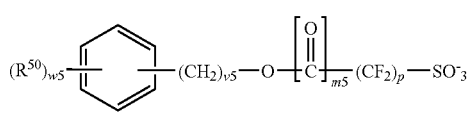
(b8)

In the formulas, p represents an integer of 1 to 3; each of q1 and q2 independently represents an integer of 1 to 5; q3 represents an integer of 1 to 12; t3 represents an integer of 1 to 3; each of r1 and r2 independently represents an integer of 0 to 3; i represents an integer of 1 to 20; $R^{50}$ represents a substituent; each of m1 to m5 independently represents 0 or 1; each of v0 to v5 independently represents an integer of 0 to 3; each of w1 to w5 independently represents an integer of 0 to 3; and Q" is the same as defined above.

As the substituent for $R^{50}$, the same groups as those which the aforementioned aliphatic hydrocarbon group or aromatic hydrocarbon group for X may have as a substituent can be used.

If there are two or more of the $R^{50}$ group, as indicated by the values r1, r2, and w1 to w5, then the two or more of the $R^{50}$ groups may be the same or different from each other.

Further, onium salt-based acid generators in which the anion moiety in general formula (b-1) or (b-2) ($R^{4'''}SO_3^-$) is replaced by an anion represented by general formula (b-3) or (b-4) shown below (the cation moiety is the same as the cation moiety in the aforementioned formula (b-1) or (b-2)) may be used.

[Chemical Formula 44.]

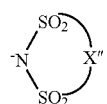
(b-3)

(b-4)

In the formulas, X" represents an alkylene group of 2 to 6 carbon atoms in which at least one hydrogen atom has been substituted with a fluorine atom; and each of Y" and Z" independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms be as large as possible because the acid strength increases and the transparency to high energy radiation of 200 nm or less or electron beam is improved.

The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

Further, an onium salt-based acid generator in which the anion moiety ($R^{4''}SO_3^-$) in general formula (b-1) or (b-2) has been replaced with $R^a$—$COO^-$ (in the formula, $R^a$ represents an alkyl group or a fluorinated alkyl group) can also be used (the cation moiety is the same as that in general formula (b-1) or (b-2)).

In the formula above, as $R^a$, the same groups as those described above for $R^{4''}$ can be used.

Specific examples of the group represented by the formula "$R^a$—$COO^-$" include a trifluoroacetic acid ion, an acetic acid ion, and a 1-adamantanecarboxylic acid ion.

Furthermore, as an onium salt-based acid generator, a sulfonium salt having a cation moiety represented by general formula (b-5) or (b-6) shown below may be used.

[Chemical Formula 45.]

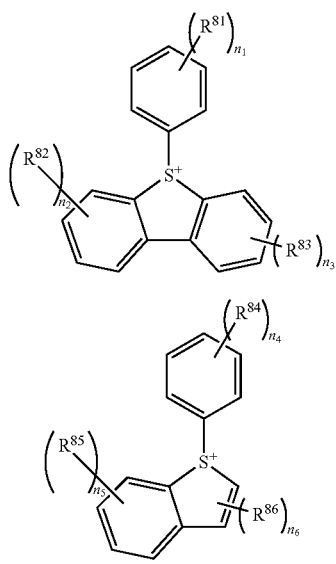

(b-5)

(b-6)

In formulas (b-5) and (b-6) above, each of $R^{81}$ to $R^{86}$ independently represents an alkyl group, an acetyl group, an alkoxy group, a carboxy group, a hydroxyl group or a hydroxyalkyl group; each of $n_1$ to $n_5$ independently represents an integer of 0 to 3; and $n_6$ represents an integer of 0 to 2.

With respect to $R^{81}$ to $R^{86}$, the alkyl group is preferably an alkyl group of 1 to 5 carbon atoms, more preferably a linear or branched alkyl group, and most preferably a methyl group, ethyl group, propyl group, isopropyl group, n-butyl group or tert butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably the aforementioned alkyl group in which one or more hydrogen atoms have been substituted with hydroxy groups, and examples thereof include a hydroxymethyl group, a hydroxyethyl group and a hydroxypropyl group.

If there are two or more of an individual $R^{81}$ to $R^{86}$ group, as indicated by the corresponding value of $n_1$ to $n_6$, then the two or more of the individual $R^{81}$ to $R^{86}$ group may be the same or different from each other.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

The anion moiety of the sulfonium salt having a cation moiety represented by general formula (b-5) or (b-6) is not particularly limited, and the same anion moieties for onium salt-based acid generators which have been proposed may be used. Examples of such anion moieties include fluorinated alkylsulfonic acid ions such as anion moieties ($R^{4''}SO_3^-$) for onium salt-based acid generators represented by general formula (b-1) or (b-2) shown above; and anion moieties represented by general formula (b-3) or (b-4) shown above.

In the present description, an oximesulfonate acid generator is a compound having at least one group represented by general formula (B-1) shown below, and has a feature of generating acid by irradiation. Such oximesulfonate acid generators are widely used for a chemically amplified resist composition, and can be appropriately selected.

[Chemical Formula 46.]

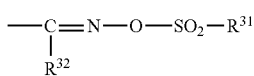

(B-1)

In the formula, each of $R^{31}$ and $R^{32}$ independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The alkyl group or the aryl group "has a substituent" means that part or all of the hydrogen atoms of the alkyl group or the aryl group are substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms and the "completely halogenated alkyl group" refers to an alkyl group in which all of the hydrogen atoms are substituted with halogen atoms. Examples of halogen atoms include fluorine atoms, chlorine atoms, bromine atoms and iodine atoms, and fluorine atoms are particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate acid generator include compounds represented by general formula (B-2) or (B-3) shown below.

[Chemical Formula 47.]

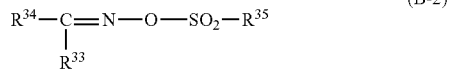

(B-2)

In the formula, $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 48.]

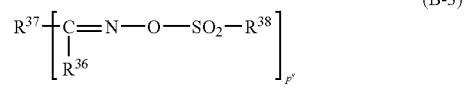

(B-3)

In the formula, $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate acid generators disclosed in Japanese Unexamined Patent Application, First Publication No. Hei 9-208554 (Chemical Formulas 18 and 19 shown in paragraphs [0012] to [0014]) and oxime sulfonate acid generators disclosed in WO 2004/074242A2 (Examples 1 to 40 described at pages 65 to 85) may be preferably used.

Furthermore, as preferable examples, the following can be used.

[Chemical Formula 49.]

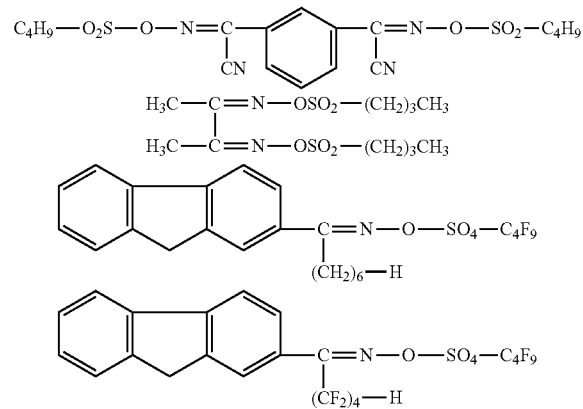

Of the aforementioned diazomethane acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be given.

As the component (B), one type of these acid generators may be used alone, or two or more types may be used in combination.

In the present invention, as the component (B), it is preferable to use an onium salt-based acid generator having a fluorinated alkylsulfonate ion as the anion moiety, and it is more preferable to an onium salt-based acid generator having a fluorinated alkylsulfonate ion in which $R^{4\prime\prime}$ in general formula (b-1) has $X-Q^1$- as a substituent.

Further, it is also preferable to use an onium salt-based acid generator having the aforementioned alkylsulfonate, benzenesulfonate, p-toluenesulfonate, d-camphor-10-sulfonate or the like as the anion moiety because they exhibit a quenching effect against the aforementioned onium salt-based acid generators having a fluorinated alkylsulfonate ion as the anion moiety. It is particularly desirable to use an onium salt-based acid generator having a fluorinated alkylsulfonate ion as the anion moiety in which $R^{4\prime\prime}$ in general formula (b-1) has $X-Q^1$- as a substituent in combination with an onium salt-based acid generator having d-camphor-10-sulfonate as the anion moiety.

In the positive resist composition of the present invention, the amount of the component (B) relative to 100 parts by weight of the component (A) is preferably 0.5 to 50 parts by weight, and more preferably 1 to 40 parts by weight. When the amount of the component (B) is within the above-mentioned range, formation of a resist pattern can be satisfactorily performed. Further, by virtue of the above-mentioned range, a uniform solution can be obtained and the storage stability becomes satisfactory.

<Component (F)>

In the present invention, the fluorine-containing polymer component (hereafter, referred to as "component (F)") contains the fluorine-containing polymer (F1) (hereafter, referred to as "component (F1)") or the fluorine-containing copolymer (F2) (hereafter, referred to as "component (F2)") described later.

[Component (F1)]

The component (F1) is a fluorine-containing polymer consisting of a structural unit (F-1) represented by general formula (F-1) shown below.

[Chemical Formula 50.]

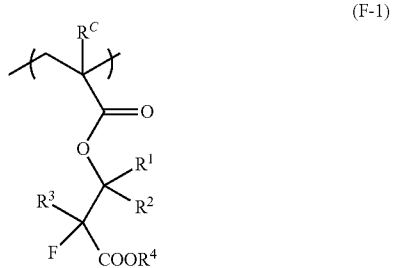

In the formula, $R^C$ represents a hydrogen atom or a methyl group; each of $R^1$ and $R^2$ independently represents a hydrogen atom, an alkyl group of 1 to 4 carbon atoms or a fluorinated alkyl group of 1 to 4 carbon atoms; $R^3$ represents a fluorine atom or a fluorinated alkyl group of 1 to 4 carbon atoms; and $R^4$ represents a linear or branched alkyl group of 1 to 4 carbon atoms or a linear fluorinated alkyl group of 1 to 4 carbon atoms.

(Structural Unit (F-1))

In general formula (F-1), $R^C$ represents a hydrogen atom or a methyl group.

In general formula (F-1), each of $R^1$ and $R^2$ independently represents a hydrogen atom, an alkyl group of 1 to 4 carbon atoms or a fluorinated alkyl group of 1 to 4 carbon atoms.

The alkyl group of 1 to 4 carbon atoms for $R^1$ and $R^2$ may be linear, branched or cyclic, and a linear or branched alkyl group is preferable. Specific examples thereof include a methyl group and an ethyl group, and an ethyl group is particularly desirable.

The fluorinated alkyl group of 1 to 4 carbon atoms for $R^1$ and $R^2$ is an alkyl group of 1 to 4 carbon atoms in which part or all of the hydrogen atoms have been substituted with a fluorine atom. In the fluorinated alkyl group, the alkyl group prior to being substituted with a fluorine atom may be linear, branched or cyclic, and examples thereof include the same groups as those described above for the "alkyl group of 1 to 4 carbon atoms for $R^1$ and $R^2$".

Among these, as $R^1$ and $R^2$, a hydrogen atom or an alkyl group of 1 to 4 carbon atoms is preferable, and it is particularly desirable that one of $R^1$ and $R^2$ represent a hydrogen atom, and the other represent an alkyl group of 1 to 4 carbon atoms.

In general formula (F-1), $R^3$ represents a fluorine atom or a fluorinated alkyl group of 1 to 4 carbon atoms.

The fluorinated alkyl group of 1 to 4 carbon atoms represented by $R^3$ is the same as defined for the "fluorinated alkyl group of 1 to 4 carbon atoms for $R^1$ and $R^2$", preferably having 1 to 3 carbon atoms, and more preferably having 1 or 2 carbon atoms.

In the fluorinated alkyl group represented by $R^3$, the percentage of the number of fluorine atoms based on the total number of hydrogen atoms and fluorine atoms (fluorination ratio (%)) is preferably 30 to 100%, and more preferably 50 to 100%. The higher the fluorination ratio, the higher the hydrophobicity of the resist film.

In general formula (F-1), $R^4$ represents a linear or branched alkyl group of 1 to 4 carbon atoms or a linear fluorinated alkyl group of 1 to 4 carbon atoms, and a linear alkyl group of 1 to 4 carbon atoms or a linear fluorinated alkyl group of 1 to 4 carbon atoms is preferable.

Specific examples of the alkyl group for $R^4$ include a methyl group, an ethyl group, a propyl group, an isopropyl group, an n-butyl group, an isobutyl group and a tert-butyl group. Among these, a methyl group or an ethyl group is preferable, and a methyl group is particularly desirable.

Specific examples of preferable fluorinated alkyl groups for $R^4$ include $-CH_2-CF_3$, $-CH_2-CF_2-CF_3$, and $-CH_2-CF_2-CF_2-CF_3$. Among these, $-CH_2-CF_3$ is particularly desirable.

Specific examples of the structural unit (F-1) are shown below.

[Chemical Formula 51.]

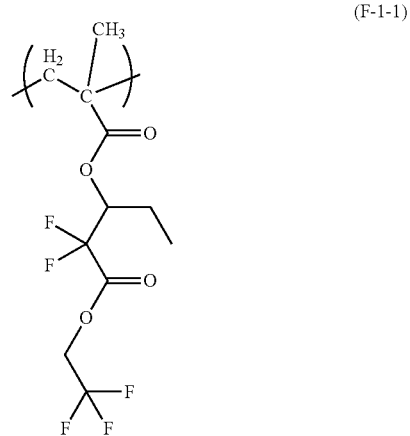

(F-1-1)

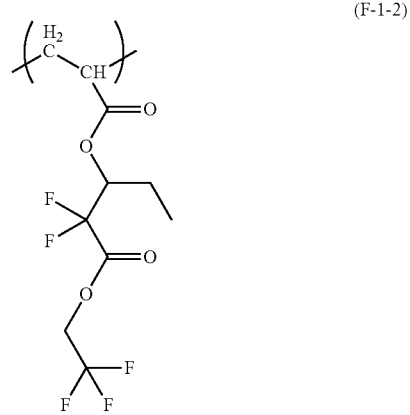

(F-1-2)

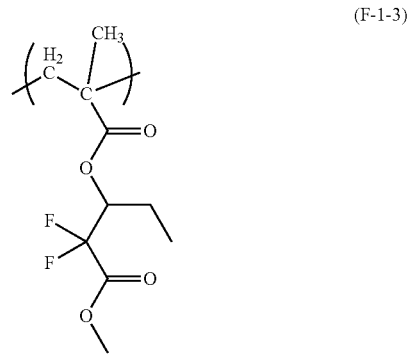

(F-1-3)

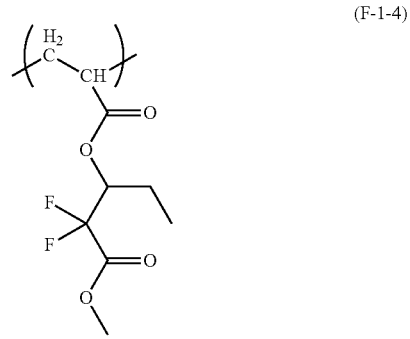

(F-1-4)

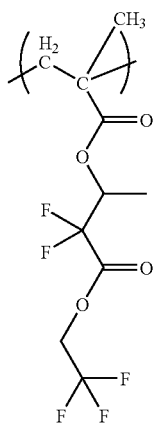

(F-1-5)

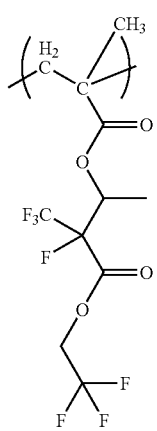

(F-1-6)

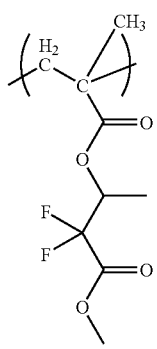

(F-1-7)

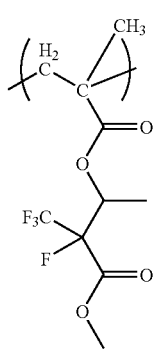

(F-1-8)

In the component (F1), as the structural unit (F-1), one type may be used alone, or two or more types may be used in combination.

It is particularly desirable that the component (F1) be a homopolymer consisting of one type of structural unit (F-1) as a recurring unit.

[Component (F2)]

The component (F2) is a fluorine-containing copolymer containing the structural unit (F-1) and at least one structural unit selected from the group consisting of a structural unit (F-2) derived from an acrylate ester containing an acid dissociable, dissolution inhibiting group and a structural unit (F-3) represented by general formula (F-3) shown below.

(Structural Unit (F-1))

In the component (F2), the structural unit (F-1) is the same as defined for the structural unit (F1) usable in the component (F1). As the structural unit (F-1), one type may be used alone, or two or more types may be used in combination.

In the component (F2), the amount of the structural unit (F-1) based on the combined total of all structural units constituting the component (F2) is preferably 20 mol % or more, more preferably 30 to 99 mol %, still more preferably 40 to 95 mol %, and most preferably 50 to 90 mol %.

When the amount of the structural unit (F-1) is at least as large as the lower limit of the above-mentioned range, the hydrophobicity of the resist film surface can be enhanced in the formation of a resist pattern. Also, the hydrophilicity of the resist film after exposure is enhanced. Furthermore, a resist film exhibiting excellent lithography properties can be obtained. On the other hand, when the amount of the structural unit (F-1) is no more than the upper limit of the above-mentioned range, a good balance can be achieved with the other structural units.

(Structural Unit (F-2))

The structural unit (F-2) is a structural unit derived from an acrylate ester containing an acid dissociable, dissolution inhibiting group.

The structural unit (F-2) is the same as defined for the structural unit (a1) in the component (A1).

As the structural unit (F-2), at least one structural unit selected from the group consisting of a structural unit represented by general formula (F-2-1) shown below and a structural unit represented by general formula (F-2-2) shown below is preferable, and a structural unit represented by general formula (F-2-1) shown below is more preferable.

[Chemical Formula 52.]

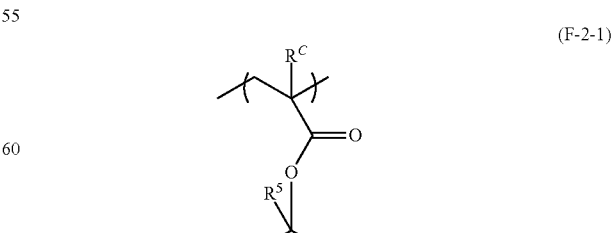

(F-2-1)

(F-2-2)

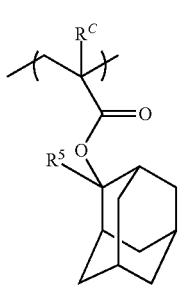

In the formulas, each $R^C$ independently represents a hydrogen atom or a methyl group; each $R^5$ independently represents an alkyl group of 1 to 5 carbon atoms; and h" represents an integer of 1 to 4.

In general formulas (F-2-1) and (F-2-2), each $R^C$ independently represents a hydrogen atom or a methyl group.

In general formulas (F-2-1) and (F-2-2), each $R^5$ independently represents an alkyl group of 1 to 5 carbon atoms. Specific examples thereof include linear or branched lower alkyl groups such as a methyl group, an ethyl group, a propyl group, an isopropyl group, an n-butyl group, an isobutyl group, a tert-butyl group, a pentyl group, an isopentyl group and a neopentyl group. Of these, a methyl group or an ethyl group is more preferable.

In general formula (F-2-1), h" represents an integer of 1 to 4.

Preferable examples of the structural unit (F-2) include structural units represented by general formulas (a1-1-1) to (a1-1-3), (a1-1-16), (a1-1-17), (a1-1-20) to (a1-1-23), (a1-1-26), (a1-1-27) and (a1-1-31) to (a1-1-33).

As the structural unit (F-2), one type of structural unit may be used alone, or two or more structural units may be used in combination.

In the component (F2), the amount of the structural unit (F-2) based on the combined total of all structural units constituting the component (F2) is preferably 5 to 80 mol %, more preferably 10 to 50 mol %, and still more preferably 10 to 40 mol %.

When the amount of the structural unit (F-2) is at least as large as the lower limit of the above-mentioned range, the hydrophobicity of the resist film surface can be further enhanced. On the other hand, when the amount of the structural unit (F-2) is no more than the upper limit of the above-mentioned range, a good balance can be achieved with the other structural units.

(Structural Unit (F-3))

The structural unit (F-3) is a structural unit represented by general formula (F-3) shown below.

[Chemical Formula 53.]

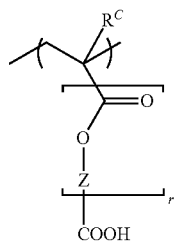

(F-3)

In the formula, $R^C$ represents a hydrogen atom or a methyl group; Z represents a single bond or a divalent linking group which may have a substituent; and r represents an integer of 0 to 2.

In general formula (F-3), $R^C$ represents a hydrogen atom or a methyl group.

In general formula (F-3), Z represents a single bond or a divalent linking group which may have a substituent.

The divalent linking group for Z may or may not have an acid dissociable portion.

An "acid dissociable portion" refers to a portion within the divalent linking group which is dissociated from the group by action of acid generated upon exposure. When Z has an acid dissociable portion, it is preferable that the acid dissociable portion have a tertiary carbon atom.

Examples of the divalent linking group for Z include a hydrocarbon group which may have a substituent and a divalent group containing a hetero atom.

A hydrocarbon "has a substituent" means that part or all of the hydrogen atoms within the hydrocarbon group are substituted with groups or atoms other than hydrogen.

The hydrocarbon group as the divalent linking group represented by Z may be either an aliphatic hydrocarbon group or an aromatic hydrocarbon group.

An "aliphatic hydrocarbon group" refers to a hydrocarbon group that has no aromaticity. The aliphatic hydrocarbon group may be either saturated or unsaturated, but in general, the aliphatic hydrocarbon group is preferably saturated.

Specific examples of the aliphatic hydrocarbon group include a linear or branched aliphatic hydrocarbon group and an aliphatic hydrocarbon group containing a ring in the structure thereof.

The linear or branched aliphatic hydrocarbon group preferably has 1 to 10 carbon atoms, more preferably 1 to 8, still more preferably 1 to 5, and most preferably 1 or 2.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferred, and specific examples include various alkylalkylene groups, including alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, and —C($CH_2CH_3$)$_2$—; alkylethylene groups such as —CH($CH_3$)$CH_2$—, —CH($CH_3$)CH($CH_3$)—, —C($CH_3$)$_2CH_2$—, —CH($CH_2CH_3$)$CH_2$—, and —C($CH_2CH_3$)$_2$—$CH_2$—; alkyltrimethylene groups such as —CH($CH_3$)$CH_2CH_2$—, and —$CH_2$CH($CH_3$)$CH_2$—; and alkyltetramethylene groups such as —CH($CH_3$)$CH_2CH_2CH_2$—, and —$CH_2$CH($CH_3$)$CH_2CH_2$—. As the alkyl group within the alkylalkylene group, a linear alkyl group of 1 to 5 carbon atoms is preferable.

The linear or branched aliphatic hydrocarbon group (hereafter, referred to as "chain-like aliphatic hydrocarbon group") may or may not have a substituent. Examples of the substituent include a fluorine atom, a fluorinated alkyl group of 1 to 5 carbon atoms and an oxygen atom (═O).

As examples of the hydrocarbon group containing a ring in the structure thereof, a cyclic aliphatic hydrocarbon group (a group in which two or more hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two or more hydrogen atoms have been removed from a monocycloalkane of 3 to 6 carbon atoms is preferable. Examples of the monocycloalkane include cyclopentane and cyclohexane. As the polycyclic group, a group in which two or more hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

With respect to the divalent linking group for Z containing a hetero atom, a hetero atom is an atom other than carbon and hydrogen, and examples thereof include an oxygen atom, a nitrogen atom, a sulfur atom and a halogen atom.

The divalent group containing a hetero atom may be a group consisting of a hetero atom, or a group containing a hetero atom and an atom other than hetero atoms. Specific examples thereof include —O—, —C(=O)—, —C(=O)—O—, a carbonate bond (—O—C(=O)—O—), —NH—, —NR$^{05}$— (R$^{05}$ represents an alkyl group), —NH—C(=O)— and =N— (hereafter, these specific examples are referred to as "the aforementioned groups").

Further, a combination of "the aforementioned groups" with a divalent hydrocarbon group can also be used. As examples of the divalent hydrocarbon group, the same groups as those described above for the hydrocarbon group which may have a substituent can be given, and a linear or branched aliphatic hydrocarbon group is preferable.

In general formula (F-3), r represents 0 to 2, preferably 0 or 1, and most preferably 0.

As the structural unit (F-3), at least one structural unit selected from the group consisting of structural units represented by general formula (F-3-1) shown below, structural units represented by general formula (F-3-2) shown below and structural units represented by general formula (F-3-3) shown below is preferable, and a structural unit represented by general formula (F-3-3) shown below is more preferable.

[Chemical Formula 54.]

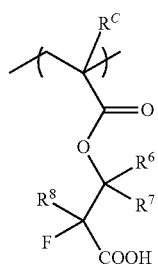

(F-3-1)

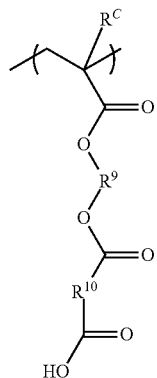

(F-3-2)

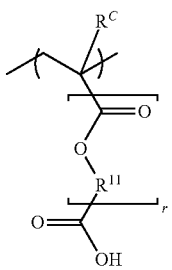

(F-3-3)

In the formulas, each R$^C$ independently represents a hydrogen atom or a methyl group; each of R$^6$ and R$^7$ independently represents a hydrogen atom, an alkyl group of 1 to 4 carbon atoms or a fluorinated alkyl group of 1 to 4 carbon atoms; R$^8$ represents a fluorine atom or a fluorinated alkyl group of 1 to 4 carbon atoms; each of R$^9$ to R" independently represents an alkylene group of 1 to 12 carbon atoms; and r represents an integer of 0 to 2.

In the formulas above, each R$^C$ independently represents a hydrogen atom or a methyl group.

In general formula (F-3-1), each of R$^6$ and R$^7$ independently represents a hydrogen atom, an alkyl group of 1 to 4 carbon atoms or a fluorinated alkyl group of 1 to 4 carbon atoms. R$^6$ and R$^7$ are the same as defined for R$^1$ and R$^2$ in general formula (F-1).

In general formula (F-3-1), R$^8$ represents a fluorine atom or a fluorinated alkyl group of 1 to 4 carbon atoms. R$^8$ is the same as defined for R$^3$ in general formula (F-1).

In general formula (F-3-2), each of R$^9$ and R$^{10}$ independently represents an alkylene group of 1 to 12 carbon atoms, preferably an alkylene group of 1 to 5 carbon atoms, more preferably an alkylene group of 1 to 3 carbon atoms, and still more preferably an alkylene group of 2 carbon atoms (an ethylene group). It is particularly desirable that both R$^9$ and R$^{10}$ be an ethylene group.

In general formula (F-3-3), R$^{11}$ represents an alkylene group of 1 to 12 carbon atoms, preferably an alkylene group of 1 to 5 carbon atoms, more preferably an alkylene group of 1 to 4 carbon atoms, and still more preferably an alkylene group of 1 to 3 carbon atoms.

In general formula (F-3-3), r represents 0 to 2, preferably 0 or 1, and most preferably 0.

Specific examples of the structural unit (F-3) are shown below.
[Chemical Formula 55.]
(F-3-11)
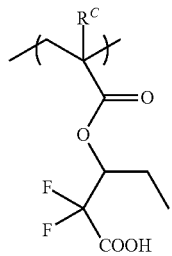
(F-3-12)
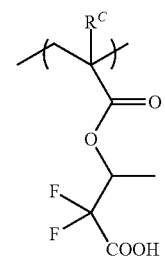
(F-3-13)
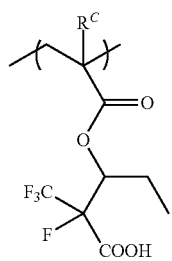
(F-3-14)
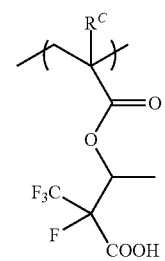
[Chemical Formula 56.]
(F-3-21)
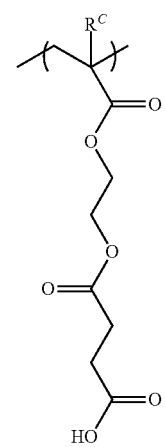
(F-3-22)
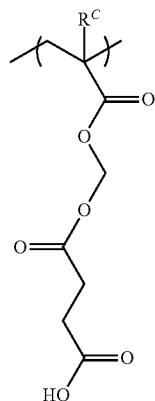
(F-3-23)
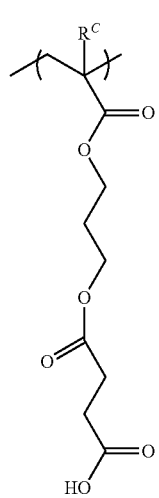
(F-3-24)
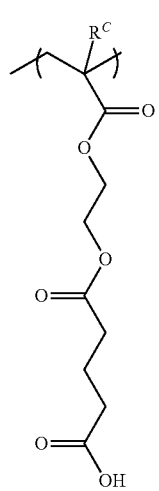
[Chemical Formula 57.]
(F-3-31)
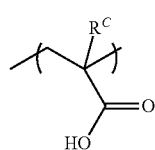

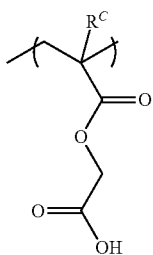

(F-3-32)

As the structural unit (F-3), one type of structural unit may be used alone, or two or more structural units may be used in combination.

In the component (F2), the amount of the structural unit (F-3) based on the combined total of all structural units constituting the component (F2) is preferably 1 to 40 mol %, more preferably 5 to 30 mol %, and still more preferably 10 to 20 mol %.

When the amount of the structural unit (F-3) is at least as large as the lower limit of the above-mentioned range, the effect of suppressing generation of defects can be improved. On the other hand, when the amount of the structural unit (F-3) is no more than the upper limit of the above-mentioned range, a good balance can be achieved with the other structural units.

(Other Structural Units)

The component (F2) may include a structural unit other than the structural units (F-1) to (F-3), as long as the effects of the present invention are not impaired.

Such a structural unit is not particularly limited, and a structural unit derived from a compound copolymerizable with compounds from which the structural units (F-1) to (F-3) are derived can be preferably used.

Specific examples of such structural units include the aforementioned structural units (a2) to (a4) for the component (A1); and at least one structural unit selected from the group consisting of structural units represented by general formula (F-4-2) shown below and structural units represented by general formula (F-4-2) shown below (hereafter, these structural units are collectively referred to as "structural unit (F-4)").

[Chemical Formula 58.]

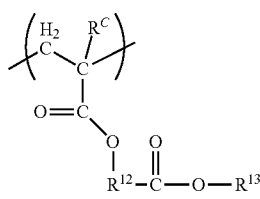

(F-4-1)

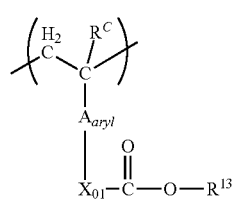

(F-4-2)

In the formulas, each $R^C$ independently represents a hydrogen atom or a methyl group; and each $R^{13}$ independently represents a linear or branched alkyl group of 1 to 4 carbon atoms or a linear fluorinated alkyl group of 1 to 4 carbon atoms. In general formula (F-4-1), $R^{12}$ represents a divalent organic group. In general formula (F-4-2), $A_{aryl}$ represents a divalent aromatic cyclic group which may have a substituent, and $X_{01}$ represents a single bond or a divalent linking group, provided that $R^{12}$, $A_{aryl}$ and $X_{01}$ has no fluorine atom.

In general formulas (F-4-1) and (F-4-2), each $R^C$ independently represents a hydrogen atom or a methyl group.

In general formulas (F-4-1) and (F-4-2), each $R^{13}$ independently represents a linear or branched alkyl group of 1 to 4 carbon atoms or a linear fluorinated alkyl group of 1 to 4 carbon atoms, and is the same as defined for $R^4$ in general formula (F-1).

In general formulas (F-4-1) and (F-4-2), $R^{13}$ preferably represents a linear fluorinated alkyl group of 1 to 4 carbon atoms, more preferably —$CH_2$—$CF_3$, —$CH_2$—$CF_2$—$CF_3$ or —$CH_2$—$CF_2$—$CF_2$—$CF_3$, and most preferably —$CH_2$—$CF_3$ or —$CH_2$—$CF_2$—$CF_3$.

In general formula (F-4-1), $R^{12}$ represents a divalent organic group, and is the same as defined for the "divalent group" represented by Z in general formula (F-3).

As $R^{12}$, a hydrocarbon group which may have a substituent is preferable, an aliphatic hydrocarbon group which may have a substituent is more preferable, a linear or branched aliphatic hydrocarbon group is still more preferable, and a linear alkylene group is most preferable.

In general formula (F-4-2), $A_{aryl}$ represents a divalent aromatic cyclic group which may have a substituent. A specific example of $A_{aryl}$ includes an aromatic hydrocarbon ring (which may have a substituent) having two hydrogen atoms removed therefrom.

The ring skeleton of the aromatic cyclic group for $A_{aryl}$ preferably has 6 to 15 carbon atoms. Examples of the ring skeleton include a benzene ring, a naphthalene ring, a phenanthrene ring and an anthracene ring. Among these, a benzene ring or a naphthalene ring is particularly desirable.

Examples of the substituent for the aromatic cyclic group represented by $A_{aryl}$ include a halogen atom, an alkyl group, an alkoxy group, a halogenated lower alkyl group and an oxygen atom (=O). Examples of the halogen atom include a chlorine atom, an iodine atom and a bromine atom.

$A_{aryl}$ may be either an aromatic cyclic group having no substituent, or an aromatic cyclic group having a substituent, although an aromatic cyclic group having no substituent is preferable.

When $A_{aryl}$ represents an aromatic cyclic group having a substituent, the number of the substituent may be either 1 or at least 2, preferably 1 or 2, and more preferably 1.

In general formula (F-4-2), $X_{01}$ represents a single bond or a divalent linking group.

Examples of divalent linking group for $X_{01}$ include an alkylene group of 1 to 10 carbon atoms, —O—, —C(=O)—, —C(=O)—O—, a carbonate bond (—O—C(=O)—O—), —NH—C(=O)—, and a combination of these groups, and a combination of —O— with an alkylene group of 1 to 10 carbon atoms is particularly desirable.

Examples of alkylene groups of 1 to 10 carbon atoms include linear, branched or cyclic alkylene groups, and a linear or branched alkylene group of 1 to 5 carbon atoms and a cyclic alkylene group of 4 to 10 carbon atoms are preferable.

Among structural units represented by the aforementioned general formula (F-4-1), structural units represented by general formulas (F-4-11) to (F-4-16) shown below are preferable.

Further, among structural units represented by the aforementioned general formula (F-4-2), structural units represented by general formulas (F-4-21) to (F-4-26) shown below are preferable.
[Chemical Formula 59.]
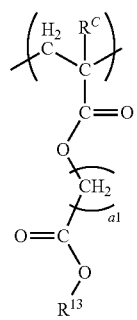
(F-4-11)
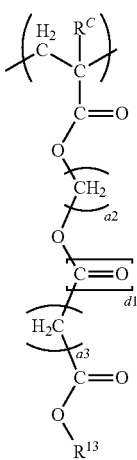
(F-4-12)
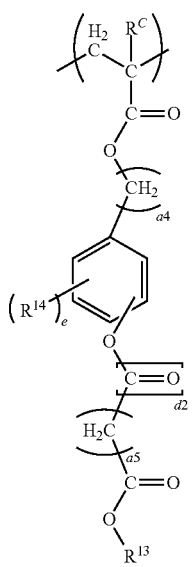
(F-4-13)
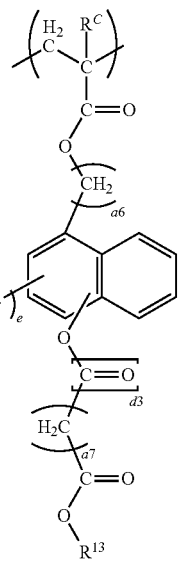
(F-4-14)
[Chemical Formula 60.]
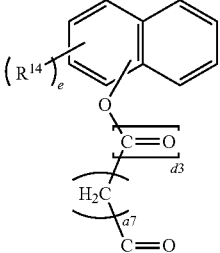
(F-4-15)
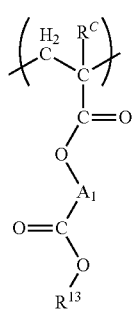
(F-4-16)

-continued

[Chemical Formula 61.]

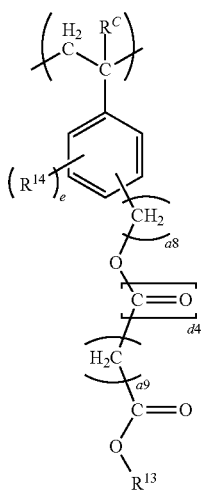

(F-4-21)

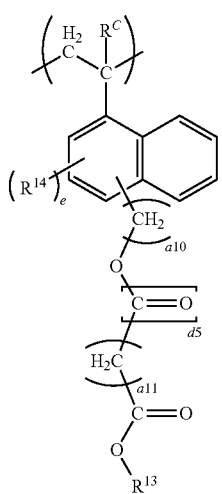

(F-4-22)

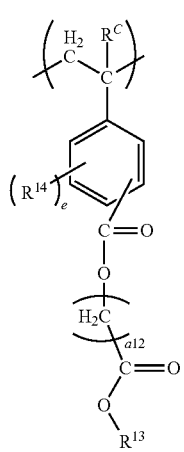

(F-4-23)

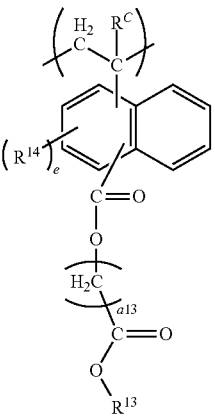

(F-4-24)

[Chemical Formula 62.]

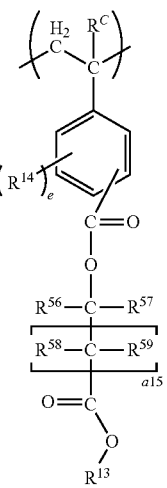

(F-4-25)

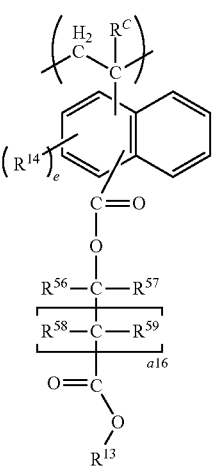

(F-4-26)

In general formulas (F-4-11) to (F-4-16) and (F-4-21) to (F-4-26), $R^C$ and $R^{13}$ are the same as defined above; each of $R^{56}$ and $R^{57}$ independently represents an alkyl group of 1 to 10 carbon atoms; each of $R^{58}$ and $R^{59}$ independently represents a hydrogen atom or an alkyl group of 1 to 10 carbon atoms; each of a1, a2, a3, a5, a7 a9 and a11 to a13 independently represents an integer of 1 to 5; each of a4, a6, a8 and a10 independently represents an integer of 0 to 5; each of a14 to a16 independently represents an integer of 1 to 5; each of d1 to d5 independently represents 0 or 1; $R^{14}$ represents a substituent; e represents an integer of 0 to 2; and $A_1$ represents a cyclic alkylene group of 4 to 20 carbon atoms.

In general formulas (F-4-11) to (F-4-16) and (F-4-21) to (F-4-26), $R^C$ represents a hydrogen atom or a methyl group.

In general formula (F-4-11), a1 is preferably an integer of 1 to 3, more preferably 1 or 2.

In formula (F-4-12), it is preferable that each of a2 and a3 independently represent an integer of 1 to 3, and more preferably 1 or 2.

d1 is preferably 0.

In formula (F-4-13), a4 is preferably an integer of 0 to 3, more preferably an integer of 0 to 2, and most preferably 0 or 1.

a5 is preferably an integer of 1 to 3, and more preferably 1 or 2.

Examples of the substituent for $R^{14}$ include a halogen atom, a lower alkyl group, an alkoxy group of 1 to 5 carbon atoms, a halogenated lower alkyl group, and an oxygen atom (=O). As the lower alkyl group, the same lower alkyl groups as those described above for R can be mentioned. Examples of the halogen atom include a fluorine atom, a chlorine atom, an iodine atom and a bromine atom. As the halogenated lower alkyl group, the same halogenated lower alkyl groups as those described above for R can be mentioned.

e is preferably 0 or 1, and most preferably 0 from an industrial viewpoint.

d2 is preferably 0.

In formula (F-4-14), a6 is preferably an integer of 0 to 3, more preferably an integer of 0 to 2, and most preferably 0 or 1.

a7 is preferably an integer of 1 to 3, and more preferably 1 or 2.

d3 is preferably 0.

$R^{14}$ and e are the same as defined above.

In formula (F-4-15), a14 is preferably an integer of 0 to 3, more preferably an integer of 0 to 2, and most preferably 0 or 1.

It is preferable that each of $R^{56}$ and $R^{57}$ independently represent a linear, branched or cyclic alkyl group of 1 to 10 carbon atoms, and specific examples thereof include a methyl group, an ethyl group, an n-propyl group, an isopropyl group, an n-butyl group, an isobutyl group, a tert-butyl group, a tert-pentyl group, a cyclopentyl group, a cyclohexyl group, a cyclooctyl group, a norbornyl group, an isobornyl group, a tricyclodecyl group, an adamantyl group and a tetracyclododecyl group. Of these, an alkyl group of 1 to 6 carbon atoms is preferable, more preferably an alkyl group of 1 to 4 carbon atoms, and most preferably a methyl group or an ethyl group.

It is preferable that each of $R^{58}$ and $R^{59}$ independently represent a hydrogen atom, or a linear, branched or cyclic alkyl group of 1 to 10 carbon atoms. For $R^{58}$ and $R^{59}$, the linear, branched or cyclic alkyl group of 1 to 10 carbon atoms is the same as defined above for $R^{56}$ and $R^{57}$.

In formula (F-4-16), $A_1$ represents a cyclic alkylene group of 4 to 20 carbon atoms, and is preferably a cyclic alkylene group of 5 to 15 carbon atoms, and more preferably a cyclic alkylene group of 6 to 12 carbon atoms. Specific examples of the cyclic alkylene group include those described above as the "cyclic aliphatic hydrocarbon group" for the aforementioned hydrocarbon group which may have a substituent, and the cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of the substituent include a lower alkyl group of 1 to 5 carbon atoms, a fluorine atom, a fluorinated lower alkyl group of 1 to 5 carbon atoms, and an oxygen atom (=O).

In formula (F-4-21), a8 is preferably an integer of 0 to 3, more preferably an integer of 0 to 2, and most preferably 0 or 1.

a9 is preferably an integer of 1 to 3, and more preferably 1 or 2.

d4 is preferably 0.

$R^{14}$ and e are the same as defined above.

In formula (F-4-22), a10 is preferably an integer of 0 to 3, more preferably an integer of 0 to 2, and most preferably 0 or 1.

a11 is preferably an integer of 1 to 3, and more preferably 1 or 2.

d5 is preferably 0.

$R^{14}$ and e are the same as defined above.

In formula (F-4-23), a12 is preferably an integer of 1 to 3, and more preferably 1 or 2.

$R^{14}$ and e are the same as defined above.

In formula (F-4-24), a13 is preferably an integer of 1 to 3, and more preferably 1 or 2.

$R^{14}$ and e are the same as defined above.

In formulas (F-4-25) and (F-4-26), each of a15 and a16 is preferably an integer of 0 to 3, more preferably an integer of 0 to 2, and most preferably 0 or 1.

$R^{56}$, $R^{57}$, $R^{58}$ and $R^{59}$ are the same as defined above.

In general formulas (F-4-25) and (F-4-26), $R^{14}$ and e are the same as defined above.

Specific examples of structural units represented by the above general formulas (F-4-11) to (F-4-16) and (F-4-21) to (F-4-26) are shown below.

In the formulas, $R^C$ represents a hydrogen atom or a methyl group.

[Chemical Formula 63.]

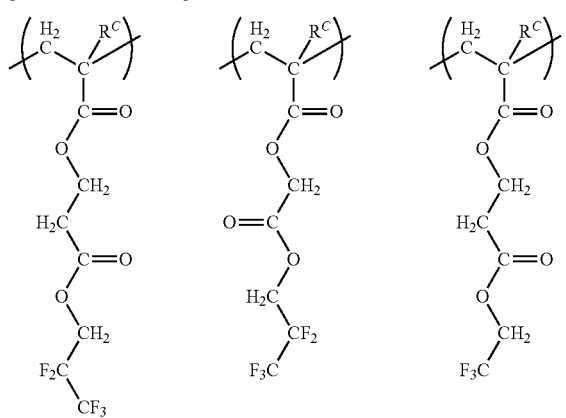

111
-continued
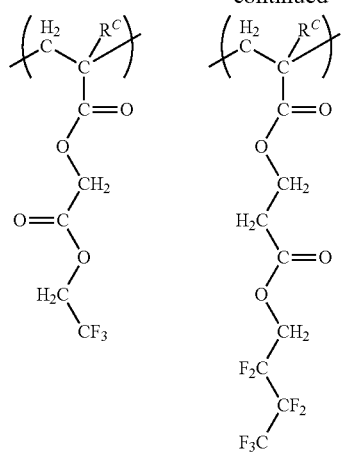
[Chemical Formula 64.]
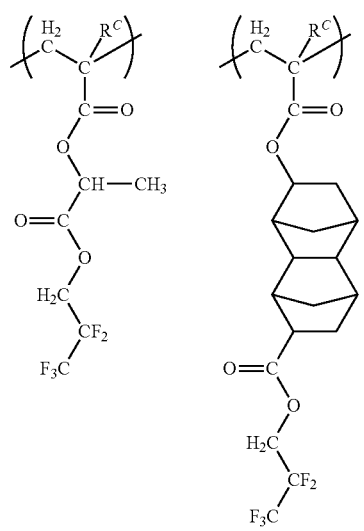
[Chemical Formula 65.]
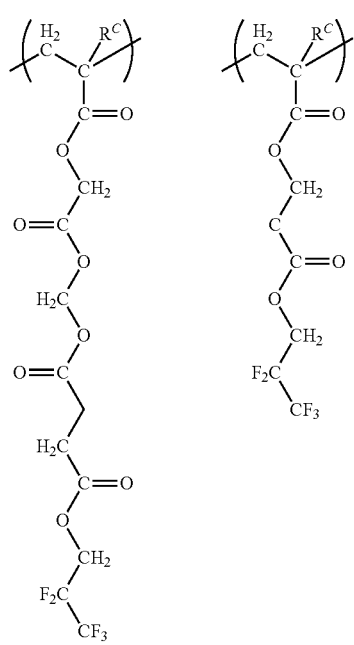
112
-continued
[Chemical Formula 66.]
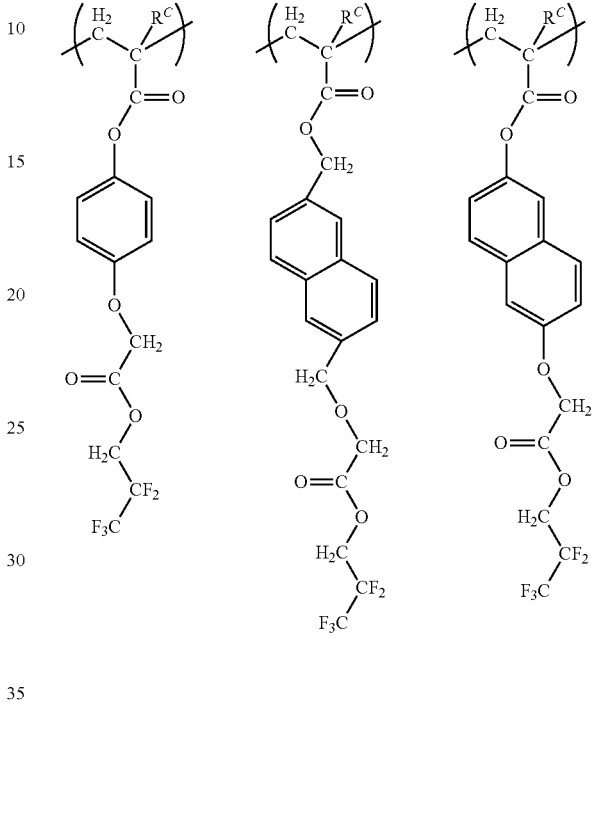
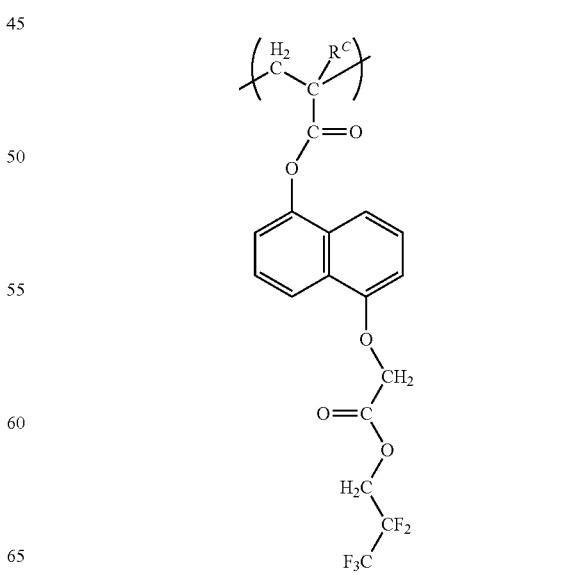

[Chemical Formula 67.]

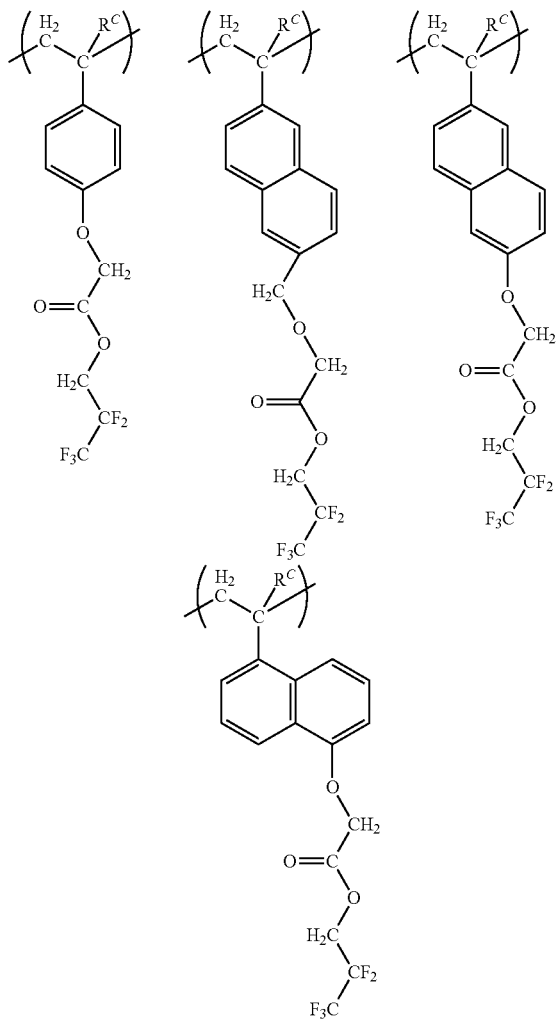

As the structural unit (F-4), at least one structural unit selected from the group consisting of structural units represented by the aforementioned general formulas (F-4-11) to (F-4-16) and (F-4-21) to (F-4-26) is preferable, at least one structural unit selected from the group consisting of structural units represented by the aforementioned general formulas (F-4-11) to (F-4-14) and (F-4-21) to (F-4-24) is more preferable, at least one structural unit selected from the group consisting of structural units represented by the aforementioned general formulas (F-4-11) to (F-4-13), (F-4-21) and (F-4-22) is still more preferable, and at least one structural unit selected from the group consisting of structural units represented by the aforementioned general formulas (F-4-11) and (F-4-22) is most preferable.

For example, when the structural unit (F-4) is used, as the structural unit (F-4), one type of structural unit may be used alone, or two or more types of structural units may be used in combination.

In such a case, in the component (F2), the amount of the structural unit (F-4) based on the combined total of all structural units constituting the component (F2) is preferably 1 to 80 mol %, more preferably 5 to 70 mol %, and still more preferably 10 to 60 mol %.

When the amount of the structural unit (F-4) is at least as large as the lower limit of the above-mentioned range, a high hydrophobicity can be achieved during formation of a resist pattern, and a resist film exhibiting excellent lithography properties can be obtained. On the other hand, when the amount of the structural unit (F-4) is no more than the upper limit of the above-mentioned range, a good balance can be achieved with the other structural units.

In the component (F), as the component (F1) or the component (F2), one type may be used alone, or two or more types may be used in combination.

In the present invention, preferable examples of the component (F) include a polymer (homopolymer) consisting of the structural unit (F-1) as a recurring unit; a copolymer having the structural unit (F-1) and the structural unit (F-2); a copolymer having the structural unit (F-1) and the structural unit (F-3); a copolymer having the structural unit (F-1), the structural unit (F-2) and the structural unit (F-3); and a copolymer having the structural unit (F-1) and the structural unit (F-4).

As the component (F), a fluorine-containing polymer having a structural unit shown below is particularly desirable.

[Chemcial Formula 68.]

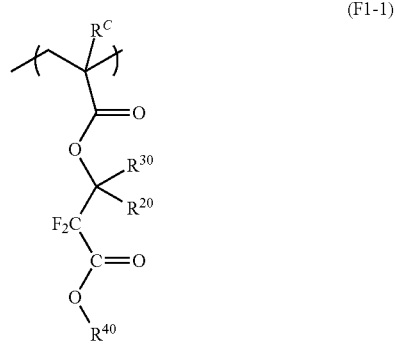

(F1-1)

In formula (F1-1), $R^C$ represents a hydrogen atom or a methyl group; each of $R^{20}$ and $R^{30}$ independently represents a hydrogen atom or an alkyl group of 1 to 4 carbon atoms; and $R^{40}$ represents a linear fluorinated alkyl group of 1 to 4 carbon atoms.

The fluorine-containing polymer having the structural unit represented by formula (F1-1) is a homopolymer consisting of the structural unit represented by (F1-1) as a recurring unit.

In formula (F1-1), $R^C$ represents a hydrogen atom or a methyl group.

Each of $R^{20}$ and $R^{30}$ independently represents a hydrogen atom or an alkyl group of 1 to 4 carbon atoms. The alkyl group of 1 to 4 carbon atoms for $R^{20}$ and $R^{30}$ is preferably a methyl group or an ethyl group, and an ethyl group is particularly desirable. It is preferable that one of $R^{20}$ and $R^{30}$ be a hydrogen atom, and the other be an alkyl group of 1 to 4 carbon atoms.

$R^{40}$ represents a linear fluorinated alkyl group of 1 to 4 carbon atoms, and —$CH_2$—$CF_3$ is particularly desirable.

[Chemical Formula 69.]

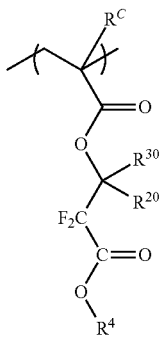

(F2-1)

In formula (F2-1), $R^C$ represents a hydrogen atom or a methyl group, wherein the plurality of the $R^C$ groups may be the same or different from each other; each of $R^{20}$ and $R^{30}$ independently represents a hydrogen atom or an alkyl group of 1 to 4 carbon atoms; $R^4$ represents a linear or branched alkyl group of 1 to 4 carbon atoms or a linear fluorinated alkyl group of 1 to 4 carbon atoms; $R^5$ represents an alkyl group of 1 to 5 carbon atoms; and h" represents an integer of 1 to 4 carbon atoms.

In formula (F2-1), $R^C$ represents a hydrogen atom or a methyl group, and the plurality of the $R^C$ groups may be the same or different from each other.

Each of $R^{20}$ and $R^{30}$ independently represents a hydrogen atom or an alkyl group of 1 to 4 carbon atoms, and are respectively the same as defined for $R^{20}$ and $R^{30}$ in the aforementioned formula (F1-1).

$R^4$ represents a linear or branched alkyl group of 1 to 4 carbon atoms or a linear fluorinated alkyl group of 1 to 4 carbon atoms, and is the same as defined for $R^4$ in the aforementioned formula (F-1).

$R^5$ represents an alkyl group of 1 to 5 carbon atoms, and h" represents an integer of 1 to 4, which are respectively the same as defined for $R^5$ and h" in the aforementioned formula (F-2-1).

[Chemical Formula 70.]

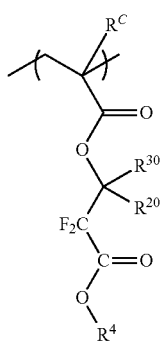

(F2-2)

In formula (F2-2), $R^C$ represents a hydrogen atom or a methyl group, wherein the plurality of the $R^C$ groups may be the same or different from each other; each of $R^{20}$ and $R^{30}$ independently represents a hydrogen atom or an alkyl group of 1 to 4 carbon atoms; and $R^4$ represents a linear or branched alkyl group of 1 to 4 carbon atoms or a linear fluorinated alkyl group of 1 to 4 carbon atoms.

In formula (F2-2), $R^C$ represents a hydrogen atom or a methyl group, and the plurality of the $R^C$ groups may be the same or different from each other.

Each of $R^{20}$ and $R^{30}$ independently represents a hydrogen atom or an alkyl group of 1 to 4 carbon atoms, and are respectively the same as defined for $R^{20}$ and $R^{30}$ in the aforementioned formula (F1-1).

$R^4$ represents a linear or branched alkyl group of 1 to 4 carbon atoms or a linear fluorinated alkyl group of 1 to 4 carbon atoms, and is the same as defined for $R^4$ in the aforementioned formula (F-1).

[Chemical Formula 71.]

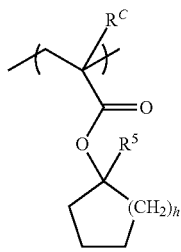

(F2-3)

In formula (F2-3), $R^C$ represents a hydrogen atom or a methyl group, wherein the plurality of the $R^C$ groups may be the same or different from each other; each of $R^{20}$ and $R^{30}$ independently represents a hydrogen atom or an alkyl group of 1 to 4 carbon atoms; $R^4$ represents a linear or branched alkyl group of 1 to 4 carbon atoms or a linear fluorinated alkyl group of 1 to 4 carbon atoms; $R^5$ represents an alkyl group of 1 to 5 carbon atoms; and h" represents an integer of 1 to 4 carbon atoms.

In formula (F2-3), $R^C$ represents a hydrogen atom or a methyl group, and the plurality of the $R^C$ groups may be the same or different from each other.

Each of $R^{20}$ and $R^{30}$ independently represents a hydrogen atom or an alkyl group of 1 to 4 carbon atoms, and are respectively the same as defined for $R^{20}$ and $R^{30}$ in the aforementioned formula (F1-1).

$R^4$ represents a linear or branched alkyl group of 1 to 4 carbon atoms or a linear fluorinated alkyl group of 1 to 4 carbon atoms, and is the same as defined for $R^4$ in the aforementioned formula (F-1).

$R^5$ represents an alkyl group of 1 to 5 carbon atoms, and h" represents an integer of 1 to 4, which are respectively the same as defined for $R^5$ and h" in the aforementioned formula (F-2-1).

[Chemical Formula 72.]

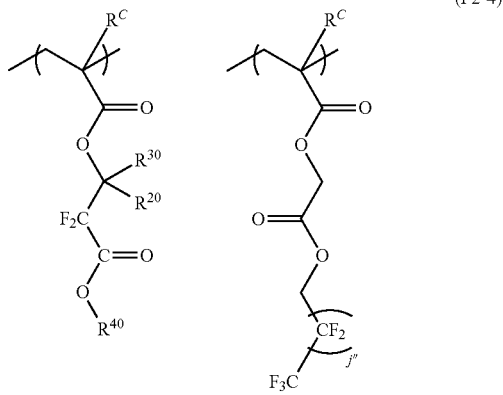

(F2-4)

In formula (F2-4), $R^C$ represents a hydrogen atom or a methyl group, wherein the plurality of the $R^C$ groups may be the same or different from each other; each of $R^{20}$ and $R^{30}$ independently represents a hydrogen atom or an alkyl group of 1 to 4 carbon atoms; $R^{40}$ represents a linear or branched alkyl group of 1 to 4 carbon atoms; and j" represents an integer of 0 to 3.

In formula (F2-4), $R^C$ represents a hydrogen atom or a methyl group, and the plurality of the $R^C$ groups may be the same or different from each other.

Each of $R^{20}$ and $R^{30}$ independently represents a hydrogen atom or an alkyl group of 1 to 4 carbon atoms, and are respectively the same as defined for $R^{20}$ and $R^{30}$ in the aforementioned formula (F1-1).

$R^{40}$ represents a linear or branched alkyl group of 1 to 4 carbon atoms, and is the same as defined for the "alkyl group represented by $R^{4}$" explained above in relation to $R^4$ in the aforementioned formula (F-1).

j" represents an integer of 0 to 3, preferably 0 to 2, and most preferably 0 or 1.

The component (F) can be obtained, for example, by a conventional radical polymerization or the like of the monomers corresponding with the desired structural units, using a radical polymerization initiator such as azobisisobutyronitrile (AIBN) or dimethyl 2,2'-azobis(isobutyrate).

The weight-average-molecular-weight (Mw) (the polystyrene equivalent value determined by gel permeation chromatography) of the component (F) is not particularly limited, but is preferably 2,000 to 100,000, more preferably 3,000 to 100,000, still more preferably 4,000 to 50,000, and most preferably 5,000 to 50,000.

When the weight-average-molecular-weight is no more than the upper limit of the above-mentioned range, the component exhibits a satisfactory solubility in a resist solvent. On the other hand, when the weight-average-molecular-weight is at least as large as the lower limit of the above-mentioned range, dry etching resistance and the cross-sectional shape of the resist pattern becomes satisfactory.

Further, the dispersity (Mw/Mn) is preferably 1.0 to 5.0, more preferably 1.0 to 3.0, and most preferably 1.2 to 2.8.

In the positive resist composition of the present invention, the amount of the component (F) relative to 100 parts by weight of the component (A) is in the range of 0.1 to 20 parts by weight, preferably 1 to 10 parts by weight, and more preferably 1 to 5 parts by weight. When the amount of the component (F) is at least as large as the lower limit of the above-mentioned range, the hydrophobicity of the resist film formed using the positive resist composition is improved.

Further, generation of defects can be suppressed. Furthermore, a favorable hydrophobicity suitable for immersion lithography can be achieved. On the other hand, when the amount of the component (F) is no more than the upper limit of the above-mentioned range, lithography properties are improved.

The thus explained fluorine-containing resin component (F) can also be preferably used as an additive for a resist composition for immersion exposure.

Examples of the monomers for deriving the structural unit (F-4) include compounds in which a base dissociable group and a polymerizable group are bonded via a divalent linking group.

The term "base dissociable group" refers to an organic group which can be dissociated from the structural unit (F-4) by the action of a base. Examples of the base include alkali developing solutions generally used in the fields of lithography. That is, the "base dissociable group" refers to a group which is dissociated by the action of an alkali developing solution (for example, a 2.38% by weight aqueous solution of tetramethylammonium hydroxide (TMAH) at 23° C.). A base dissociable group dissociates due to hydrolysis caused by the action of an alkali developing solution. Therefore, a hydrophilic group is formed when the base dissociable group dissociates and the hydrophilicity of the component (F2) is enhanced, and hence, the compatibility of the component (F2) with the alkali developing solution is improved.

A "polymerizable group" refers to a group that renders a compound having the group polymerizable by a radical polymerization or the like, and examples of the polymerizable groups include groups containing an ethylenic double bond. Examples of the groups containing an ethylenic double bond include a group represented by $CH_2$=$CR^C$— (in the formula, $R^C$ is the same as defined above).

Examples of the divalent linking groups include a group represented by the formula -$A_{aryl}$-$X_{01}$- (in the formula, $A_{aryl}$ and $X_{01}$ are the same as defined above) and a group represented by the formula —C(=O)—O—$R^{12}$— (in the formula, $R^{12}$ is the same as defined above).

Examples of the monomers for deriving a structural unit represented by general formula (F-4-1) above include a fluorine-containing compound represented by general formula (F-4-10) shown below, and examples of the monomers for deriving a structural unit represented by general formula (F-4-2) above include a fluorine-containing compound represented by general formula (F-4-20) shown below.

[Chemical Formula 73.]

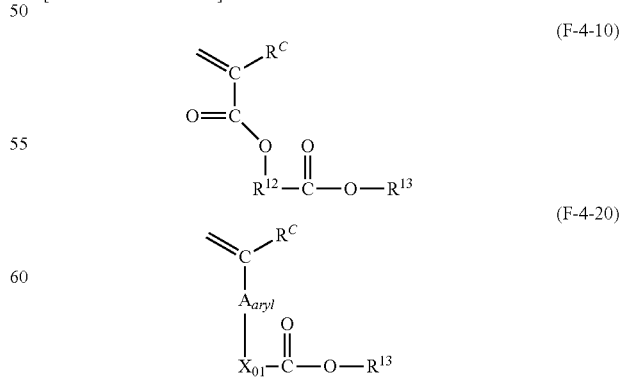

In the formula, $R^C$, $R^{12}$, $A_{aryl}$, $X_{01}$ and $R^{13}$ are the same as defined above.

A fluorine-containing compound represented by general formula (F-4-10) or (F-4-20) (hereafter, collectively referred to as "fluorine-containing compound (F-40)") can be produced, for example, by introducing the $R^{13}$ group ($R^{13}$ is the same as defined above) into the carboxy group of a compound represented by general formula (F-41) or (F-42) shown below (hereafter, collectively referred to as "compound (V-1)") (i.e., substituting the hydrogen atom at the terminal of the carboxy group with the $R^{13}$ group).

The $R^{13}$ group can be introduced by a conventional method. For example, a compound (V-1) can be reacted with a compound (V-2) represented by general formula (V-2) shown below, to thereby obtain a fluorine-containing compound (F-40).

[Chemical Formula 74.]

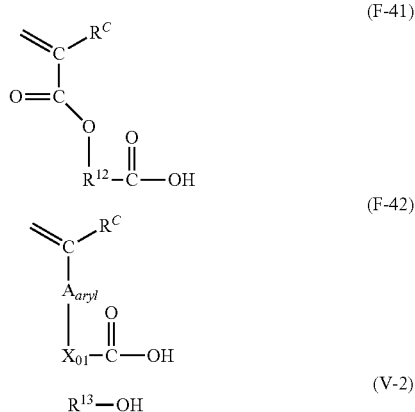

In the formula, $R^C$, $R^{12}$, $A_{aryl}$, $X_{01}$ and $R^{13}$ are the same as defined above.

The method of reacting a compound (V-1) with a compound (V-2) is not particularly limited. For example, a method in which a compound (V-1) comes in contact with a compound (V-2) in a reaction solvent in the presence of a base can be used.

As a compound (V-1) and a compound (V-2), commercially available compounds can be used. Alternatively, a compound (V-1) and a compound (V-2) can be synthesized.

As a compound (V-1), for example, a low-molecular-weight compound derived from an acrylate ester such as a carboxyalkyl (meth)acrylate or a mono((meth)acryloyloxyalkyl) succinate, or a polymeric compound including a structural unit derived from an acrylate ester can be used.

As a compound (V-2), for example, a fluorinated alkylalcohol or the like can be used.

As the reaction solvent, any solvent capable of dissolving a compound (V-1) and a compound (V-2) (which are raw materials) can be used. Specific examples include tetrahydrofuran (THF), acetone, dimethylformamide (DMF), dimethylacetamide, dimethylsulfoxide (DMSO) and acetonitrile.

Examples of the base include organic bases such as triethylamine, 4-dimethylaminopyridine (DMAP) and pyridine; and inorganic bases such as sodium hydride, $K_2CO_3$ and $Cs_2CO_3$.

Examples of condensing agents include carbodiimide reagents such as ethyldiisopropylaminocarbodiimide hydrochloride (EDCI), dicyclohexylcarboxylmide (DCC), diisopropylcarbodiimide and carbodiimidazole; tetraethyl pyrophosphate; and benzotriazole-N-hydroxytrisdimethylaminophosphonium hexafluorophosphide (Bop reagent).

If desired, an acid may be used. As the acid, any acid generally used for dehydration/condensation may be used. Specific examples include inorganic acids such as hydrochloric acid, sulfuric acid and phosphoric acid; and organic acids such as methanesulfonic acid, trifluoromethanesulfonic acid, benzenesulfonic acid and p-toluenesulfonic acid. These acids can be used individually, or in a combination of two or more.

The amount of the compound (V-2) added, relative to the compound (V-1) is preferably within a range from 1 to 3 equivalents, and more preferably from 1 to 2 equivalents.

The reaction temperature is preferably −20 to 40° C., more preferably 0 to 30° C.

The reaction time varies depending on factors such as the reactivity of the compound (V-1) and the compound (V-2) and the reaction temperature. However, in general, the reaction time is preferably within a range from 30 to 480 minutes, and more preferably from 60 to 360 minutes.

<Optional Components>

[Component (D)]

It is preferable that the positive resist composition of the present invention further include a nitrogen-containing organic compound (D) (hereafter referred to as the component (D)) as an optional component.

As the component (D), there is no particular limitation as long as it functions as an acid diffusion control agent, i.e., a quencher which traps the acid generated from the component (B) upon exposure. A multitude of these components (D) have already been proposed, and any of these known compounds may be used. Among these, an aliphatic amine, particularly a secondary aliphatic amine or tertiary aliphatic amine, and an aromatic amine is preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Further, aliphatic amines other than those described above can be used. Examples of other aliphatic amines include tris(2-methoxymethoxyethyl)amine, tris {2-(2-methoxyethoxy)ethyl}amine, tris {2-(2-methoxyethoxymethoxy)ethyl}amine, tris {2-(1-methoxyethoxy)ethyl}amine, tris {2-(1-ethoxyethoxy)ethyl}amine, tris {2-(1-ethoxypropoxy)ethyl}amine and tris [2-{2-(2-hydroxyethoxy)ethoxy}ethyl] amine.

Examples of aromatic amines include aniline compounds such as aniline, N,N-n-butyl-aniline, 2,6-diisopropylaniline, N-isopropylaniline, 3-isopropoxyaniline and N-ethylaniline, pyridine, 4-dimethylaminopyridine, pyrrole, indole, pyrazole, imidazole and derivatives thereof, as well as diphenylamine, triphenylamine and tribenzylamine.

As the component (D), one type of compound may be used alone, or two or more types may be used in combination.

The component (D) is typically used in an amount within a range from 0.01 to 5.0 parts by weight, relative to 100 parts by weight of the component (A). When the amount of the component (D) is within the above-mentioned range, the shape of the resist pattern and the post-exposure stability of the latent image formed by the pattern-wise exposure of the resist layer are improved.

[Component (E)]

Furthermore, in the positive resist composition of the present invention, for preventing any deterioration in sensitivity, and improving the resist pattern shape and the post-exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

As the component (E), an organic carboxylic acid is preferred, and salicylic acid is particularly desirable.

The component (E) is typically used in an amount within a range from 0.01 to 5.0 parts by weight, relative to 100 parts by weight of the component (A).

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

[Component (S)]

The positive resist composition of the present invention can be produced by dissolving the materials for the resist composition in an organic solvent (hereafter, referred to as "component (S)").

The component (S) may be any organic solvent which can dissolve the respective components to give a uniform solution, and one or more kinds of any organic solvent can be appropriately selected from those which are conventionally known as solvents for a chemically amplified resist.

Examples of the component (S) include lactones such as γ-butyrolactone; ketones such as acetone, methyl ethyl ketone, cyclohexanone (CH), methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

The component (S) can be used individually, or in combination as a mixed solvent.

Among these, cyclohexanone (CH), γ-butyrolactone, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3. Alternatively, when cyclohexanone (CH) is mixed as the polar solvent, the PGMEA:CH weight ratio is preferably from 1:9 to 9:1, and more preferably from 2:8 to 9:1.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is adjusted appropriately to a concentration that enables application of a coating solution to a substrate in accordance with the thickness of the coating film. In general, the component (S) is used in an amount that yields a solid content for the resist composition that is within a range from 0.5 to 20% by weight, and preferably from 1 to 15% by weight.

Dissolving of the components for a resist composition in the component (S) can be conducted by simply mixing and stirring each of the above components together using conventional methods, and where required, the composition may also be mixed and dispersed using a dispersion device such as a dissolver, a homogenizer, or a triple roll mill. Furthermore, following mixing, the composition may also be filtered using a mesh, or a membrane filter or the like.

<<Method of Forming a Resist Pattern>>

The method of forming a resist pattern according to a second aspect of the present invention includes: applying a positive resist composition of the present invention to a substrate to form a resist film on the substrate; conducting exposure of the resist film; and alkali-developing the resist film to form a resist pattern.

More specifically, the method for forming a resist pattern according to the present invention can be performed, for example, as follows.

Firstly, a positive resist composition of the present invention is applied onto a substrate using a spinner or the like, and a prebake (post-applied bake (PAB)) is conducted under temperature conditions of 80 to 150° C. for 40 to 120 seconds, preferably 60 to 90 seconds to form a resist film. Then, for example, using an ArF exposure apparatus or the like, the resist film is selectively exposed with an ArF exposure apparatus, an electron beam exposure apparatus, an EUV exposure apparatus or the like through a mask pattern or directly irradiated with electron beam without a mask pattern, followed by post-exposure bake (PEB) under temperature conditions of 80 to 150° C. for 40 to 120 seconds, preferably 60 to 90 seconds. Subsequently, developing is conducted using an alkali developing solution such as a 0.1 to 10% by weight aqueous solution of tetramethylammonium hydroxide (TMAH), preferably followed by rinsing with pure water, and drying. If desired, bake treatment (post-bake) can be conducted following the developing. In this manner, a resist pattern that is faithful to the mask pattern can be obtained.

The substrate is not specifically limited and a conventionally-known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective to KrF excimer laser, ArF excimer laser, EB and EUV, and particularly effective to ArF excimer laser.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

The method of forming a resist pattern according to the present invention is also applicable to a double-exposure method or a double patterning method.

As described hereinabove, by virtue of the positive resist composition and method of forming a resist pattern according to the present invention, generation of defects can be suppressed.

In a resist film formed using the positive resist composition of the present invention, a fluorine-containing polymer (F1) having a structural unit (F-1) represented by general formula (F-1) or a fluorine-containing copolymer (F2) is included.

The structural unit (F-1) contains a fluorine atom. Further, in the structural unit (F-1), the ester bond "—C(=O)—O—" within the terminal group "—COOR$^4$" is decomposed (hydrolyzed) by the action of a base to generate a hydrophilic group "—C(=O)—OH".

As a result, a resist film formed using the positive resist composition including the fluorine-containing polymer (F1) or the fluorine-containing copolymer (F2) exhibits a high hydrophobicity as compared to a resist film formed using a positive resist composition including no fluorine-containing polymer, and the resist film is decomposable in an alkali developing solution.

The expression "decomposable in an alkali developing solution" means that the group is decomposable by the action of an alkali developing solution (preferably decomposable by action of a 2.38% by weight aqueous solution of tetramethylammonium hydroxide (TMAH) at 23° C.), and exhibits increased alkali solubility in the alkali developing solution.

The fluorine-containing polymer (F1) or the fluorine-containing copolymer (F2) is a compound that is hardly soluble in an alkali developing solution prior to decomposition by the action of a base, and when the component (F1) or the component (F2) is decomposed by the action of a developing solution, a carboxy group which is a hydrophilic group is formed, thereby exhibiting increased solubility in the alkali developing solution.

By using the positive resist composition of the present invention including the fluorine-containing polymer (F1) or the fluorine-containing copolymer (F2), a resist pattern can be formed which is hydrophobic prior to coming in contact with an alkali developing solution (e.g., during immersion exposure), and becomes hydrophilic during alkali developing.

By using such a positive resist composition in which the hydrophilicity is enhanced during alkali developing, generation of defects during (immersion) exposure (especially defects caused by a deposit generated after the development process) can be effectively suppressed.

Especially in an immersion exposure process, it is preferable to enhance the hydrophobicity of the resist film so as to prevent the resist film from being affected by the immersion medium such as water. However, when the hydrophobicity of the resist film is high, it is disadvantageous in that the risk of defects caused by a deposit generated after the development process becomes high. The reason for this is that the deposit is a residue which could not be washed off the resist film by the hydrophilic developing solution and remaining on the resist film. Since this deposit is hydrophobic, the deposit becomes easier to be adhered to the resist film as the hydrophobicity of the resist film becomes higher.

In view of the above, the resist film is required to be hydrophobic during immersion exposure and become hydrophilic during alkali developing.

As described above, the fluorine-containing polymer (F1) or the fluorine-containing copolymer (F2) according to the present invention is decomposable by an alkali developing solution. Therefore, it becomes possible to form a resist film that is hydrophobic prior to coming in contact with an alkali developing solution (e.g., during immersion exposure), and becomes hydrophilic during alkali developing.

Thus, the positive resist composition of the present invention is capable of effectively reducing generation of defects (especially defects caused by a deposit generated after the development process), and is very useful in an immersion exposure process.

Thus, a resist film formed using the positive resist composition of the present invention exhibits a high hydrophobicity during immersion exposure for example, as compared to the case of using a conventional resist composition. Therefore, the resist film exhibits an excellent water tracking ability (tracking ability of water with respect to the movement of the lens) which is required when immersion exposure is conducted using a scanning-type immersion exposure apparatus as disclosed in Non-Patent Document 1, and a high scanning speed can be achieved.

In a resist film formed using the positive resist composition of the present invention, by virtue of using the fluorine-containing polymer (F1) or the fluorine-containing copolymer (F2), the hydrophobicity of the resist film is enhanced as compared to the case where a conventional positive resist composition is used, and the contact angles against water, e.g., the static contact angle (the contact angle between the surface of a water droplet on the resist film in a horizontal state and the resist film surface), the dynamic contact angle (the contact angle at which a water droplet starts to slide when the resist film is inclined, including the contact angle at the front-end point of the water droplet in the sliding direction (advancing angle) and the contact angle at the rear-end point of the water droplet in the sliding direction (receding angle)) and sliding angle (the inclination angle at which a water droplet starts to slide when the resist film is inclined) are changed. For example, the higher the hydrophobicity of a resist film, the higher the static contact angle and the dynamic contact angle and the smaller the sliding angle.

FIG. 1 is an explanatory diagram of an advancing angle ($\theta_1$) a receding angle ($\theta_2$) and a sliding angle ($\theta_3$).

As shown in FIG. 1, when a droplet 1 is placed on a plane 2 and the plane 2 is gradually inclined, the advancing angle is the angle $\theta_1$ formed between the lower end 1*a* of the droplet 1 and the plane 2 as the droplet 1 starts to move (slide) on the plane 2.

Further, at this point (the point when the liquid droplet 1 starts to move (slide) down the flat surface 2), the angle $\theta_2$ between the surface of the liquid droplet at the top edge 1*b* of the liquid droplet 1 and the flat surface 2 is the receding angle, and the inclination angle $\theta_3$ of the flat surface 2 is the sliding angle.

In the present description, the static contact angle, the dynamic contact angle and the sliding angle are measured in the following manner.

First, a resist composition solution is spin-coated onto a silicon substrate, and then heated under predetermined conditions, for example, at a temperature of 110° C. to 115° C. for 60 seconds to form a resist film.

Subsequently, the contact angles can be measured using commercially available measurement apparatuses such as DROP MASTER-700 (product name; manufactured by Kyowa Interface Science Co. Ltd.), AUTO SLIDING ANGLE: SA-30 DM (product name; manufactured by Kyowa Interface Science Co. Ltd.), and AUTO DISPENSER: AD-31 (product name; manufactured by Kyowa Interface Science Co. Ltd.).

With respect to a resist film formed using the positive resist composition of the present invention, the static contact angle as measured prior to exposure and development is not particularly limited. The static contact angle is preferably 70 degrees (°) or more, and more preferably 70 to 100°. When the static contact angle is within the above-mentioned range, the hydrophobicity of the resist film surface becomes excellent, thereby enabling high-speed scanning during immersion exposure. Further, the effect of suppressing elution of a substance (leaching) can be improved. It is presumed that one of the main reasons why these effects can be achieved is related to the hydrophobicity of the resist film. More specifically, it is presumed that, since an aqueous substance such as water is used as the immersion medium, higher hydrophobicity has an influence on the swift removal of the immersion medium from the surface of the resist film after the immersion exposure.

For the same reasons as described above, with respect to a resist film formed using the positive resist composition of the present invention, the receding angle as measured prior to conducting exposure and development is preferably 70° or more, more preferably 73° or more, and still more preferably 75° or more. The upper limit value of the receding angle is not particularly limited, and can be, for example, 90° or less.

Further, with respect to a resist film formed using the positive resist composition of the present invention, the sliding angle as measured prior to exposure and development is preferably 25° or less, and more preferably 20° or less. When the sliding angle is no more than the upper limit of the above-mentioned range, the effect of suppressing the elution of a substance during immersion exposure is enhanced. The lower limit of the sliding angle is not particularly limited, and can be, for example, 5° or more.

Furthermore, with respect to a resist film formed using the positive resist composition of the present invention, the advancing angle as measured prior to exposure and development is preferably 80 to 100°, and more preferably 80 to 90°. When the advancing angle is within the above-mentioned range, generation of defects can be suppressed, and various lithography properties can be improved.

The level of the above-mentioned various contact angles (dynamic contact angle, static contact angle and sliding angle) can be adjusted by the formulation of the positive resist composition, e.g., the type of the component (F), the amount of the component (F), or the type of the component (A1). For example, by increasing the amount of the component (F), the hydrophobicity of the formed resist film can be enhanced, and the static contact angle and the receding angle becomes large, in particular, the receding angle. Further, in particular, by adjusting the amount of the component (F) and the amount of fluorine contained in the structural unit(s), the advancing angle can be adjusted (the smaller the amount of fluorine, the smaller the advancing angle).

In addition, by using the positive resist composition of the present invention, elution of a substance (leaching) from the resist film during immersion exposure can be suppressed.

As described above, immersion exposure is a method in which exposure (immersion exposure) is conducted in a state where the region between the lens and the resist layer formed on a wafer (which was conventionally filled with air or an inert gas such as nitrogen) is filled with a solvent (a immersion medium) that has a larger refractive index than the refractive index of air. In immersion exposure, when the resist film comes into contact with the immersion medium, elution of substances within the resist film (component (B), component (D), and the like) into the immersion medium occurs. This elution of a substance causes phenomenon such as degeneration of the resist film and change in the refractive index of the immersion medium, thereby adversely affecting the lithography properties.

The amount of the eluted substance is affected by the properties of the resist film surface (e.g., hydrophilicity, hydrophobicity, and the like). Therefore, it is presumed that the amount of eluted substance can be reduced by enhancing the hydrophobicity of the resist film surface.

Since a resist film formed using the positive resist composition of the present invention includes the fluorine-containing polymer (F1) or the fluorine-containing copolymer (F2), the resist film exhibits high hydrophobicity prior to conducting exposure and developing, as compared to a resist composition which does not contain the component (F1) or (F2). Thus, by the positive resist composition of the present invention, elution of a substance during immersion exposure can be suppressed.

Since elution of a substance can be suppressed, by using the positive resist composition of the present invention, phenomenon such as degeneration of the resist film and change in the refractive index of the immersion medium, which occur during immersion exposure, can be suppressed. Further, as variation in the refractive index of the immersion medium can be suppressed, a resist pattern having an excellent shape can be formed. Furthermore, the level of contamination of the lens within the exposure apparatus can be lowered. Therefore, there is no need for protection against these disadvantages, and hence, the present invention can contribute to simplifying the process and the exposure apparatus.

Further, since the fluorine-containing polymer (F1) or the fluorine-containing copolymer (F2) has a carbonyloxy group (—C(=O)—O—) which exhibits a relatively high polarity, the component (F1) or (F2) exhibits improved compatibility with other components of the resist composition. Therefore, the positive resist composition of the present invention is expected to exhibit improved stability over time.

In addition, a resist film formed using the positive resist composition of the present invention hardly swells due to being exposed to water. Therefore, a very fine resist pattern can be formed with a high precision.

Also, the positive resist composition of the present invention exhibits excellent lithography properties with respect to sensitivity, resolution, etching resistance and the like, and is capable of forming a resist pattern without any practical problems when used as a resist for immersion exposure. For example, by using the positive resist composition of the present invention, a very fine resist pattern with a size of 65 nm or smaller can be formed.

More specifically, in addition to the effect of suppressing generation of defects, the positive resist composition of the present invention exhibits not only excellent lithography properties generally required (sensitivity, resolution, etching resistance, and the like), but also excellent properties required for a resist material used in immersion exposure (hydrophobicity, ability of suppressing elution of a substance, water tracking ability, and the like). Therefore, the positive resist composition of the present invention is preferable for use in immersion exposure.

EXAMPLES

As follows is a description of examples of the present invention, although the scope of the present invention is by no way limited by these examples.

In the following examples, a unit represented by a chemical formula (I) is referred to as "compound (1)", and the same applies for compounds represented by other formulas.

<Synthesis of Base Component (A)>

The polymeric compounds used as the base component (A) in the present examples were synthesized in accordance with the following polymer synthesis examples using the compounds (1) to (8) represented by the chemical formulas shown below.

The compound (1) used in the polymer synthesis examples was synthesized in accordance with the monomer synthesis example described below.

[Chemical Formula 75.]

Compound (1)

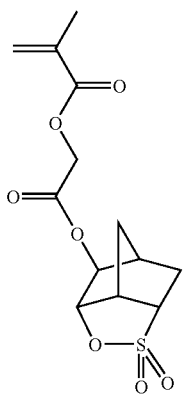

Compound (2)

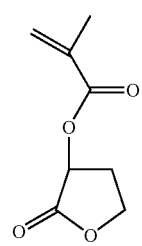

Compound (3)

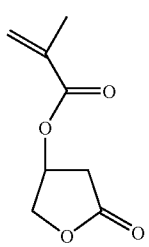

Compound (4)

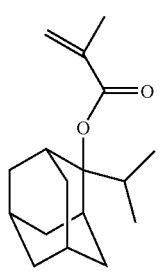

Compound (5)

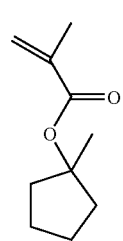

-continued

Compound (6)

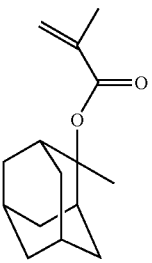

Compound (7)

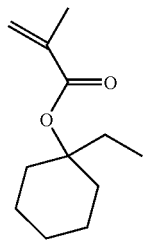

Compound (8)

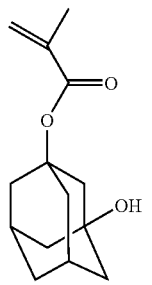

Monomer Synthesis Example 1

Synthesis of Compound (1)

300 ml of a THF solution containing 20 g (105.14 mmol) of an alcohol (1), 30.23 g (157.71 mmol) of ethyldiisopropylaminocarbodiimide (EDCI) hydrochloride and 0.6 g (5 mmol) of dimethylaminopyridine (DMAP) was added to a 500 ml three-necked flask in a nitrogen atmosphere, and 16.67 g (115.66 mmol) of a precursor (1) was added thereto while cooling with ice (0° C.), followed by stirring at room temperature for 12 hours.

After conducting thin-layer chromatography (TLC) to confirm that the raw materials had dissipated, 50 ml of water was added to stop the reaction. Then, the reaction solvent was concentrated under reduced pressure, and extraction was conducted with ethyl acetate three times. The obtained organic phase was washed with water, saturated sodium hydrogencarbonate and 1N—HClaq in this order. Thereafter, the solvent was distilled off under reduced pressure, and the resulting product was dried, thereby obtaining the compound (1).

[Chemical Formula 76.]

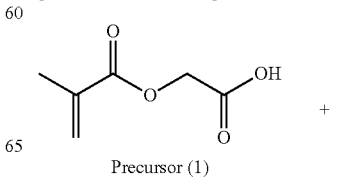

Precursor (1)

-continued

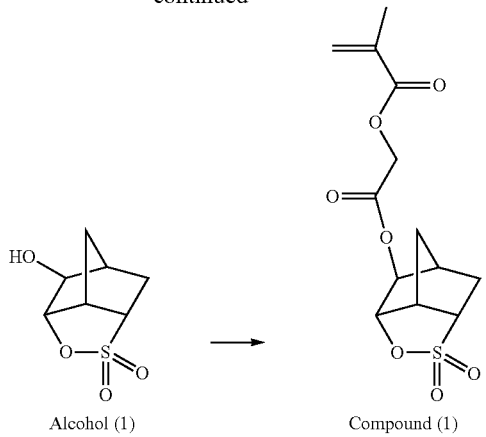

Alcohol (1) → Compound (1)

The results of instrumental analysis of the obtained compound (1) were as follows.

$^1$H-NMR(CDCl$_3$,400 MHz):δ(ppm)=6.22(s,1H,H$^a$), 5.70 (s,1H,H$^b$), 4.71-4.85(m,2H,H$^{c,d}$), 4.67(s,2H,H$^k$), 3.40-3.60 (m,2H, H$^{e,f}$), 2.58-2.70(m,1H,H$^g$), 2.11-2.21(m,2H,H$^h$), 2.00 (s,3H,H$^i$), 1.76-2.09(m,2H,H$^j$).

From the results shown above, it was confirmed that the compound (1) had a structure shown below.

[Chemical Formula 77.]

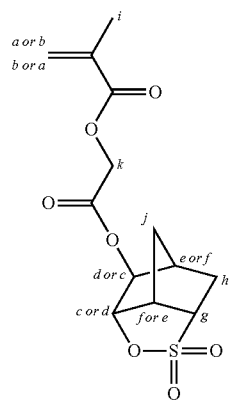

Polymer Synthesis Example 1

Synthesis of Polymeric Compound (1)

In a three-necked flask equipped with a thermometer and a reflux tube, 11.77 g (69.23 mmol) of a compound (2), 15.00 g (47.47 mmol) of a compound (1), 16.58 g (63.29 mmol) of a compound (4), 4.65 g (27.69 mmol) of a compound (5) and 3.27 g (13.85 mmol) of a compound (8) were dissolved in 76.91 g of methyl ethyl ketone (MEK) to obtain a solution. Then, 22.1 mmol of dimethyl 2,2'-azobis(isobutyrate) (V-601) was added and dissolved in the obtained solution. The resultant was dropwise added to 42.72 g of MEK heated to 78° C. in a nitrogen atmosphere over 3 hours. The resulting reaction solution was heated while stirring for 4 hours, and then cooled to room temperature. The obtained reaction polymer solution was dropwise added to an excess amount of n-heptane to thereby precipitate a polymer. Thereafter, the precipitated white powder was separated by filtration, followed by washing with a n-heptane/isopropylalcohol mixed solvent and drying, thereby obtaining 41 g of a polymeric compound (1) as an objective compound.

With respect to the polymeric compound (1), the weight-average-molecular-weight (Mw) and the dispersity (Mw/Mn) were determined by the polystyrene equivalent value as measured by gel permeation chromatography (GPC). As a result, it was found that the weight-average-molecular-weight was 7,300, and the dispersity was 1.64. Further, as a result of an analysis by carbon 13 nuclear magnetic resonance spectroscopy (600 MHz, $^{13}$C-NMR), it was found that the composition of the copolymer (ratio (molar ratio) of the respective structural units within the structural formula) was a21/a0/a11/a12/a3=35/27/18/13/7.

[Chemical Formula 78.]

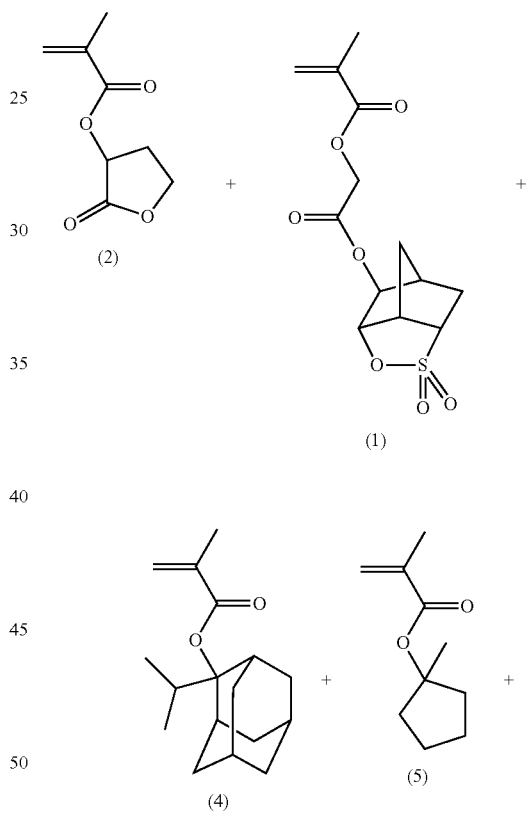

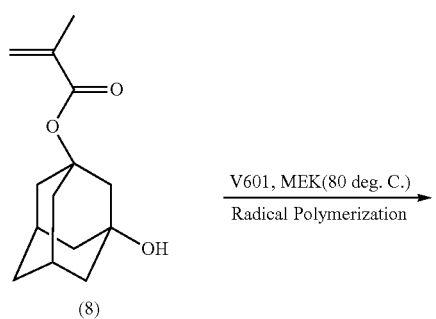

V601, MEK(80 deg. C.)
Radical Polymerization

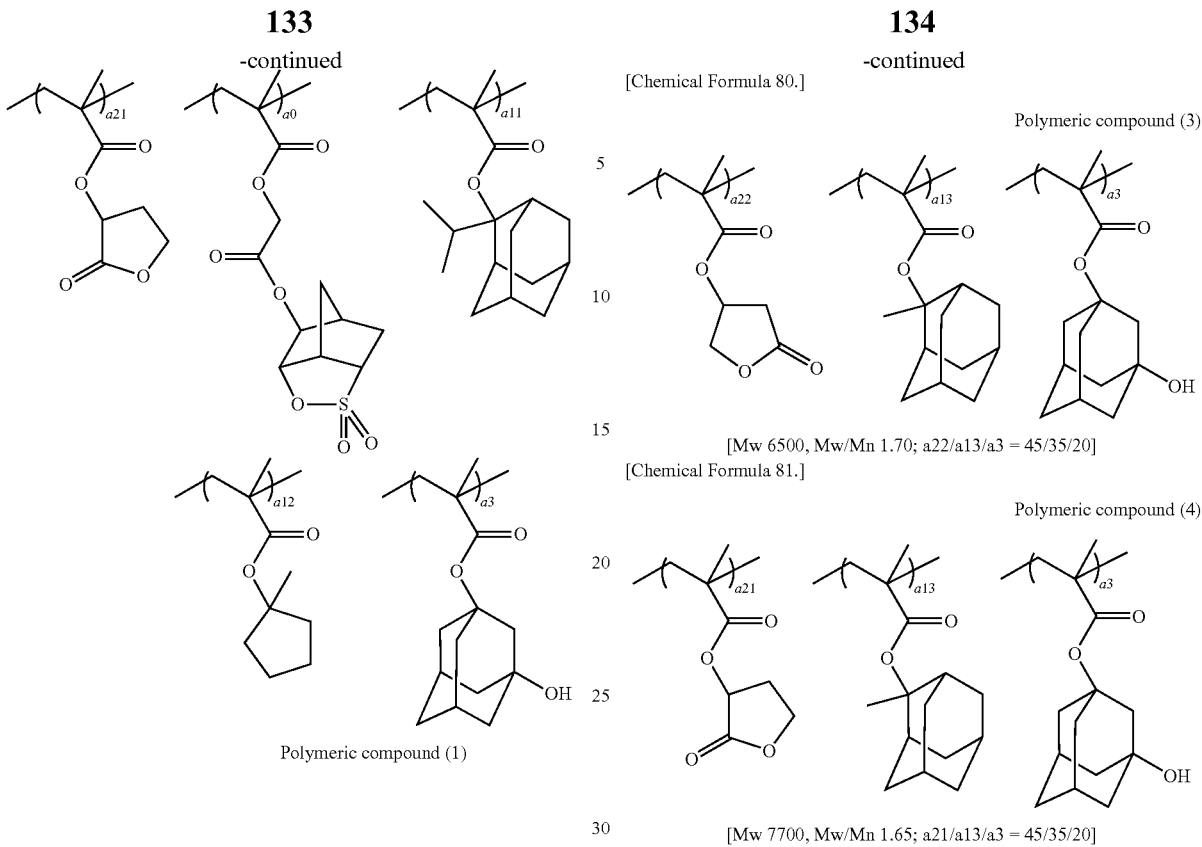

Polymer Synthesis Examples 2-4

Synthesis of Polymeric Compounds (2) to (4)

Other polymeric compounds (2) to (4) were synthesized in substantially the same manner as in Polymer Synthesis Example 1, except that monomers for deriving the structural units of the respective polymeric compounds were used in a predetermined molar ratio.

The structural formulas of the obtained polymeric compounds (2) to (4), the weight-average-molecular-weight (Mw) and the molecular weight dispersity (Mw/Mn) determined by the polystyrene equivalent value as measured by gel permeation chromatography (GPC) and the compositional ratios of the copolymers as measured by carbon 13 nuclear magnetic resonance spectroscopy (600 MHz, $^{13}$C-NMR) are shown below.

[Chemical Formula 79.]

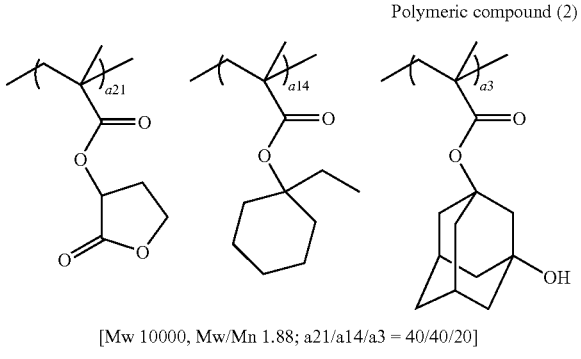

Polymeric compound (2)

[Mw 10000, Mw/Mn 1.88; a21/a14/a3 = 40/40/20]

<Synthesis of Acid-generator Component (B)>

The compounds used as the acid-generator component (B) in the present examples were synthesized in accordance with the following synthesis examples.

In the NMR analysis, the internal standard for $^1$H-NMR is tetramethylsilane (TMS), and the internal standard for $^{19}$F-NMR is hexafluorobenzene (the peak of hexafluorobenzene was regarded as −160 ppm).

Acid-generator Synthesis Example 1

Synthesis of Acid Generator (B12)

(i) Synthesis of Compound (IV)

150 g of methyl fluorosulfonyl(difluoro)acetate and 375 g of pure water were maintained at 10° C. or lower in an ice bath, and 343.6 g of a 30% by weight aqueous solution of sodium hydroxide was dropwise added thereto. Then, the resultant was refluxed at 100° C. for 3 hours, followed by cooling and neutralizing with a concentrated hydrochloric acid. The resulting solution was dropwise added to 8,888 g of acetone, and the precipitate was collected by filtration and dried, thereby obtaining 184.5 g of a compound (1) in the form of a white solid (purity: 88.9%, yield: 95.5%).

[Chemical Formula 82.]

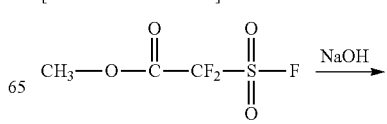

-continued

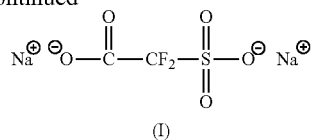

(I)

Subsequently, 56.2 g of the compound (1) and 562.2 g of acetonitrile were prepared, and 77.4 g of p-toluenesulfonic acid monohydrate was added thereto. The resultant was refluxed at 110° C. for 3 hours. Then, the reaction mixture was filtered, and the filtrate was concentrated and dried to obtain a solid. 900 g of t-butyl methyl ether was added to the obtained solid and stirred. Thereafter, the resultant was filtered, and the residue was dried, thereby obtaining 22.2 g of a compound (II) in the form of a white solid (purity: 91.0%, yield: 44.9%).

[Chemical Formula 83.]

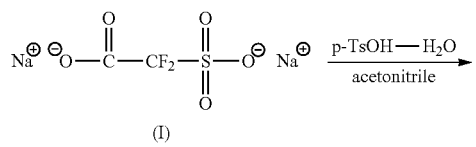

Subsequently, 4.34 g of the compound (II) (purity: 94.1%), 3.14 g of 2-benzyloxyethanol and 43.4 g of toluene were prepared, and 0.47 g of p-toluenesulfonic acid monohydrate was added thereto. The resultant was refluxed at 105° C. for 20 hours. Then, the reaction mixture was filtered, and 20 g of hexane was added to the residue and stirred. Thereafter, the resultant was filtered, and the residue was dried, thereby obtaining 1.41 g of a compound (III) (yield: 43.1%).

[Chemical Formula 84.]

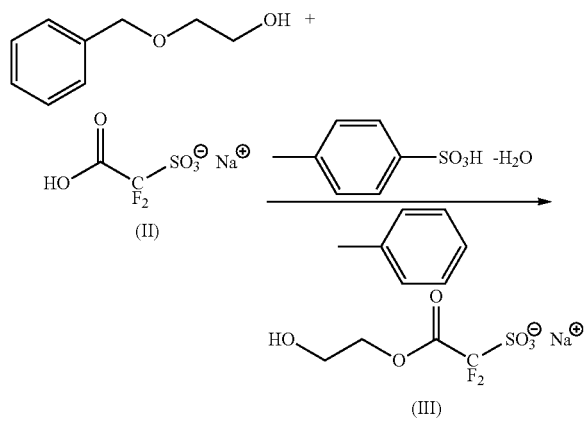

The obtained compound (III) was analyzed by NMR.

$^1$H-NMR(DMSO-d6,400 MHz):δ(ppm)=4.74-4.83(t,1H, OH), 4.18-4.22(t,2H,$H^a$), 3.59-3.64(q,2H,$H^b$).

$^{19}$F-NMR(DMSO-d6,376 MHz):δ(ppm)=−106.6.

From the results shown above, it was confirmed that the compound (III) had a structure shown below.

[Chemical Formula 85.]

Compound (III)

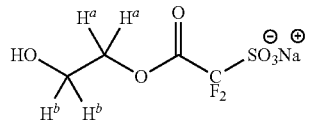

Next, 1.00 g of the compound (III) and 3.00 g of acetonitrile were prepared, and 0.82 g of 1-adamantanecarbonyl chloride and 0.397 g of triethylamine were dropwise added thereto while cooling with ice. Then, the resultant was stirred at room temperature for 20 hours, followed by filtration. The filtrate was concentrated and dried, and dissolved in 30 g of dichloromethane, followed by washing with water three times. Thereafter, the organic phase was concentrated and dried, thereby obtaining 0.82 g of a compound (IV) (yield: 41%).

[Chemical Formula 86.]

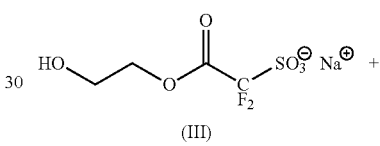

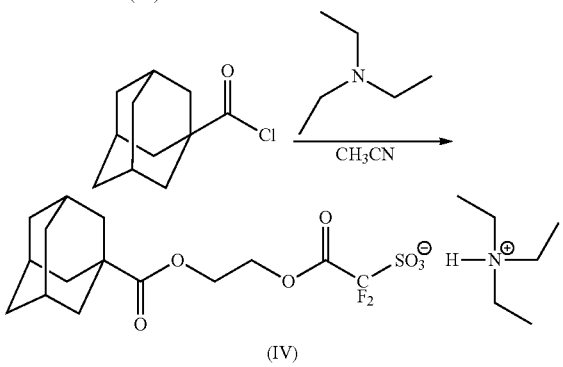

The obtained compound (IV) was analyzed by NMR.

$^1$H-NMR(DMSO-d6,400 MHz):δ(ppm)=8.81(s,1H,$H^c$), 4.37-4.44(t,2H,$H^d$), 4.17-4.26(t,2H,$H^e$), 3.03-3.15(q,6H, $H^b$), 1.61-1.98(m,15H,Adamantane), 1.10-1.24(t,9H,$H^a$).

$^{19}$F-NMR(DMSO-d6,376 MHz):δ(ppm)=−106.61.

From the results above, it was confirmed that the compound (IV) had a structure shown below.

[Chemical Formula 87.]

Compound (IV)

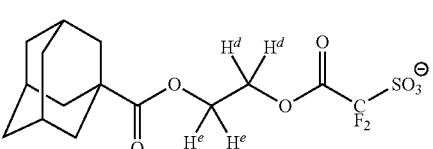

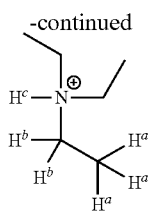

(ii) Synthesis of Compound (VI)

To 60.75 g of methanesulfonic acid controlled to 20° C. or lower was added 8.53 g of phosphorus oxide, 8.81 g of 2,6-dimethylphenol and 12.2 g of diphenylsulfoxide in small amounts. The resultant was matured for 30 minutes while maintaining the temperature at 15 to 20° C., followed by elevating the temperature to 40° C. and maturing for 2 hours. Then, the reaction mixture was dropwise added to 109.35 g of pure water cooled to 15° C. or lower. Thereafter, 54.68 g of dichloromethane was added and stirred, and the dichloromethane phase was collected. 386.86 g of hexane at a temperature of 20 to 25° C. was added to a separate vessel, and the dichloromethane phase was dropwise added thereto. Then, the resultant was matured at 20 to 25° C. for 30 minutes, followed by filtration, thereby obtaining a compound (V) (yield: 70.9%).

The obtained compound (V) was analyzed by NMR.

$^1$H-NMR(DMSO-d6,600 MHz):δ(ppm)=7.61-7.72(m, 10H, phenyl), 7.14(s,2H,H$^c$), 3.12(s,3H,H$^b$), 2.22(s,6H,H$^a$).

From the results above, it was confirmed that the compound (V) had a structure shown below.

[Chemical Formula 88.]

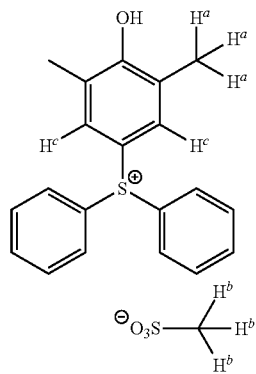

Compound (V)

4 g of the compound (V) was dissolved in 79.8 g of dichloromethane. After confirming that the compound (V) had dissolved in dichloromethane, 6.87 g of potassium carbonate was added thereto, and 3.42 g of methyl adamantyl bromoacetate was further added. A reaction was effected under reflux for 24 hours, followed by filtration, washing with water, and crystallization with hexane. The resulting powder was dried under reduced pressure, thereby obtaining 3.98 g of an objective compound (VI) (yield: 66%).

The obtained compound (VI) was analyzed by NMR.

$^1$H-NMR (CDCl$_3$,400 MHz):δ(ppm)=7.83-7.86(m,4H, Phenyl), 7.69-7.78(m,6H,Phenyl), 7.51(s,2H,H$^d$), 4.46(s,2H, H$^c$), 2.39(s,6H,H$^a$), 2.33(s,2H,Adamantane), 2.17 (s,2H, Adamantane), 1.71-1.98(m,11H, Adamantane), 1.68(s,3H, H$^b$), 1.57-1.61(m,2H,Adamantane).

From the results above, it was confirmed that the compound (VI) had a structure shown below.

[Chemical Formula 89.]

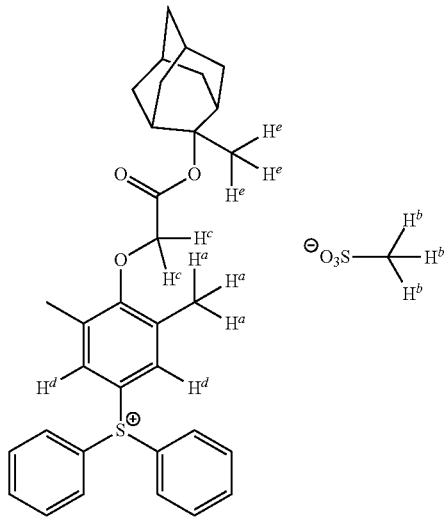

Compound (VI)

(iii) Synthesis of Acid Generator (B12)

4.77 g of the compound (VI) was dissolved in 23.83 g of dichloromethane and 23.83 g of pure water, and 3.22 g of the compound (IV) was then added to the resulting solution. The resultant was stirred for 1 hour, followed by liquid separation to collect the organic phase. The organic phase was washed with 3.84 g of water three times. Thereafter, the resulting organic layer was concentrated and solidified, thereby obtaining 4.98 g of a compound (B12) (yield: 87%).

[Chemical Formula 90.]

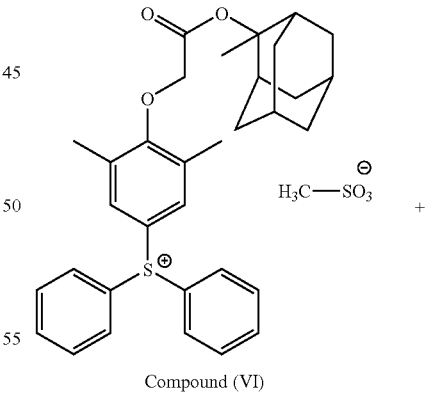

Compound (VI)

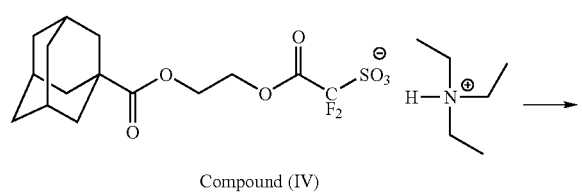

Compound (IV)

-continued

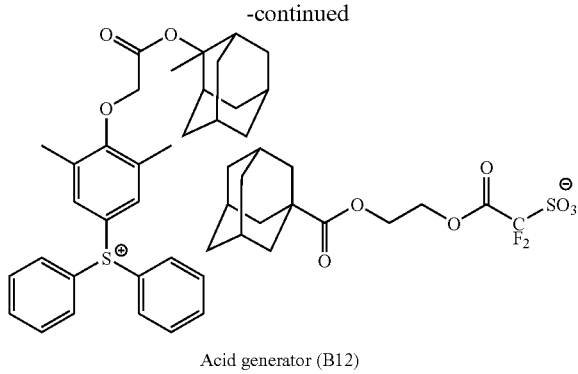

Acid generator (B12)

The obtained acid generator (B12) was analyzed by NMR.
$^1$H-NMR (DMSO-d6,400 MHz):δ(ppm)=7.76-7.88(m, 10H,Phenyl), 7.62(s,2H,Phenyl), 4.64(s,2H,H$^b$), 4.43-4.44(t, 2H,H$^e$), 4.22-4.23(t,2H,H$^d$), 1.51-2.36(m,38H,Adamantane+H$^a$+H$^c$).
$^{19}$F-NMR (DMSO-d6, 376 MHz): δ(ppm)=−106.7.

From the results shown above, it was confirmed that the acid generator (B12) had a structure shown below.

[Chemical Formula 91.]

Acid generator (B12)

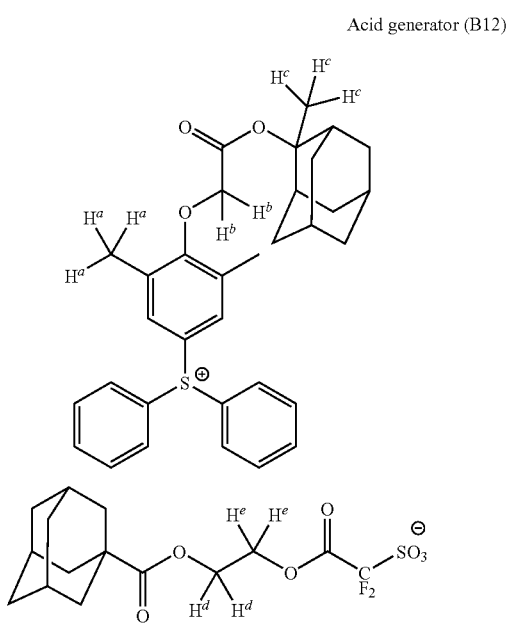

Acid-Generator Synthesis Example 2

Synthesis of Acid Generator (B13)

2 g of the compound (VII) was added to 20 g of dichloromethane and 20 g of water, followed by stirring. Then, 2.54 g of the compound (IV) was added thereto, followed by stirring for 1 hour. The reaction mixture was subjected to liquid separation, and the resultant was washed four times with 20 g of water. After the washing, the organic solvent phase was concentrated and solidified, thereby obtaining 2.3 g of an acid generator (B13).

The obtained acid generator (B13) was analyzed by NMR.
$^1$H-NMR(DMSO-d6,400 MHz):δ(ppm)=7.72-7.83(m, 10H,Ar), 7.72(s,2H,Ar), 6.49-6.55(m,1H,Vinyl), 4.37-4.44 (t,2H,CH$_2$), 4.20-4.23(d,1H,Vinyl), 4.00-4.26(m,7H,CH$_2$+Vinyl), 2.27(s,6H,CH$_3$), 1.61-1.98(m,15H,Adamantane)
$^{19}$F-NMR(DMSO-d6,376 MHz):δ(ppm)=−106.61

From the results shown above, it was confirmed that the acid generator (B13) had a structure shown below.

[Chemical Formula 92.]

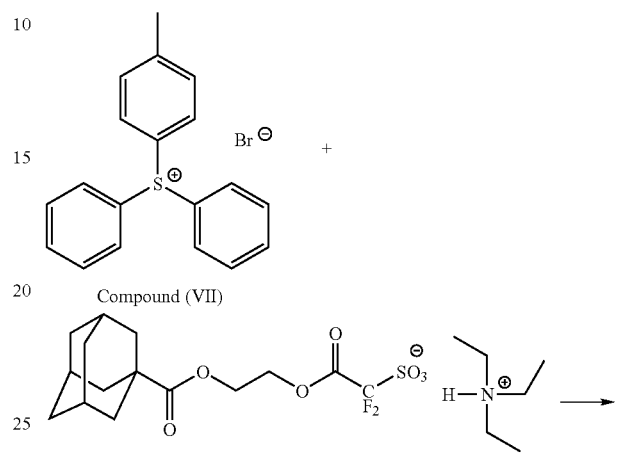

Acid generator (B13)

<Synthesis of Fluorine-Containing Polymer Component (F)>

The fluorine-containing polymers used as the fluorine-containing polymer component (F) in the present examples were synthesized in accordance with the following polymer synthesis examples using the compounds (11) to (16) represented by the chemical formulas shown below.

The compound (15) and the compound (16) used in the polymer synthesis examples were synthesized as follows.

[Chemical Formula 93.]

Compound (11)

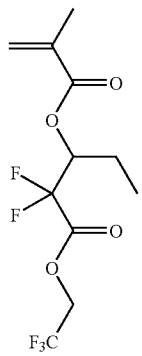

Compound (12)
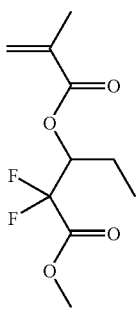

Compound (13)
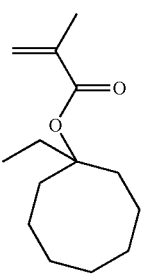

Compound (14)
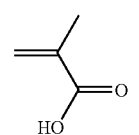

Compound (15)
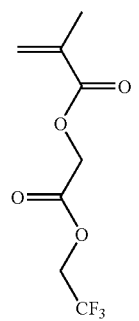

Compound (16)
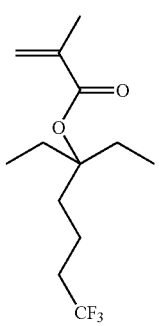

Monomer Synthesis Example 2

Synthesis of Compound (15)

(i) Synthesis of Compound (15)-2

61 g (600 mmol) of triethylamine and 64 g (418 mmol) of methyl bromoacetate were added to 300 ml of a THF solution containing 30 g (348 mmol) of methacrylic acid in a nitrogen atmosphere at 0° C., and the temperature was elevated to room temperature, followed by stirring for 3 hours. After conducting thin-layer chromatography (TLC) to confirm that the raw materials had dissipated, the reaction solution was subjected to distillation under reduced pressure to remove the solvent. Then, water was added to the resultant, and extraction was conducted with ethyl acetate three times. The resulting organic phase was washed with water twice, and then subjected to distillation under reduced pressure to remove the solvent, thereby obtaining 47 g of a compound (15)-1 in the form of a colorless liquid (yield: 85%).

Subsequently, 700 ml of a THF solution containing 30 g (190 mmol) of the compound (15)-1 was prepared, and 700 ml of a 2.38% by weight aqueous solution of TMAH was added thereto, followed by stirring at room temperature for 3 hours. After conducting thin-layer chromatography (TLC) to confirm that the raw materials had dissipated, THF was distilled off under reduced pressure. Then, the resulting aqueous reaction solution was cooled to 0° C., and 50 ml of a 10N hydrochloric acid was added thereto to render the aqueous reaction solution acidic, followed by extraction with ethyl acetate three times. The resulting organic phase was washed with water twice, and the solvent was distilled off under reduced pressure, thereby obtaining 26 g of a compound (15)-2 in the form of a colorless liquid (yield: 95%).

[Chemical Formula 94.]

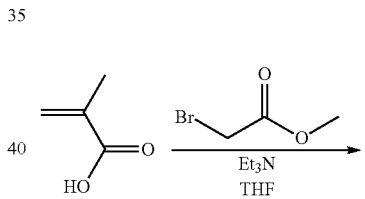

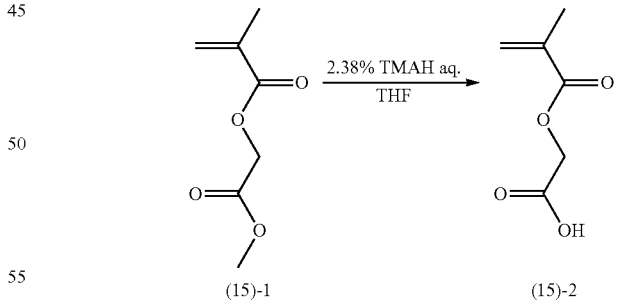

The obtained compounds (15)-1 and (15)-2 were analyzed by $^1$H-NMR. The results are shown below.

Spectrum data of compound (15)-1:

$^1$H-NMR(CDCl$_3$) 6.23(s,1H,Hb), 5.67(d,1H,Hb), 4.13(s, 2H,Hc), 3.78(s,3H,Hd), 2.00 (s, 3H, Ha)

Spectrum data of compound (15)-2:

$^1$H-NMR(CDCl$_3$) 6.23(s, 1H,Hb), 5.67(d,1H,Hb), 4.69(s, 2H,Hc), 2.00(s,3H,Ha)

143

[Chemical Formula 95.]

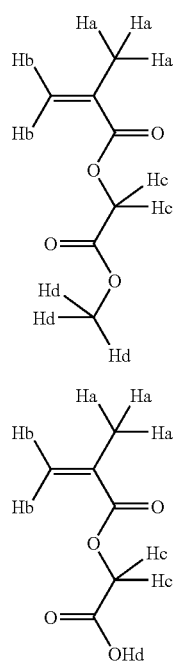

(ii) Synthesis of Compound (15)

26 g (180.39 mmol) of a compound (15)-2 was added to 200 ml of a THF solution containing 23.48 g (234.5 mmol) of 2,2,2-trifluoroethanol, 51.9 g (270.6 mmol) of ethyldiisopropylaminocarbodiimide (EDCl) hydrochloride and 0.11 g (0.9 mmol) of dimethylaminopyridine (DMAP) in a nitrogen atmosphere at 0° C., and the temperature was elevated to room temperature, followed by stirring for 3 hours. After conducting thin-layer chromatography (TLC) to confirm that the raw materials had dissipated, the reaction solution was cooled to 0° C., and water was added thereto to stop the reaction. Then, extraction was conducted with ethyl acetate three times, and the obtained organic phase was washed with water twice. Thereafter, the solvent was distilled off under reduced pressure to obtain a crude product, and the obtained crude product was purified by silica gel filtration (using ethyl acetate), thereby obtaining 25 g of a compound (15) in the form of a colorless liquid.

[Chemical Formula 96.]

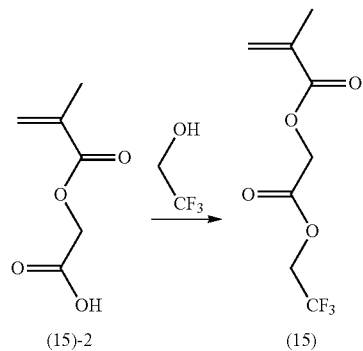

The obtained compound (15) was analyzed by $^1$H-NMR. The results are shown below.

144

$^1$H-NMR(CDCl$_3$) 6.24(s,1H,Hb), 5.70(s,1H,Hb), 4.80(s, 2H,Hc), 4.60-4.51(m,2H,Hd), 1.99(s,3H,Ha)

From the results shown above, it was confirmed that the compound (15) had a structure shown below.

[Chemical Formula 97.]

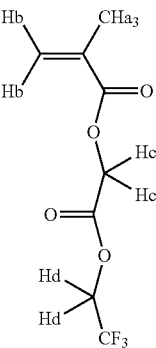

Compound (15)

Monomer Synthesis Example 3

Synthesis of Compound (16)

(i) Synthesis of 7,7,7-trifluoro-3-ethyl-3-heptanol 1.3 g of magnesium, 10.0 g of 1-bromo-4,4,4-trifluorobutane and 20 g of tetrahydrofuran were added to a four-necked flask equipped with a nitrogen feeding pipe, a reflux condenser, a dropping funnel and a thermometer, and a Grignard reagent was prepared by a conventional method. Then, a mixture containing 5.0 g of 3-pentanone and 4 g of tetrahydrofuran was dropwise added to the obtained Grignard reagent at a temperature of 25 to 35° C. over 30 minutes, followed by stirring at the same temperature for 1 hour. The reaction mixture was treated by a conventional method, and the resulting organic phase was washed with water, followed by drying with anhydrous magnesium sulfate. Thereafter, the resultant was concentrated under reduced pressure, thereby obtaining 7.9 g of 7,7,7-trifluoro-3-ethyl-3-heptanol in the form of a pale yellow oily matter.

(ii) Synthesis of Compound (16)

7.9 g of 7,7,7-trifluoro-3-ethyl-3-heptanol obtained above, 0.2 g of 4-dimethylaminopyridine, 7.1 g of triethylamine and 10 g of acetonitrile were added to a four-necked flask equipped with a stirrer, a thermometer and a dropping funnel, and were dissolved by stirring. Subsequently, 6.7 g of methacrylic acid chloride was dropwise added to the resulting solution at about 75° C. over 30 minutes, followed by stirring at the same temperature for 2 hours. Then, the reaction mixture was cooled to room temperature, and washing was conducted once with a mixture containing 8.8 g of potassium carbonate and 100 ml of water, and once with a 10% saline solution. Thereafter, the resultant was dried with anhydrous magnesium sulfate, and then concentrated under reduced pressure. The obtained concentrate was purified by silica gel column chromatography, thereby obtaining 5.7 g of a compound (16) (7,7,7-trifluoro-3-ethyl-3-heptyl methacrylate).

The $^1$H-NMR data of the obtained compound (16) were as follows.

$^1$H-NMR(CDCl$_3$)δ: 0.82-0.87(tr,6H,—CH$_3$), 1.46-1.58 (m,2H,—CH$_2$—), 1.78-1.97(m,9H,=C—CH$_3$,—C—CH$_2$—), 1.98-2.16(m,2H,CF$_3$CH$_2$—), 5.49(s,1H,C=CH$_2$), 6.01(s,1H,C=CH$_2$)

From the results shown above, it was confirmed that the compound (16) had a structure represented by the formula shown below.

[Chemical Formula 98.]

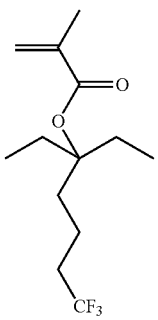

Compound (16)

Polymer Synthesis Example 5

Synthesis of Fluorine-Containing Polymer (F3-1)

27 g of tetrahydrofuran and 11.98 g of the compound (16) obtained in Monomer Synthesis Example 3 were added to a four-necked flask equipped with a nitrogen feeding pipe, a reflux condenser, a dropping funnel and a thermometer, and the flask was purged with nitrogen, followed by elevating the temperature to 67° C. While maintaining that temperature, a solution obtained by dissolving 0.30 g of 2,2'-azobis(2,4-dimethylvaleronitrile) in 3 g of tetrahydrofuran was dropwise added thereto over 10 minutes. Thereafter, stirring was conducted for 6 hours while maintaining that temperature, and then cooled to room temperature. The obtained polymerization reaction solution was dropwise added to excess amount of a methanol/water mixed solvent, and the precipitated resin was separated by filtration, followed by washing and drying, thereby obtaining 4.0 g of a copolymer (F3-1) represented by the chemical formula shown below as an objective compound in the form of a white powder.

The obtained fluorine-containing polymer (F3-1) had a weight-average-molecular-weight (Mw) of 8,200 and a dispersity (Mw/Mn) of 1.51.

[Chemical Formula 99.]

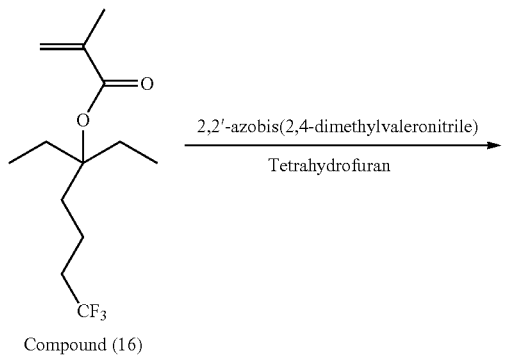

Compound (16)

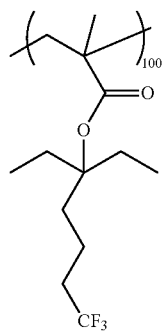

Fluorine-containing polymer (F3-1)

Polymer Synthesis Example 6

Synthesis of Fluorine-Containing Polymer (F1-1)

(i) Synthesis of Compound (11)

The same procedure as in "(ii) synthesis of compound (15)" of Monomer Synthesis Example 2 was performed, except that the compound (15)-2 was changed to a compound represented by the formula (11-0) shown below in an equimolar amount, thereby obtaining a compound (11).

[Chemical Formula 100.]

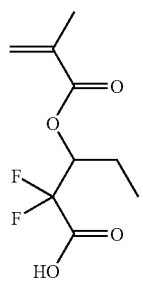

(11-0)

(ii) Synthesis of Fluorine-Containing Polymer (F1-1)

10.00 g (32.89 mmol) of the compound (11) was added to a three-necked flask equipped with a thermometer and a reflux tube, and 23.33 g of methyl ethyl ketone was added thereto and dissolved. Then, 4.9 mmol of dimethyl 2,2'-azobis(isobutyrate) (V-601) as a polymerization initiator was added and dissolved in the resulting solution. The solution was stirred while heating at 80° C. for 5 hours in a nitrogen atmosphere, and was then cooled to room temperature. The resulting polymer solution was concentrated under reduced pressure, and dropwise added to an excess amount of n-heptane to thereby precipitate a polymer. Then, the precipitated polymer was separated by filtration, followed by washing and drying, thereby obtaining 4.5 g of a fluorine-containing polymer (F1-1) as an objective compound.

With respect to the fluorine-containing polymer (F1-1), the weight-average-molecular-weight and the dispersity were determined by the polystyrene equivalent value as measured by gel permeation chromatography (GPC). As a result, it was found that the weight-average-molecular-weight was 7,100, and the dispersity was 1.43.

[Chemical Formula 101.]

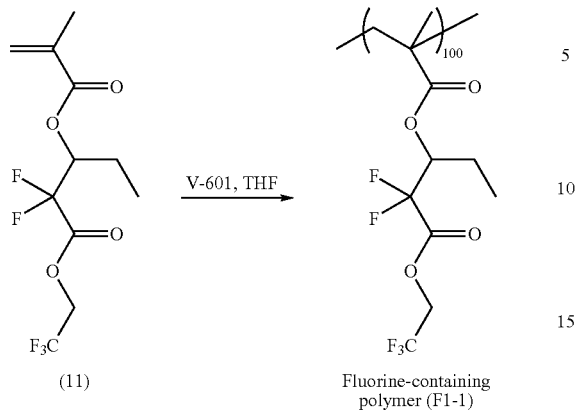

(11) → Fluorine-containing polymer (F1-1)

Polymer Synthesis Example 7

Synthesis of Fluorine-Containing Polymer (F2-2)

10.00 g (42.37 mmol) of the compound (12) and 2.84 g (12.66 mmol) of the compound (13) were added to a three-necked flask equipped with a thermometer and a reflux tube and were dissolved by adding 19.26 g of tetrahydrofuran thereto. Then, 1.6 mmol of dimethyl 2,2'-azobis(isobutyrate) (V-601) was added and dissolved in the obtained solution. The resulting solution was dropwise added to 10.70 g of methyl ethyl ketone that was heated to 79° C. under a nitrogen atmosphere over 3 hours, and was then subjected to a polymerization reaction. The resulting reaction solution was heated while stirring for 2 hours, and then cooled to room temperature. The resulting polymer solution was dropwise added to an excess amount of n-heptane to precipitate a polymer. Then, the precipitated polymer was separated by filtration, followed by washing and drying, thereby obtaining 8.2 g of a fluorine-containing copolymer (F2-2) as an objective compound.

With respect to the fluorine-containing copolymer (F2-2), the weight-average-molecular-weight and the dispersity were determined by the polystyrene equivalent value as measured by gel permeation chromatography (GPC). As a result, it was found that the weight-average-molecular-weight was 11,800, and the dispersity was 1.54. Further, as a result of an analysis by carbon 13 nuclear magnetic resonance spectroscopy (600 MHz, $^{13}$C-NMR), it was found that the composition of the copolymer (ratio (molar ratio) of the respective structural units within the structural formula) was $f_{12}/f_2=80/20$.

[Chemical Formula 102.]

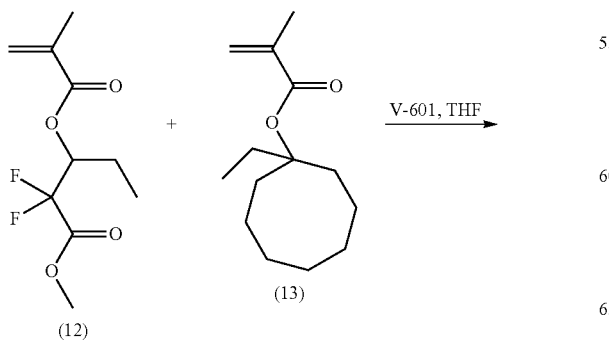

(12) + (13)

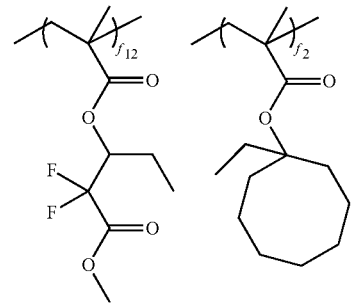

Fluorine-containing copolymer (F2-2)

Polymer Synthesis Examples 8 to 12

Synthesis of Fluorine-Containing Copolymers

Other fluorine-containing copolymers (F2-1), (F2-3) to (F2-6) and (F3-2) were synthesized in substantially the same manner as in Polymer Synthesis Example 7, except that monomers for deriving the structural units of the respective fluorine-containing copolymers were used in a predetermined molar ratio.

The structural formulas of the obtained fluorine-containing copolymers, the weight-average-molecular-weight (Mw) and the molecular weight dispersity (Mw/Mn) determined by the polystyrene equivalent value as measured by gel permeation chromatography (GPC) and the compositional ratios of the copolymers as measured by carbon 13 nuclear magnetic resonance spectroscopy (600 MHz, $^{13}$C-NMR) are shown below.

[Chemical Formula 103.]

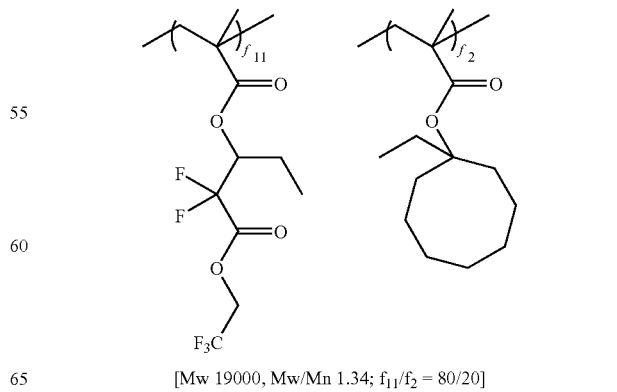

Fluorine-containing copolymer (F2-1)

[Mw 19000, Mw/Mn 1.34; $f_{11}/f_2$ = 80/20]

-continued

[Chemical Formula 104.]

Fluorine-containing copolymer (F2-3)

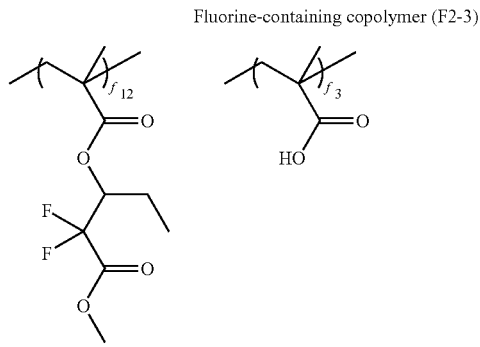

[Mw 16200, Mw/Mn 1.68; $f_{12}/f_3 = 90/10$]

[Chemical Formula 105.]

Fluorine-containing copolymers (F2-4) and (F2-5)

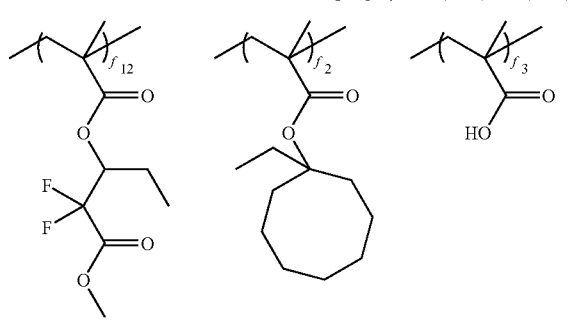

Fluorine-Containing Copolymer (F2-4):
[Mw 16500, Mw/Mn 1.66; $f_{12}/f_2/f_3 = 80/10/10$]
Fluorine-Containing Copolymer (F2-5):
[Mw 9800, Mw/Mn 1.64; $f_{12}/f_2/f_3 = 70/20/10$]

[Chemical Formula 106.]

Fluorine-containing copolymers (F2-6)

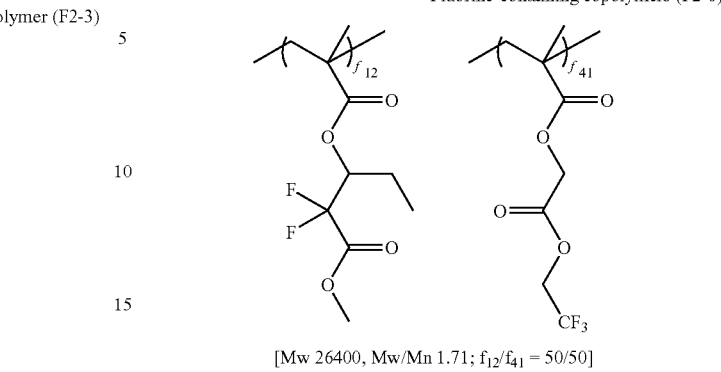

[Mw 26400, Mw/Mn 1.71; $f_{12}/f_{41} = 50/50$]

[Chemical Formula 107.]

Fluorine-containing copolymers (F3-2)

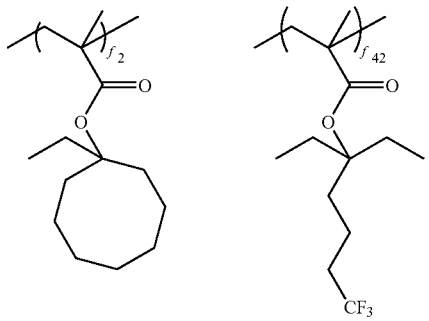

[Mw 9100, Mw/Mn 1.55; $f_2/f_{42} = 20/80$]

<Production of Positive Resist Composition>

Examples 1 to 13, Comparative Examples 1 to 5

The components shown in Table 1 were mixed together and dissolved to obtain positive resist compositions.

TABLE 1

| | Component (A) | | Component (B) | | Component (F) | Component (D) | Component (E) | Component (S) | |
|---|---|---|---|---|---|---|---|---|---|
| Ex. 1 | (A)-4 [100] | | (B)-1 [8.0] | | (F)-1 [3.0] | (D)-1 [1.2] | (E)-1 [1.32] | (S)-1 [10] | (S)-2 [2700] |
| Ex. 2 | (A)-4 [100] | | (B)-1 [8.0] | | (F)-2 [1.43] | (D)-1 [1.2] | (E)-1 [1.32] | (S)-1 [10] | (S)-2 [2700] |
| Ex. 3 | (A)-4 [100] | | (B)-1 [8.0] | | (F)-2 [3.0] | (D)-1 [1.2] | (E)-1 [1.32] | (S)-1 [10] | (S)-2 [2700] |
| Ex. 4 | (A)-2 [85] | (A)-3 [15] | (B)-2 [9.1] | (B)-4 [4.48] | (F)-2 [3.0] | — | (E)-1 [0.8] | (S)-1 [10] | (S)-3 [2700] |
| Ex. 5 | (A)-2 [85] | (A)-3 [15] | (B)-2 [9.1] | (B)-4 [4.48] | (F)-2 [2.0] | — | (E)-1 [0.8] | (S)-1 [10] | (S)-3 [2700] |
| Ex. 6 | (A)-1 [100] | | (B)-2 [9.1] | (B)-4 [4.48] | (F)-2 [3.0] | — | (E)-1 [0.8] | (S)-1 [10] | (S)-3 [2700] |
| Ex. 7 | (A)-2 [85] | (A)-3 [15] | (B)-3 [6.7] | (B)-4 [2.60] | (F)-3 [3.0] | (D)-1 [0.6] | (E)-1 [0.8] | (S)-1 [10] | (S)-2 [2700] |
| Ex. 8 | (A)-2 [85] | (A)-3 [15] | (B)-3 [6.7] | (B)-4 [2.60] | (F)-4 [3.0] | (D)-1 [0.6] | (E)-1 [0.8] | (S)-1 [10] | (S)-2 [2700] |
| Ex. 9 | (A)-2 [85] | (A)-3 [15] | (B)-3 [6.7] | (B)-4 [2.60] | (F)-5 [3.0] | (D)-1 [0.6] | (E)-1 [0.8] | (S)-1 [10] | (S)-2 [2700] |
| Ex. 10 | (A)-2 [85] | (A)-3 [15] | (B)-3 [6.7] | (B)-4 [2.60] | (F)-6 [3.0] | (D)-1 [0.6] | (E)-1 [0.8] | (S)-1 [10] | (S)-2 [2700] |
| Ex. 11 | (A)-2 [85] | (A)-3 [15] | (B)-3 [6.7] | (B)-4 [2.60] | (F)-7 [3.0] | (D)-1 [0.6] | (E)-1 [0.8] | (S)-1 [10] | (S)-2 [2700] |
| Ex. 12 | (A)-2 [85] | (A)-3 [15] | (B)-3 [6.7] | (B)-4 [2.60] | (F)-3 [3.0] | (D)-2 [0.35] | (E)-1 [0.8] | (S)-1 [10] | (S)-2 [2700] |

TABLE 1-continued

| | Component (A) | | Component (B) | | Component (F) | Component (D) | Component (E) | Component (S) | |
|---|---|---|---|---|---|---|---|---|---|
| Ex. 13 | (A)-2 [85] | (A)-3 [15] | (B)-3 [6.7] | (B)-4 [2.60] | (F)-3 [3.0] | (D)-3 [0.65] | (E)-1 [0.8] | (S)-1 [10] | (S)-2 [2700] |
| Comp. Ex. 1 | (A)-2 [85] | (A)-3 [15] | (B)-3 [6.7] | (B)-4 [2.60] | (F)-8 [1.0] | (D)-1 [0.6] | (E)-1 [0.8] | (S)-1 [10] | (S)-2 [2700] |
| Comp. Ex. 2 | (A)-2 [85] | (A)-3 [15] | (B)-3 [6.7] | (B)-4 [2.60] | (F)-8 [3.0] | (D)-1 [0.6] | (E)-1 [0.8] | (S)-1 [10] | (S)-2 [2700] |
| Comp. Ex. 3 | (A)-2 [85] | (A)-3 [15] | (B)-3 [6.7] | (B)-4 [2.60] | (F)-9 [3.0] | (D)-1 [0.6] | (E)-1 [0.8] | (S)-1 [10] | (S)-2 [2700] |
| Comp. Ex. 4 | (A)-4 [100] | | (B)-1 [8.0] | | (F)-8 [3.0] | (D)-1 [1.2] | (E)-1 [1.32] | (S)-1 [10] | (S)-2 [2700] |
| Comp. Ex. 5 | (A)-2 [85] | (A)-3 [15] | (B)-3 [6.7] | (B)-4 [2.60] | (F)-3 [21.0] | (D)-1 [0.6] | (E)-1 [0.8] | (S)-1 [10] | (S)-2 [2700] |

In Table 1, the reference characters indicate the following. Further, the values in brackets [ ] indicate the amount (in terms of parts by weight) of the component added.

(A)-1: the aforementioned polymeric compound (1)
(A)-2: the aforementioned polymeric compound (2)
(A)-3: the aforementioned polymeric compound (3)
(A)-4: the aforementioned polymeric compound (4)
(B)-1: (4-methylphenyl)diphenylsulfonium nonafluoro-n-butanesulfonate
(B)-2: the aforementioned acid generator (B12)
(B)-3: the aforementioned acid generator (B13)
(B)-4: an acid generator (B14) represented by the chemical formula shown below

[Chemical Formula 108.]

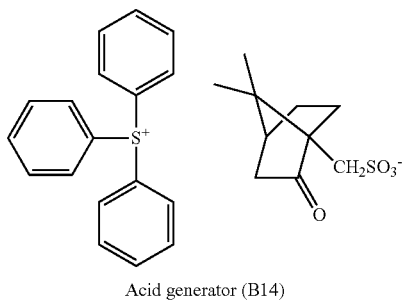

Acid generator (B14)

(F)-1: the aforementioned fluorine-containing polymer (F1-1)
(F)-2: the aforementioned fluorine-containing copolymer (F2-1)
(F)-3: the aforementioned fluorine-containing copolymer (F2-2)
(F)-4: the aforementioned fluorine-containing copolymer (F2-3)
(F)-5: the aforementioned fluorine-containing copolymer (F2-4)
(F)-6: the aforementioned fluorine-containing copolymer (F2-5)
(F)-7: the aforementioned fluorine-containing copolymer (F2-6)
(F)-8: the aforementioned fluorine-containing polymer (F3-1)
(F)-9: the aforementioned fluorine-containing copolymer (F3-2)
(D)-1: tri-n-pentylamine
(D)-2: aniline
(D)-3: N,N-n-butyl-aniline
(E)-1: salicylic acid
(S)-1: γ-butyrolactone
(S)-2: a mixed solvent of PGMEA/PGME=6/4 (weight ratio)
(S)-3: a mixed solvent of PGMEA/CH=9/1 (weight ratio)

PGMEA represents propyleneglycol monomethyletheracetate, PGME represents propyleneglycol monomethylether, and CH represents cyclohexanone.

<Evaluation of Hydrophobicity of Resist Film>

Using the obtained positive resist compositions, the static contact angles of the resist film surface prior to and after development were measured as follows, to thereby evaluate the hydrophobicity of the resist film.

(Measurement of Static Contact Angle on Resist Film Surface Prior to Development)

Each of the positive resist compositions shown in Table 1 was applied to an 8-inch silicon wafer using a spinner, and was then prebaked (PAB) on a hotplate at 110° C. for 60 seconds and dried, thereby forming a resist film having a film thickness of 100 nm.

Subsequently, 50 μl of water was dropped onto the surface of the resist film (prior to development), and the static contact angle was measured using DROP MASTER-700 (manufactured by Kyowa Interface Science Co. Ltd.). The results are shown in Table 2.

(Measurement of Static Contact Angle on Resist Film Surface after Development)

A resist film having a thickness of 100 nm was formed in the same manner as described above. Then, the resist film was subjected to an alkali developing treatment for 30 seconds at 23° C. in a 2.38% by weight aqueous solution of tetramethylammonium hydroxide (TMAH), and the static contact angle of the resist film surface after the alkali developing treatment was measured in the same manner as described above. The results are shown in Table 2.

In Table 2, "–" indicates that the measurement was not conducted.

<Evaluation of the Effect of Suppressing Generation of Defects>

Using the obtained positive resist compositions, the number of defects were determined with respect to the resist film after the alkali development in the following manner, to thereby evaluate the effect of suppressing generation of defects.

An organic anti-reflection film composition (product name: ARC29, manufactured by Brewer Science Ltd.) was applied to a 12-inch silicon wafer using a spinner, and the composition was then baked at 205° C. for 60 seconds, thereby forming an organic anti-reflection film having a film thickness of 89 nm.

Then, each of the resist compositions shown in Table 1 was applied to the organic anti-reflection film using a spinner, and was then prebaked (PAB) on a hotplate at 110° C. for 60 seconds and dried, thereby forming a resist film having a film thickness of 100 nm.

Subsequently, the resist film was selectively irradiated with an ArF excimer laser (193 nm) through a mask pattern, using an ArF immersion exposure apparatus NSR-S609B (manufactured by Nikon Corporation, NA (numerical aperture) =1.07, Di-x (0.78/0.97)).

Thereafter, a post-exposure bake (PEB) treatment was conducted at 100° C. for 60 seconds, followed by alkali development for 10 seconds at 23° C. in a 2.38% by weight aqueous solution of tetramethylammonium hydroxide (TMAH). Then, the resist was washed for 30 seconds with pure water, followed by drying by shaking.

As a result, in each of the examples and comparative examples except Comparative Example 5, a line and space pattern (LS pattern) having a line width of 51 nm and a pitch of 102 nm was formed. The resist composition of Comparative Example 5 could not be resolved, and a pattern could not be formed.

With respect to the unexposed portion of the obtained LS pattern, the number of development defects per one silicon wafer (defect number) was determined using a surface defect observation apparatus (product name: KLA; manufactured by KLA-TENCOR CORPORATION).

As a result, it was found that the defect number in Comparative Examples 2 to 4 exceeded the measurement limit (overload). Therefore, in Table 2, the defect number is indicated in terms of the percentage (defect number (%)) based on the measurement limit.

TABLE 2

| | Static contact angle (°) | | |
|---|---|---|---|
| | Prior to development | After development | Number of defects (%) |
| Ex. 1 | 91.5 | 55.1 | 0.42 |
| Ex. 2 | 88.8 | 58.3 | 0.48 |
| Ex. 3 | 93.1 | 59.1 | 0.32 |
| Ex. 4 | 91.3 | 56.2 | 0.040 |
| Ex. 5 | 87.9 | 58.9 | 0.91 |
| Ex. 6 | 92.8 | 56.2 | 0.040 |
| Ex. 7 | 83.8 | 62.5 | 9.75 |
| Ex. 8 | 81.1 | 53.6 | 0.54 |
| Ex. 9 | 82.0 | 56.3 | 1.90 |
| Ex. 10 | 81.8 | 61.4 | 15.14 |
| Ex. 11 | 85.3 | 57.5 | 6.95 |
| Ex. 12 | 83.6 | 62.2 | 8.97 |
| Ex. 13 | 84.1 | 61.6 | 9.85 |
| Comp. Ex. 1 | 87.3 | 86.2 | 17.90 |
| Comp. Ex. 2 | 89.8 | 87.6 | 100.00 |
| Comp. Ex. 3 | 87.2 | 87.0 | 100.00 |
| Comp. Ex. 4 | 87.8 | 86.6 | 100.00 |
| Comp. Ex. 5 | 89.5 | — | — |

From the results shown in Table 2, it was confirmed that with respect to the resist films formed using the positive resist composition according to the present invention, the static contact angle after 30 seconds' development was at least 20° smaller than the static contact angle prior to development.

Further, it was confirmed that the resist films formed using the positive resist compositions of Examples 1 to 13 had a small number of defects at unexposed portions as compared to the resist films formed using the positive resist compositions of Comparative Examples 1 to 4.

From these results, it can be concluded that by using the positive resist composition of Examples 1 to 13, the hydrophilicity of the resist film can be enhanced by an alkali development treatment, thereby exhibiting an excellent effect of suppressing the generation of defects.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A positive resist composition comprising a base component (A) comprising a polymeric compound (A1) comprising a structural unit (a1) derived from an acrylate ester containing an acid dissociable, dissolution inhibiting group, an acid-generator component (B) which generates acid upon exposure, and a fluorine-containing polymer component (F), the fluorine-containing polymer component (F) comprising:

a fluorine-containing copolymer (F2) comprising a structural unit (F-1) represented by general formula (F-1) and a structural unit (F-2) derived from an acrylate ester containing an acid dissociable, dissolution inhibiting group, wherein the amount of the fluorine-containing polymer component (F) relative to 100 parts by weight of the base component (A) is in the range of 0.1 to 20 parts by weight, wherein the amount of the structural unit (F-1) based on the combined total of all structural units constituting the component (F2) is 20 mol % or more, and the polymeric compound (A1) excludes the fluorine-containing polymer component (F):

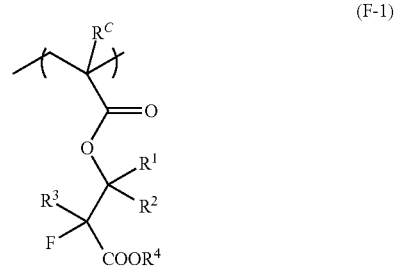

(F-1)

wherein $R^c$ represents a hydrogen atom or a methyl group; each of R1 and $R^2$ independently represents a hydrogen atom, an alkyl group of 1 to 4 carbon atoms or a fluorinated alkyl group of 1 to 4 carbon atoms; $R^3$ represents a fluorine atom or a fluorinated alkyl group of 1 to 4 carbon atoms; and R4 represents a linear alkyl group of 1 to 4 carbon atoms or a linear fluorinated alkyl group of 1 to 4 carbon atoms.

2. The positive resist composition according to claim 1, wherein the structural unit (F-2) is at least one structural unit selected from the group consisting of a structural unit represented by general formula (F-2-1) shown below and a structural unit represented by general formula (F-2-2) shown below:

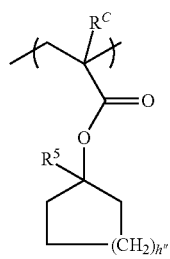

(F-2-1)

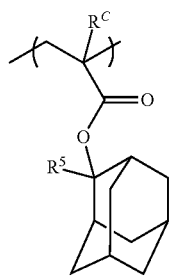

(F-2-2)

wherein each $R^c$ independently represents a hydrogen atom or a methyl group; each $R^5$ independently represents an alkyl group of 1 to 5 carbon atoms; and h" represents an integer of 1 to 4.

3. The positive resist composition according to claim 1, wherein the polymeric compound (A1) further comprises a structural unit (a2) derived from an acrylate ester containing a lactone-containing cyclic group.

4. The positive resist composition according to claim 1, wherein the polymeric compound (A1) further comprises a structural unit (a3) derived from an acrylate ester containing a polar group-containing aliphatic hydrocarbon group.

5. The positive resist composition according to claim 1, which further comprises a nitrogen-containing organic compound (D).

6. A method of forming a resist pattern, comprising: forming a resist film using the positive resist composition of claim 1; conducting exposure of the resist film; and alkali-developing the resist film to form a resist pattern.

7. The positive resist composition according to claim 1, wherein the fluorine-containing copolymer (F2) further comprises a structural unit (F-3) represented by general formula (F-3) shown below:

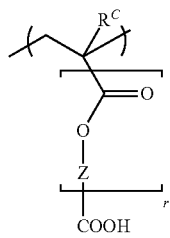

(F-3)

wherein $R^c$ represents a hydrogen atom or a methyl group; Z represents a single bond or a divalent linking group which may have a substituent; and r represents an integer of 0 to 2.

8. The positive resist composition according to claim 7, wherein the structural unit (F-3) is at least one structural unit selected from the group consisting of a structural unit represented by general formula (F-3-1) shown below, a structural unit represented by general formula (F-3-2) shown below and a structural unit represented by general formula (F-3-3) shown below:

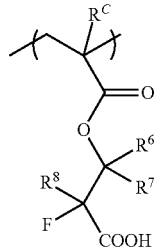

(F-3-1)

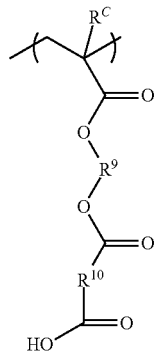

(F-3-2)

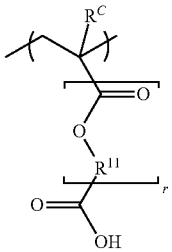

(F-3-3)

wherein each $R^c$ independently represents a hydrogen atom or a methyl group; each of $R^6$ and $R^7$ independently represents a hydrogen atom, an alkyl group of 1 to 4 carbon atoms or a fluorinated alkyl group of 1 to 4 carbon atoms; $R^8$ represents a fluorine atom or a fluorinated alkyl group of 1 to 4 carbon atoms; each of $R^9$ to $R^{11}$ independently represents an alkylene group of 1 to 12 carbon atoms; and r represents an integer of 0 to 2.

* * * * *